(12) United States Patent
Sung et al.

(10) Patent No.: US 11,741,739 B2
(45) Date of Patent: Aug. 29, 2023

(54) FINGERPRINT SENSOR AND DISPLAY DEVICE INCLUDING THE SAME

(71) Applicant: Samsung Display Co., Ltd., Yongin-si (KR)

(72) Inventors: Eun Jin Sung, Yongin-si (KR); Ji Hun Ryu, Yongin-si (KR); Yun Ho Kim, Yongin-si (KR); Il Nam Kim, Yongin-si (KR); Won Sang Park, Yongin-si (KR); Jong In Baek, Yongin-si (KR); Katsumasa Yoshii, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 572 days.

(21) Appl. No.: 16/589,416

(22) Filed: Oct. 1, 2019

(65) Prior Publication Data
US 2020/0104562 A1 Apr. 2, 2020

(30) Foreign Application Priority Data
Oct. 2, 2018 (KR) .................. 10-2018-0117795

(51) Int. Cl.
*G06V 40/13* (2022.01)
*H01L 31/12* (2006.01)
(Continued)

(52) U.S. Cl.
CPC ....... *G06V 40/1318* (2022.01); *G09G 3/3233* (2013.01); *H01L 27/14605* (2013.01);
(Continued)

(58) Field of Classification Search
None
See application file for complete search history.

(56) References Cited

U.S. PATENT DOCUMENTS 9,501,686 B2  11/2016  Lin
9,996,198 B2  6/2018  Zhang
(Continued)

FOREIGN PATENT DOCUMENTS

CN          106298859          1/2017
KR      10-2018-0001904        1/2018
(Continued)

OTHER PUBLICATIONS

Extended European Search Report dated Feb. 28, 2020, in European Patent Application No. 19200586.6.
(Continued)

*Primary Examiner* — Benjamin X Casarez
(74) *Attorney, Agent, or Firm* — H.C. Park & Associates, PLC

(57) ABSTRACT

A display device may include: a first substrate including pixel areas; a circuit element layer disposed on a first surface of the first substrate, and including at least one conductive layer; a light emitting element layer disposed on the circuit element layer; pixels each including a circuit element and a light emitting element disposed on the circuit element layer and the light emitting element layer in a corresponding one of the pixel areas; a first light transmitting hole array layer including first light transmitting holes distributed in the circuit element layer; and a photo sensor array layer disposed on a second surface of the first substrate and configured to overlap with the first light transmitting hole array layer, the photo sensor array layer comprising photo sensors. The first light transmitting holes may include openings distributed in the at least one conductive layer.

29 Claims, 27 Drawing Sheets

(51) Int. Cl.
*H01L 27/146* (2006.01)
*G09G 3/3233* (2016.01)
*H10K 59/40* (2023.01)
*H10K 59/60* (2023.01)
*H10K 59/65* (2023.01)
*H10K 59/121* (2023.01)

(52) U.S. Cl.
CPC ......... *H01L 31/12* (2013.01); *H10K 59/1216* (2023.02); *H10K 59/40* (2023.02); *H10K 59/60* (2023.02); *H10K 59/65* (2023.02); *G09G 2300/0426* (2013.01); *G09G 2300/0842* (2013.01); *G09G 2354/00* (2013.01)

(56) References Cited

U.S. PATENT DOCUMENTS

| | | | |
|---|---|---|---|
| 10,360,431 B2 | 7/2019 | Gozzini et al. | |
| 10,503,947 B2 | 12/2019 | Liu et al. | |
| 10,546,902 B2 | 1/2020 | Lee et al. | |
| 10,607,057 B2 | 3/2020 | Kwon et al. | |
| 10,627,550 B2 * | 4/2020 | Liu | G02B 5/003 |
| 2016/0132712 A1 * | 5/2016 | Yang | G06V 40/70 |
| | | | 348/77 |
| 2017/0220844 A1 | 8/2017 | Jones et al. | |
| 2017/0249494 A1 | 8/2017 | Zhang et al. | |
| 2017/0351898 A1 | 12/2017 | Zhang | |
| 2018/0046837 A1 | 2/2018 | Gozzini et al. | |
| 2018/0075278 A1 | 3/2018 | Zhang | |
| 2018/0129852 A1 * | 5/2018 | Zeng | H01L 27/3234 |
| 2018/0175125 A1 * | 6/2018 | Chung | G06V 40/12 |
| 2018/0190752 A1 | 7/2018 | An et al. | |
| 2018/0365471 A1 * | 12/2018 | Xin | H01L 51/5206 |
| 2018/0373945 A1 * | 12/2018 | Wu | G06V 40/70 |
| 2019/0050621 A1 * | 2/2019 | Xu | G06V 40/1318 |
| 2019/0156097 A1 * | 5/2019 | Liu | G06V 40/13 |
| 2019/0220649 A1 * | 7/2019 | Zhu | G06V 40/1318 |
| 2019/0228204 A1 | 7/2019 | Park et al. | |
| 2019/0325190 A1 * | 10/2019 | Cui | H01L 27/3269 |
| 2019/0354789 A1 * | 11/2019 | Gu | G06V 10/145 |
| 2020/0127066 A1 * | 4/2020 | Zhang | G09F 9/00 |
| 2021/0142027 A1 * | 5/2021 | Wang | H01L 51/5284 |

FOREIGN PATENT DOCUMENTS

| | | |
|---|---|---|
| KR | 10-2018-0051692 | 5/2018 |
| KR | 10-2018-0083700 | 7/2018 |
| WO | 2016/154378 | 9/2016 |

OTHER PUBLICATIONS

Office Action dated Jun. 13, 2023, in Korean Patent Application No. 10-2018-0117795 (with English translation).

* cited by examiner

FINGERPRINT SENSOR AND DISPLAY DEVICE INCLUDING THE SAME

CROSS-REFERENCE TO RELATED APPLICATION

This application claims priority from and the benefit of Korean Patent Application No. 10-2018-0117795, filed on Oct. 2, 2018, which is hereby incorporated by reference for all purposes as if fully set forth herein.

BACKGROUND

Field

Exemplary implementations of the invention relate generally to a fingerprint sensor and a display device including the fingerprint sensor.

Discussion of the Background

Recently, as display devices such as a smartphone and a tablet PC are used in various ways, biometric information authentication methods using the fingerprint or the like of a user have been widely used. Hence, various sensors including a fingerprint sensor have been required to be installed in the display devices.

For example, the fingerprint sensor may be configured as a photo-sensing type sensor. The photo-sensing type fingerprint sensor may include a light source, an optical system including a lens, and a photo sensor array. When the fingerprint sensor is implemented in a display device, the thickness of the display device may be increased, and the production cost of the display device may be increased.

The above information disclosed in this Background section is only for understanding of the background of the inventive concepts, and, therefore, it may contain information that does not constitute prior art.

SUMMARY

Devices constructed according to exemplary implementations of the invention are directed to a photo-sensing type fingerprint sensor and a display device including the same, which may reduce the thickness of a module and provide improved reliability.

Additional features of the inventive concepts will be set forth in the description which follows, and in part will be apparent from the description, or may be learned by practice of the inventive concepts.

According to one or more embodiments of the invention, a display device includes: a first substrate including a plurality of pixel areas; a circuit element layer disposed on a first surface of the first substrate, the circuit element layer including at least one conductive layer; a light emitting element layer disposed on the circuit element layer; a plurality of pixels each including a circuit element and a light emitting element disposed on the circuit element layer and the light emitting element layer in a corresponding one of the pixel areas; a first light transmitting hole array layer including a plurality of first light transmitting holes distributed in the circuit element layer; and a photo sensor array layer disposed on a second surface of the first substrate overlapping with the first light transmitting hole array layer, the photo sensor array layer comprising a plurality of photo sensors, wherein the plurality of first light transmitting holes may include openings distributed in the at least one conductive layer.

The plurality of first light transmitting holes may be disposed in at least one of the plurality of pixels.

The pixels may include: first pixels each including at least one first light transmitting hole; and second pixels disposed in vicinities of the first pixels, each of the second pixels including a region having a structure different from a corresponding region of each of the first pixels in which the first light transmitting hole is formed.

Each of the plurality of first light transmitting holes may include: a first opening formed in a first conductive layer disposed on the first substrate; a second opening formed in a second conductive layer disposed on the first conductive layer, the second opening overlapping with the first opening; and at least one insulating layer interposed between the first conductive layer and the second conductive layer.

At least one of the first conductive layer and the second conductive layer may include a light blocking metal pattern.

Each of the pixels may include at least one capacitor. The capacitor of at least one of the pixels may include: a first capacitor electrode disposed in the first conductive layer enclosing the first opening of one of the plurality of first light transmitting holes; and a second capacitor electrode disposed in the second conductive layer overlapping with the first capacitor electrode and enclosing the second opening of the one first light transmitting hole.

The first opening and the second opening may have an identical width along one direction.

The second opening may have a width greater than a width of the first opening along one direction.

Each of the pixels may include at least one transistor. The at least one transistor may include: an active pattern disposed in a semiconductor layer on the first substrate; a gate electrode disposed in a first conductive layer disposed on the semiconductor layer with at least one insulating layer interposed between the first conductive layer and the semiconductor layer, the gate electrode overlapping with the active pattern; and a source electrode and a drain electrode coupled to respective opposite ends of the active pattern.

The display device may further include at least one of: a second conductive layer disposed on the first conductive layer with at least one insulating layer interposed therebetween, and the second conductive layer including at least one capacitor electrode; and a third conductive layer disposed on the second conductive layer with at least one insulating layer interposed therebetween, the third conductive layer including at least one line.

Each of the first light transmitting holes may include multilayer openings formed in at least two layers of the semiconductor layer, the first conductive layer, the second conductive layer, and the third conductive layer the multilayer openings overlapping with each other.

The light emitting element may include: a first electrode and a second electrode disposed in each of the pixel areas of the light emitting element layer, the first electrode and the second electrode overlapping with each other; and an emission layer disposed between the first electrode and the second electrode.

At least one of the first light transmitting holes may be formed in one of the pixels and disposed in a non-emission area of the one pixel, the at least one first light transmitting hole not overlapping with the first electrode of the light emitting element of the any one pixel.

The display device may further include a second light transmitting hole array layer disposed between the first substrate and the circuit element layer, overlapping with the first light transmitting hole array layer, the second light transmitting hole array layer including a plurality of second light transmitting holes overlapping with the first light transmitting holes.

The first light transmitting holes and the second light transmitting holes may have different widths.

The display device may further include: a second substrate disposed between the first substrate and the photo sensor array layer; and a third light transmitting hole array layer disposed between the first substrate and the second substrate and configured to overlap with the first light transmitting hole array layer, the third light transmitting hole array layer including a plurality of third light transmitting holes overlapping with the first light transmitting holes.

The display device may include a sensing area including at least a portion of a display area in which the pixels are disposed, wherein the first light transmitting hole array layer and the photo sensor array layer may be disposed in the sensing area.

The first light transmitting holes may be distributed in the sensing area with a lower resolution than the pixels.

The photo sensors may be distributed in the sensing area with a higher resolution than the first light transmitting holes.

According to one or more embodiments of the invention, a fingerprint sensor includes: a first substrate; a circuit element layer disposed on a first surface of the first substrate, and including at least one conductive layer; a light emitting element layer disposed on the circuit element layer and including a plurality of light emitting elements; a first light transmitting hole array layer including a plurality of first light transmitting holes distributed in the circuit element layer; and a photo sensor array layer disposed on a second surface of the first substrate overlapping with the first light transmitting hole array layer, the photo sensor array layer comprising a plurality of photo sensors. The first light transmitting holes may include openings distributed in the at least one conductive layer.

The circuit element layer may include: a first conductive layer disposed on the first substrate; a second conductive layer disposed on the first conductive layer; and at least one insulating layer interposed between the first conductive layer and the second conductive layer.

Each of the first light transmitting holes may include: a first opening formed in the first conductive layer; and a second opening formed in the second conductive layer overlapping with the first opening.

At least one of the first conductive layer and the second conductive layer may include a light blocking metal pattern.

The circuit element layer may include at least one capacitor. The capacitor may include: a first capacitor electrode disposed in the first conductive layer enclosing the first opening of any one of the first light transmitting holes; and a second capacitor electrode disposed in the second conductive layer overlapping with the first capacitor electrode and enclose the second opening of the any one first light transmitting hole.

The circuit element layer may include at least one transistor comprising an active pattern, a gate electrode, a source electrode, and a drain electrode. Each of the first light transmitting holes may include at least one opening formed in at least one of a semiconductor layer in which the active pattern is disposed, a first conductive layer in which the gate electrode is disposed, and a second conductive layer disposed on the first conductive layer with at least one insulating layer interposed therebetween.

Each of the light emitting elements may include: a first electrode and a second electrode disposed in each of emission areas of the light emitting element layer, the first electrode and the second electrode overlapping with each other; and an emission layer disposed between the first electrode and the second electrode.

The first light transmitting holes may be distributed in non-emission areas of the light emitting element layer, the first light transmitting holes not overlapping with the first electrodes of the light emitting elements.

The fingerprint sensor may further include a second light transmitting hole array layer disposed between the first substrate and the circuit element layer, overlapping with the first light transmitting hole array layer, the second light transmitting hole array layer including a plurality of second light transmitting holes overlapping with the first light transmitting holes.

The fingerprint sensor may further include: a second substrate disposed between the first substrate and the photo sensor array layer; and a third light transmitting hole array layer disposed between the first substrate and the second substrate and configured to overlap with the first light transmitting hole array layer, the third light transmitting hole array layer including a plurality of third light transmitting holes overlapping with the first light transmitting holes.

the photo sensors may be disposed on the second surface of the first substrate with a higher resolution than the first light transmitting holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
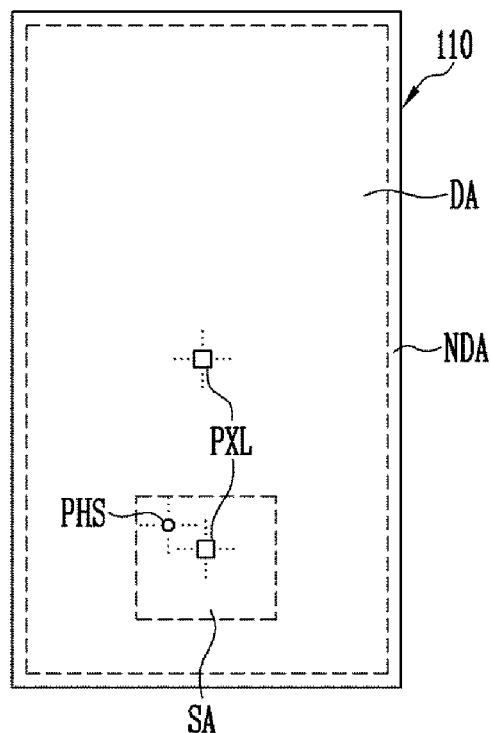
FIG. 1 and FIG. 2 each are plan views illustrating a fingerprint sensor and a display device including the fingerprint sensor in accordance with an exemplary embodiment of the present disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
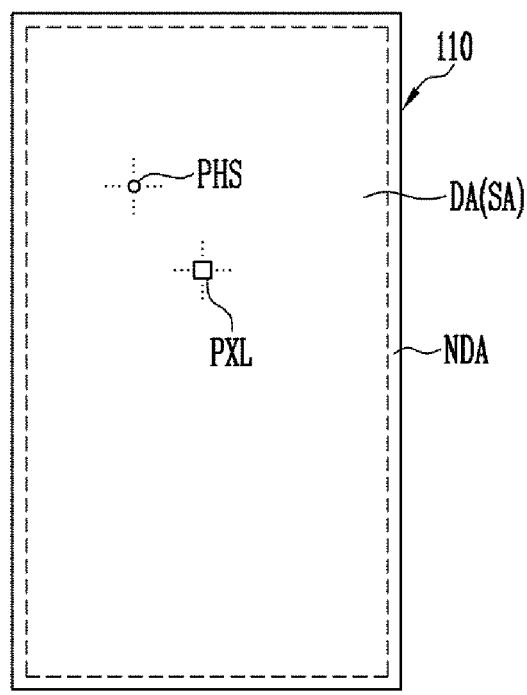

FIGS. 1 and 2 each are plan views illustrating a fingerprint sensor and a display device including the fingerprint sensor in accordance with an exemplary embodiment of the present disclosure. In more detail, FIGS. 1 and 2 each schematically illustrate a display panel 110 provided on the display device in accordance with an exemplary embodiment, and photo sensors PHS provided in the display device such that the photo sensors PHS overlap with at least a portion of the display panel 110. The photo sensors PHS may form a photo-sensing type fingerprint sensor.

Referring to FIGS. 1 and 2, the display device in accordance with an exemplary embodiment of the present disclosure may include a display panel 110 having a display area DA and a non-display area NDA. In an exemplary embodiment, a portion of the display panel 110 may be set to a sensing area SA which may sense the fingerprint or the like of a user.

A plurality of pixels PXL are disposed in the display area DA. In an exemplary embodiment, each of the pixels PXL may include at least one light emitting element. In an exemplary embodiment, the light emitting element may be a light emitting unit including an organic light-emitting diode, or inorganic light-emitting diodes each having a size of a micro- or nano-scale range, but it is not limited thereto. The display device may drive the pixels PXL in response to image data inputted thereto, thus displaying an image on the display area DA.

In an exemplary embodiment, the display area DA may include the sensing area SA. In other words, the display area DA and the sensing area SA may overlap with each other, and at least a portion of the display area DA may also be the sensing area SA.

For example, as illustrated in FIG. 1, only a portion of the display area DA may be set to the sensing area SA. For example, as illustrated in FIG. 2, the entirety of the display area DA may be set to the sensing area SA. As a further alternative, in an exemplary embodiment, the display area DA and the sensing area SA may be disposed adjacent to each other in such a way that only respective portions of the display area DA and the sensing area SA overlap with each other.

In other words, in an exemplary embodiment, at least a portion of the display area DA may be set to the sensing area SA. In this sensing area SA, a plurality of photo sensors PHS along with a plurality of pixels PXL may be disposed.

In an exemplary embodiment, the photo sensors PHS may be disposed both on an image display surface (e.g., a front surface) of opposite surfaces of the display panel 110, and on the other surface (e.g., a rear surface) facing away from the front surface. Each of the photo sensors PHS may employ, as a light source needed to sense a fingerprint or the like, a light emitting element provided in at least one pixel PXL disposed in the sensing area SA or in the vicinity of the sensing area SA. To this end, the photo sensors PHS may overlap with at least some of the pixels PXL disposed in the sensing area SA or be disposed in the vicinity of the pixels PXL.

The photo sensors PHS, along with the pixels PXL of the sensing area SA, particularly, along with the light emitting elements provided in the pixels PXL, may form a photo-sensing type fingerprint sensor. In the present disclosure, the fingerprint sensor is not limited to being specialized only for the fingerprint sensing function, and it may be used for other purposes as well as the fingerprint sensing function. For example, the fingerprint sensor may also be used as a touch sensor, a scanner, etc. In other words, the fingerprint sensor according to the present disclosure may configure various photo-sensing type sensors including the touch sensor or the scanner, rather than being limited to a sensor only for the fingerprint sensing function.

Furthermore, the display device in accordance with an exemplary embodiment of the present disclosure may further include an optical system which configures the photo-sensing type fingerprint sensor along with the photo sensors PHS. In an exemplary embodiment, at least a portion of the optical system may be integrally provided with the display panel 110. For example, the display panel 110 may be an optical-system-integrated display panel including a pinhole array layer formed on a circuit element layer.

The non-display area NDA may be an area disposed in the vicinity of the display area DA and indicate a remaining area except the display area DA. In an exemplary embodiment, the non-display area NDA may include a line area, a pad area, a driving circuit mounting area, and/or various dummy areas.

The display device in accordance with the above-mentioned embodiments may sense the shape, the pattern, etc. of an object placed on the display panel 110 using the photo sensors PHS disposed in the sensing area SA that overlaps with the display area DA. For example, the display device may sense the fingerprint of the user.

Furthermore, in an exemplary embodiment of the present disclosure, the display device may sense the fingerprint of the user using light emitted from the pixels PXL. As such, in the case where the fingerprint sensor embedded display device is configured using the pixels PXL as the light source without using a separate external light source, the thickness of a module including the photo-sensing type fingerprint sensor and the display device using the same may be reduced or minimized, and the production cost may also be reduced.

FIGS. 3A, 3B, 3C, 3D, and 3E each are plan views illustrating an arrangement structure of pixels PXL and photo sensors PHS in accordance with an exemplary embodiment of the present disclosure. In detail, FIGS. 3A, 3B, 3C, 3D, and 3E illustrate different embodiments with regard to the relative sizes, the resolutions, and/or the arrangement relationship of the pixels PXL and the photo sensors PHS that are disposed in the sensing area SA of FIGS. 1 and 2. The present disclosure is not limited to the exemplary embodiments illustrated in FIGS. 3A, 3B, 3C, 3D, and 3E, and the shapes, the configurations, the relative sizes, the numbers, the resolutions, and/or the mutual arrangement relationship of the pixels PXL and/or the photo sensors PHS that are disposed in the sensing area SA may be changed in various ways.

Figure 3A:
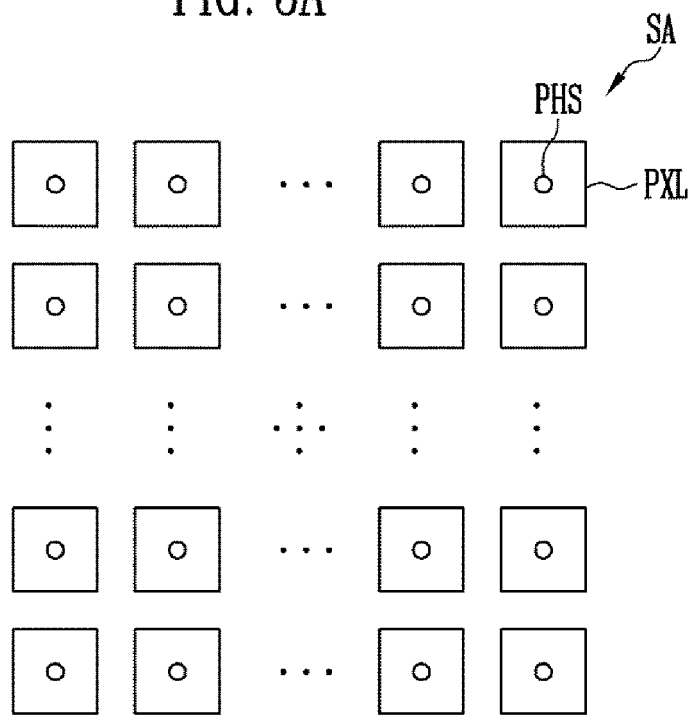
FIGS. 3A, 3B, 3C, 3D, and 3E each are plan views illustrating an arrangement structure of pixels and photo sensors in accordance with an exemplary embodiment of the present disclosure.

Referring to FIG. 3A, the photo sensors PHS may be disposed in at least the sensing area SA at the same resolution (or the same density) as that of the pixels PXL. For example, the same number of photo sensors PHS as that of the pixels PXL may be provided in the sensing area SA so that the photo sensors PHS are paired one-to-one with the pixels PXL. In an exemplary embodiment, the pixels PXL and the photo sensors PHS may be provided at a 1:1 ratio and alternately arranged such that they do not overlap with each other.

In an exemplary embodiment, at least a portion of each of the photo sensors PHS may overlap with at least one pixel PXL. For example, each photo sensor PHS may have a size smaller than that of each pixel PXL and disposed in one pixel area in which any one pixel PXL is formed. However, the present disclosure is not limited to this. For instance, in an exemplary embodiment, the pixels PXL and the photo sensors PHS may be alternately arranged without overlapping with each other, regardless of the relative sizes and/or the numbers of the pixels PXL and the photo sensors PHS.

Figure 3B:
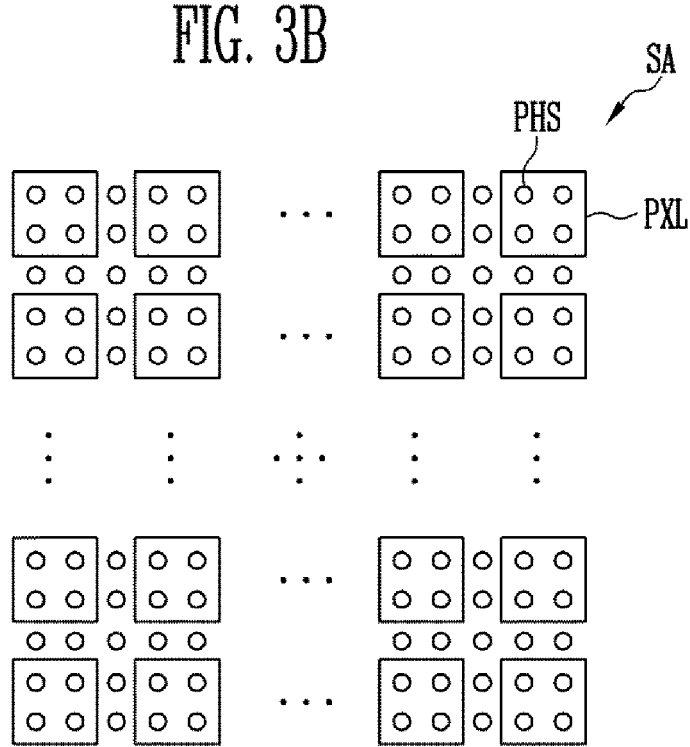

Referring to FIG. 3B, the number of photo sensors PHS included in the sensing area SA may be greater than the number of pixels PXL included in the sensing area SA. For example, each photo sensor PHS may have a size smaller than that of each pixel PXL. The photo sensors PHS may be densely distributed in the sensing area SA at a resolution higher than are the pixels PXL. In an exemplary embodiment, at least some of the photo sensors PHS may be disposed to overlap with the pixels PXL.

Figure 3C:
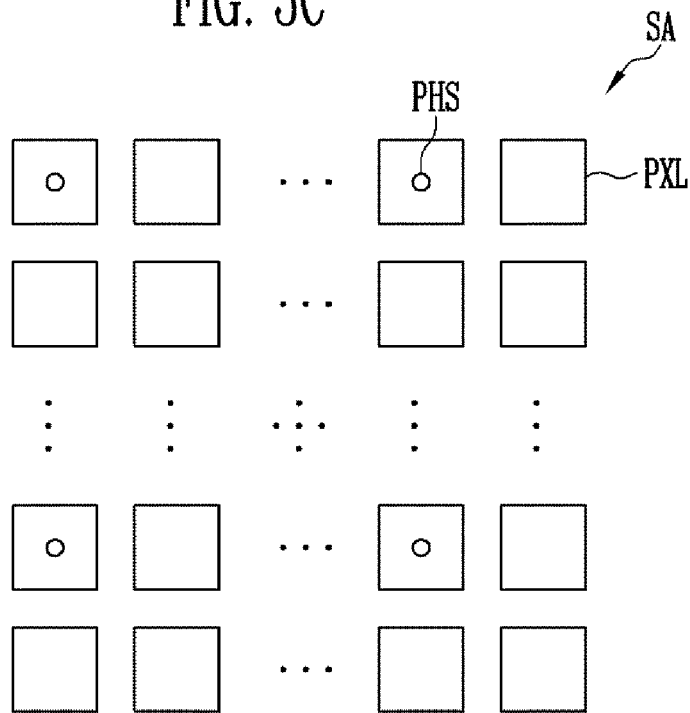
Figure 3D:
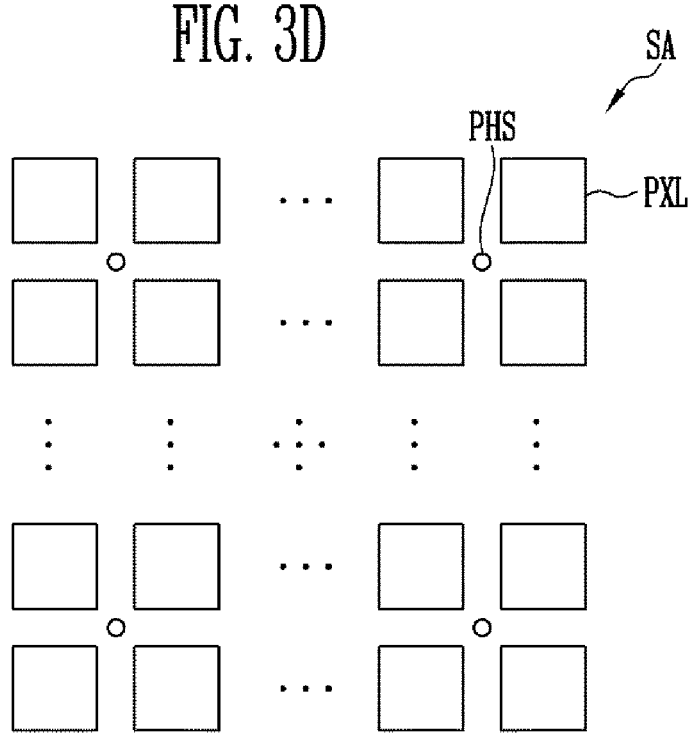

Referring to FIGS. 3C and 3D, the number of photo sensors PHS included in the sensing area SA may be less than the number of pixels PXL included in the sensing area SA. For example, each photo sensor PHS may have a size smaller than that of each pixel PXL. The photo sensors PHS may be distributed in the sensing area SA at a resolution lower than are the pixels PXL.

For instance, as illustrated in FIG. 3C, the photo sensors PHS may be disposed to overlap with only some of the pixels PXL in the sensing area SA. For example, as illustrated in FIG. 3D, the photo sensors PHS may be disposed in space between the pixels PXL such that the photo sensors PHS do not overlap with the pixels PXL in the sensing area SA. Although FIGS. 3C and 3D illustrate embodiments in which one photo sensor PHS is provided per four pixels PXL in the sensing area SA, the present disclosure is not limited thereto. In other words, the relative sizes, the numbers, the pitches, and/or the resolutions of the photo sensors PHS and the pixels PXL that are disposed in the sensing area SA may be changed in various ways.

Figure 3E:
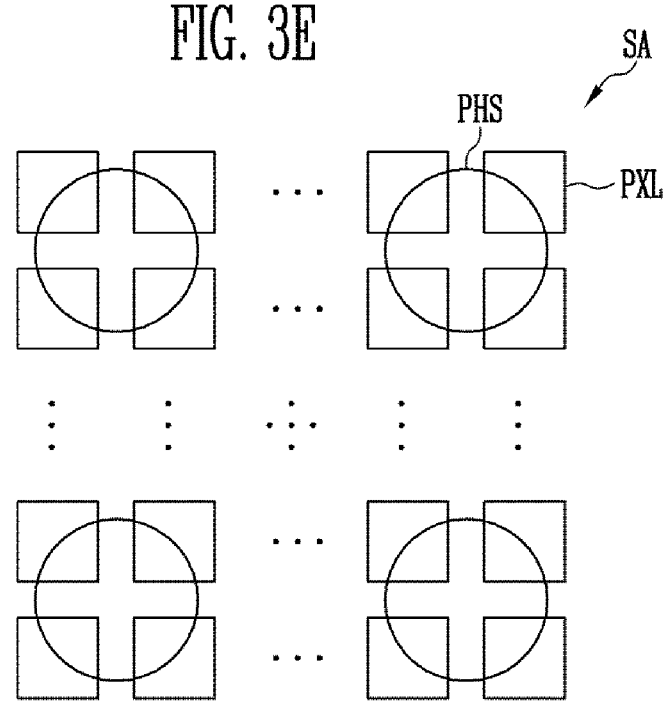

Referring to FIG. 3E, the size of each photo sensor PHS and/or the pitch at which the photo sensors PHS are arranged in the sensing area SA may be within a range allowing each photo sensor PHS to overlap with a plurality of pixels PXL disposed in the sensing area SA. In an exemplary embodiment, each photo sensor PHS may be disposed between a plurality of pixels PXL neighboring each other such that the photo sensor PHS partially overlap with the pixels PXL.

For example, in an exemplary embodiment, each photo sensor PHS may have a size capable of covering at least one pixel PXL and be disposed to overlap with the at least one pixel PXL. As a further alternative, in an exemplary embodiment, the size of each photo sensor PHS and/or the pitch at which the photo sensors PHS are arranged in the sensing area SA may not be related to mutual arrangement relationship between the photo sensors PHS and the pixels PXL or whether the photo sensors PHS overlap with the pixels PXL.

As described above, the size, the number, the resolution, and the locations of the photo sensors PHS disposed in the sensing area SA, and/or the arrangement structure of the photo sensors PHS with the pixels PXL may be changed in various ways. For example, the size, the number, the resolution, and the locations of the photo sensors PHS disposed in the sensing area SA, and/or the arrangement structure of the photo sensors PHS with the pixels PXL may be determined, taking into account various factors such as the minimum light receiving amount needed for fingerprint sensing, a resolution, and/or cross-talk.

In addition, although FIGS. 3A, 3B, 3C, 3D, and 3E illustrate embodiments in which the photo sensors PHS are arranged in a regular array form in the sensing area SA, the present disclosure is not limited thereto. For example, in an exemplary embodiment, the photo sensors PHS may be irregularly distributed in the sensing area SA.

Figure 4:
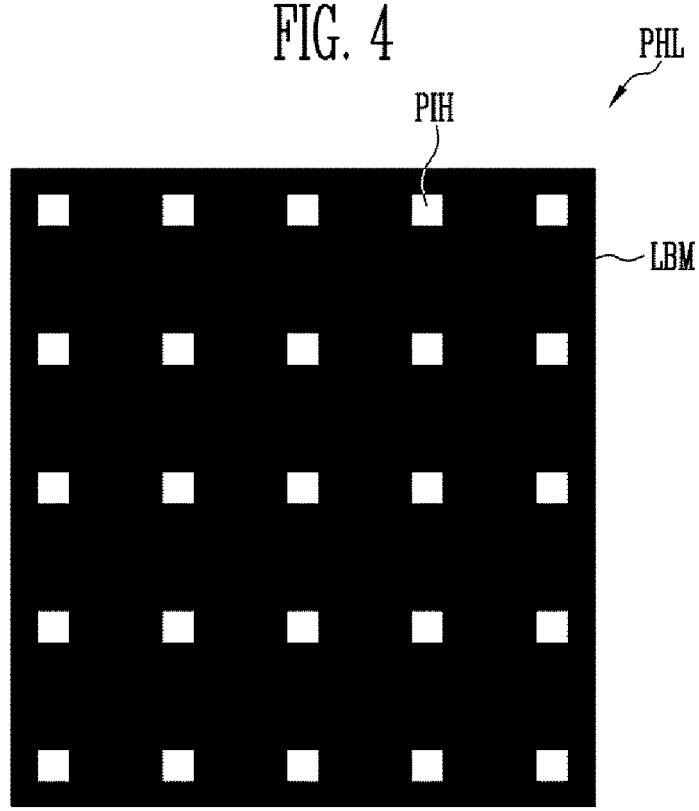
FIG. 4 is a plan view illustrating a pinhole array layer in accordance with an exemplary embodiment of the present disclosure.

FIG. 4 is a plan view illustrating a pinhole array layer PHL in accordance with an exemplary embodiment of the present disclosure.

Referring to FIG. 4, the pinhole array layer PHL may include a light blocking mask LBM, and a plurality of pinholes PIH distributed in the light blocking mask LBM.

In an exemplary embodiment, the light blocking mask LBM may be formed of a light blocking and/or light absorbing material. For example, the light blocking mask LBM may be formed of an opaque metal layer which is locally open in portions thereof in which the respective pinholes PIH are formed. However, the material of the light blocking mask LBM is not limited to metal, and the light blocking mask LBM may be formed of various materials capable of blocking transmission of light. For example, the light blocking mask LBM may be formed of a known black matrix material.

In an exemplary embodiment, the pinholes PIH may be openings which are distributed in the light blocking mask LBM. For example, the pinhole array layer PHL may include a plurality of pinholes PIH which have a constant size and are uniformly distributed in the light blocking mask LBM at a regular pitch. However, the present disclosure is not limited thereto, and the size, the shape, the number, the resolution, and/or the arrangement structure of pinholes PIH may be changed in various ways. For example, in an exemplary embodiment of the present disclosure, the pinholes PIH may be distributed in an irregular pattern in the light blocking mask LBM.

In an exemplary embodiment, in a photo-sensing type sensor, e.g., the fingerprint sensor described with reference to FIGS. 1, 2, 3A, 3B, 3C, 3D, and 3E, and the display device including the same, the pinhole array layer PHL may be disposed between a light emitting element layer in which the light emitting elements are disposed, and a photo sensor array layer in which the photo sensors PHS are disposed, and thus may form an optical system for controlling a path or the like of light by allowing only some light to selectively pass therethrough.

In an exemplary embodiment of the present disclosure, the pinhole array layer PHL along with the above-described photo sensors PHS may form a fingerprint sensor. Furthermore, in an exemplary embodiment, the pinhole array layer PHL may be integrally provided with the circuit element layer of the display panel 110. In this case, the thickness of the module including the photo-sensing type fingerprint sensor and the display device including the fingerprint sensor may be reduced or minimized. Furthermore, moiré effect which may occur in the photo-sensing type fingerprint sensor may be reduced or prevented by controlling the sizes, the pitches, and/or the resolutions of the photo sensor array layer including the photo sensors PHS and the pinhole array layer including the pinholes PIH.

FIGS. 5A, 5B, 5C, and 5D each are plan views illustrating an arrangement structure of pixels PXL, pinholes PIH, and photo sensors PHS in accordance with an exemplary embodiment of the present disclosure. In detail, FIGS. 5A, 5B, 5C, and 5D illustrate different embodiments with regard to the relative sizes, the resolutions, and/or the arrangement relationship of the pixels PXL, the pinholes PIH, and the photo sensors PHS that are disposed in the sensing area SA of FIGS. 1 and 3E.

Figure 5A:
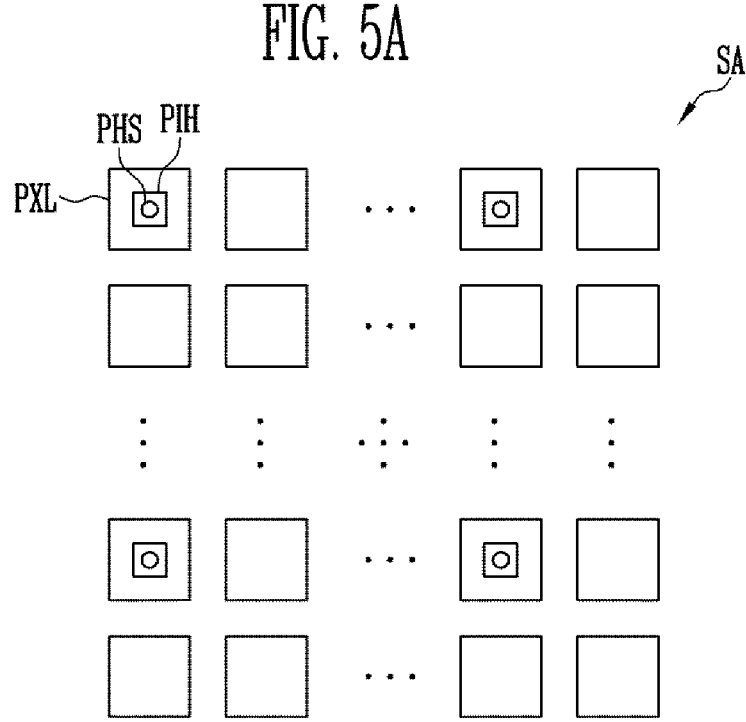
FIGS. 5A, 5B, 5C, and 5D each are plan views illustrating an arrangement structure of pixels, pinholes, and photo sensors in accordance with an exemplary embodiment of the present disclosure.

Referring to FIG. 5A, each of the numbers of pinholes PIH and photo sensors PHS included in the sensing area SA may be less than the number of pixels PXL included in the sensing area SA. For example, each pinhole PIH and each photo sensor PHS may have sizes smaller than that of each pixel PXL. The pinholes PIH and the photo sensors PHS may be distributed in the sensing area SA at resolutions lower than are the pixels PXL.

In an exemplary embodiment, the number and pitch of pinholes PIH distributed in the sensing area SA may be the same as those of the photo sensors PHS distributed in the sensing area SA such that the pinholes PIH and the photo sensors PHS correspond one-to-one to each other. For example, the pinholes PIH and the photo sensors PHS may be paired one-to-one and disposed to overlap with each other. In an exemplary embodiment, a pair of pinhole PIH and photo sensor PHS may be disposed to overlap with any one of the pixels PXL disposed in the sensing area SA, but it is not limited thereto. For example, in an exemplary embodiment of the present disclosure, the pinholes PIH and the photo sensors PHS may be alternately arranged not to overlap with each other. For example, the pinholes PIH and/or the photo sensors PHS may be arranged not to overlap with the pixels PXL.

In an exemplary embodiment, the pinholes PIH and the photo sensors PHS may have the same size or different sizes. In other words, the relatively sizes or the resolutions of the pinholes PIH and the photo sensors PHS are not limited to specific ranges.

Figure 5B:
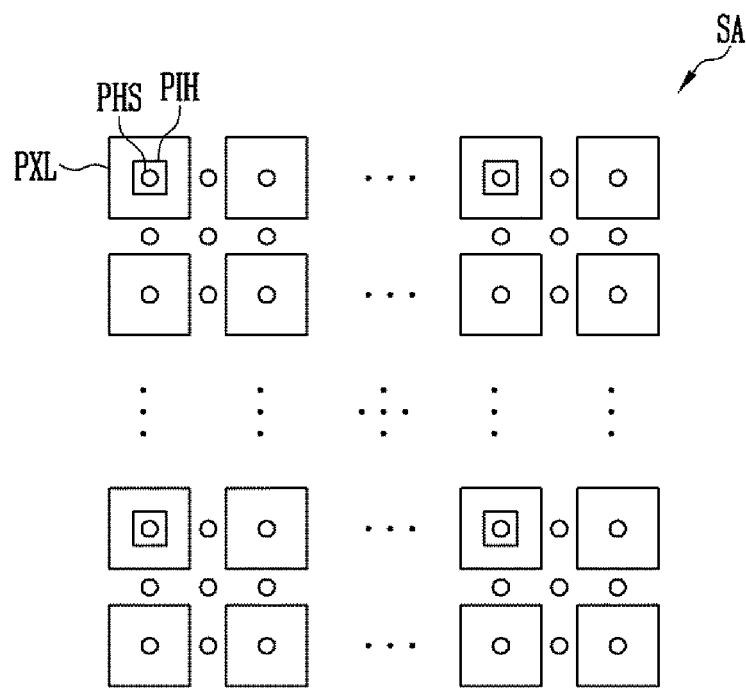

Referring to FIG. 5B, the number of pinholes PIH included in the sensing area SA may be less than the number of pixels PXL included in the sensing area SA, and the number of photo sensors PHS included in the sensing area SA may be greater than that of the pixels PXL. For example, each pinhole PIH and each photo sensor PHS may have sizes smaller than that of each pixel PXL. The pinholes PIH may be distributed in the sensing area SA at a resolution lower than are the pixels PXL. The photo sensors PHS may be densely distributed in the sensing area SA at a resolution higher than are the pixels PXL.

In an exemplary embodiment, at least some of the photo sensors PHS may overlap with any one pinhole PIH and/or pixel PXL, but it is not limited thereto. For example, some of the photo sensors PHS may disposed to overlap with the pinholes PIH and/or the pixels PXL, and some of the photo sensors PHS may be disposed in space between the pixels PXL.

Figure 5C:
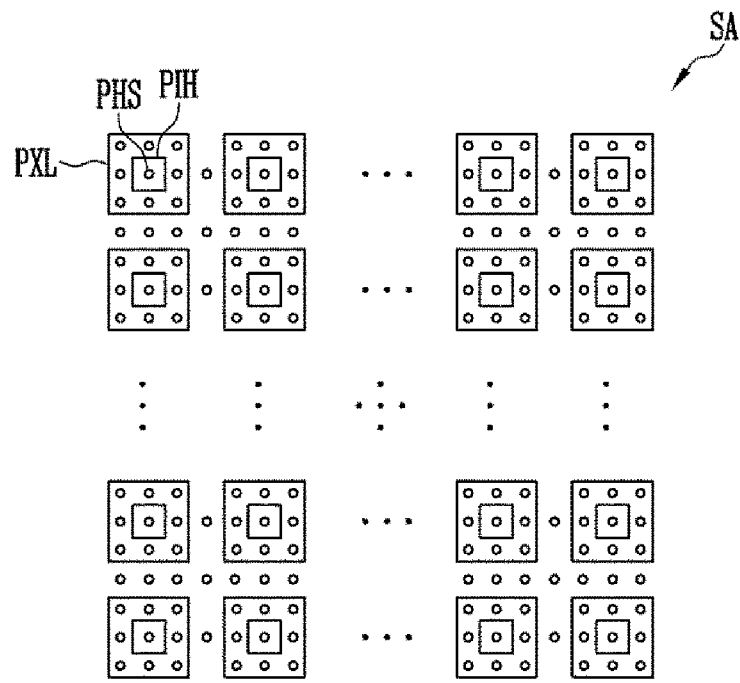
Figure 5D:
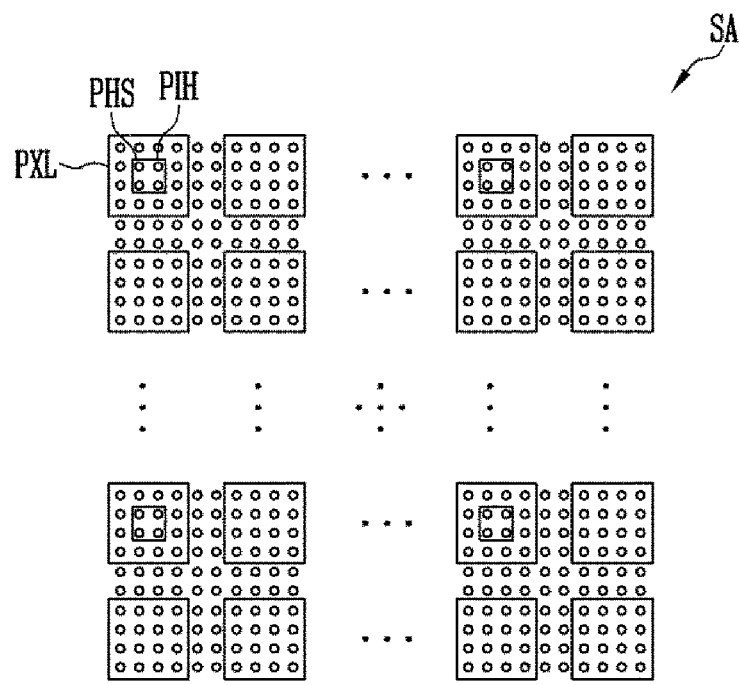
Figure 6:
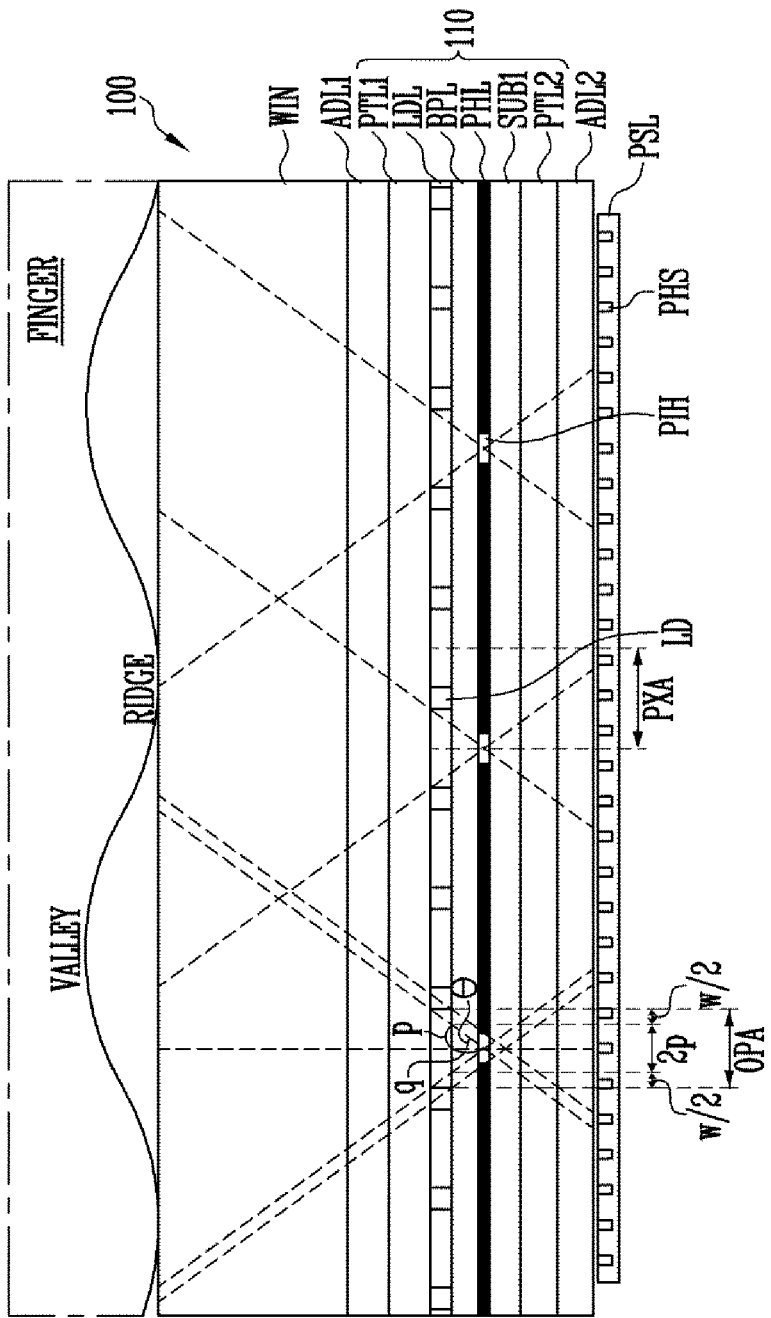
FIGS. 6, 7, 8A, 8B, 8C, 8D, 9, 10, 11, and 12 each are sectional views illustrating a fingerprint sensor and a display device including the fingerprint sensor in accordance with an exemplary embodiment of the present disclosure.

Referring to FIGS. 5C and 5D, the photo sensors PHS, each of which has a comparatively smaller size, may be distributed in the sensing area SA at a comparatively higher resolution. For example, a plurality of photo sensors PHS may overlap with each pinhole PIH and/or each pixel PXL. The pinholes PIH may be distributed in the sensing area SA at a resolution equal to or different from that of the pixels PXL. For example, as illustrated in FIG. 5C, the pinholes PIH may be uniformly distributed in the sensing area SA at a resolution equal to that of the pixels PXL. For example, as illustrated in FIG. 5D, the pinholes PIH may be uniformly distributed in the sensing area SA at a resolution lower than are the pixels PXL.

As described above, the size, the number, the resolution, and the locations of the pinholes PIH and/or the photo sensors PHS disposed in the sensing area SA, and/or the arrangement structure of pinholes PIH and/or the photo sensors PHS with the pixels PXL may be changed in various ways. For example, to sense the shape of the fingerprint of the user using the photo sensors PHS in a manner similar to that a pinhole camera, each pinhole PIH may be formed to have a size (e.g., a width or an area) corresponding to a range within which diffraction of light can be prevented and the shape of the fingerprint can be more clearly sensed. For example, each pinhole PIH may have a width (or a diameter in the case of a circular shape) ranging from approximately 5 μm to approximately 15 μm along a first direction (e.g., a horizontal direction) and/or a second direction (e.g., a vertical direction). Thereby, the reliability of the fingerprint sensor may be enhanced. For example, the width of each pinhole PIH may be within a broader range from approximately 2 μm to approximately 20 μm. In an exemplary embodiment, the size of each pinhole PIH may be changed depending on various factors such as a wavelength bandwidth of light to be used to sense the fingerprint and/or the thickness of each layer of the module.

In addition, although FIGS. 5A, 5B, 5C, and 5D illustrate embodiments in which the photo sensors PHS and the photo sensors PHS are arranged in a regular array form in the sensing area SA, the present disclosure is not limited thereto. For example, in an exemplary embodiment of the present disclosure, the pinholes PIH and/or the photo sensors PHS may be irregularly distributed in the sensing area SA. For example, the density or the arrangement structure of the pinholes PIH and/or the photo sensors PHS may be changed by regions or sections of the sensing area SA.

The arrangement structures, etc. of the pixels PXL, the pinholes PIH, and the photo sensors PHS are not limited to the exemplary embodiments illustrated in FIGS. 5A, 5B, 5C, and 5D. For example, the shapes, the configurations, the relative sizes, the numbers, the resolutions, and/or the mutual arrangement relationship of the pixels PXL, the pinholes PIH, and/or the photo sensors PHS that are disposed in the sensing area SA may be changed in various ways.

FIGS. 6, 7, 8A, 8B, 8C, 8D, 9, 10, 11, and 12 each are sectional views illustrating a fingerprint sensor and a display device 100 including the fingerprint sensor in accordance with an exemplary embodiment of the present disclosure. In more detail, FIGS. 6 to 12 illustrate different embodiments of the display device 100 including the display panel 110 and the photo sensors PHS illustrated in FIGS. 1, 2, 3A, 3B, 3C, 3D, 3E, 4, 5A, 5B, 5C, and 5D, and a light transmitting hole array layer LTHL having at least one layer structure including the pinhole array layer PHL disposed between the display panel 110 and the photo sensors PHS. In an exemplary embodiment, the light transmitting hole array layer LTHL having at least one layer structure may be disposed in the sensing area SA and form the optical system of the fingerprint sensor.

Referring to FIGS. 1, 2, 3A, 3B, 3C, 3D, 3E, 4, 5A, 5B, 5C, 5D, and 6, the display device 100 in accordance with an exemplary embodiment of the present disclosure may include at least a display panel 110, and a photo sensor array layer PSL disposed on one surface of the display panel 110. In an exemplary embodiment, the display device 100 may include: a first substrate SUB1; a circuit element layer BPL, a light emitting element layer LDL, a first passivation layer PTL1, a first adhesive layer ADL1, and a window WIN which are successively disposed on a first surface (e.g., an upper surface) of the first substrate SUB1; and a second passivation layer PTL2, a second adhesive layer ADL2, and a photo sensor array layer PSL which are successively disposed on a second surface (e.g., a lower surface) of the first substrate SUB1. In an exemplary embodiment, the first substrate SUB1, the circuit element layer BPL, the light emitting element layer LDL, and the first and/or second passivation layers PTL1 and/or PTL2 may form the display panel 110.

The display device 100 may further include a pinhole array layer PHL disposed between the light emitting element layer LDL and the photo sensor array layer PSL. In an exemplary embodiment, the photo sensor array layer PSL and the pinhole array layer PHL may be disposed to overlap with each other in the sensing area SA.

In addition, in an exemplary embodiment, the display device 100 may further include, e.g., a polarization plate and/or a touch sensor layer (touch electrode layer) although not illustrated. For example, the display device 100 may further include a polarization plate and/or a touch sensor layer disposed between the first passivation layer PTL1 and the window WIN.

The first substrate SUB1 may be a base substrate of the display panel 110 and be formed of a substantially transparent light-transmitting substrate. In an exemplary embodiment, the first substrate SUB1 may be formed of a rigid substrate including glass or tempered glass, or a flexible substrate made of plastic. However, the material of the first substrate SUB1 is not limited thereto, and the first substrate SUB may be formed of various materials.

In an exemplary embodiment, the first substrate SUB1 may include a display area DA and a non-display area NDA, as illustrated in FIGS. 1 and 2. The display area DA may include a plurality of pixel areas PXA in which respective pixels PXL are disposed and/or formed.

The circuit element layer BPL may be disposed on the first surface of the first substrate SUB1, and may include at least one conductive layer. For example, the circuit element layer BPL may include a plurality of circuit elements each of which is formed in a corresponding one of the pixel areas PXA to form a pixel circuit of the corresponding pixel PXL, and lines configured to supply various power voltages and signals for driving the pixels PXL. In this case, the circuit element layer BPL may include various circuit elements such as a transistor and a capacitor, and a plurality of conductive layers provided to form lines to be connected to the various circuit elements.

The light emitting element layer LDL may be disposed on the first surface of the first substrate SUB1 that includes the circuit element layer BPL. In an exemplary embodiment, the light emitting element layer LDL may include a plurality of light emitting elements LD which are coupled to the circuit elements and/or the lines of the circuit element layer BPL through contact holes or the like. For example, the light emitting element layer LDL may include a plurality of light emitting elements LD at least one of which is disposed in each pixel area PXA.

In other words, in an exemplary embodiment, each of the pixels PXL may include circuit elements disposed on the circuit element layer BPL of each of the pixel areas PXA, and at least one light emitting element LD disposed on the light emitting element layer LDL over the circuit element layer BPL. The structure of the pixel PXL will be described in detail later herein.

The first passivation layer PTL1 may be disposed on the light emitting element layer LDL to cover at least the display area DA. In an exemplary embodiment, the first passivation layer PTL1 may include a sealing member such as a thin film encapsulation (TFE) layer or an encapsulation substrate, and may further include a passivation film or the like besides the sealing member.

The first adhesive layer ADL1 may be disposed between the first passivation layer PTL1 and the window WIN to couple the first passivation layer PTL1 with the window WIN. In an exemplary embodiment, the first adhesive layer ADL1 may include a transparent adhesive such as an optical clear adhesive (OCA), and may include various adhesive materials as well as the transparent adhesive.

The window WIN may be a protective member which is disposed on the uppermost surface of the module including the display device 100 having the display panel 110, and may be a substantially transparent light transmitting substrate. The window WIN may include a rigid or flexible substrate, and the constituent material of the window WIN is not limited to a specific material.

The second passivation layer PTL2 may be disposed on the second surface of the first substrate SUB1. In an exemplary embodiment, the second passivation layer PTL2 may include at least one film layer such as a passivation film layer.

The second adhesive layer ADL2 may be disposed between the second passivation layer PTL2 and the photo sensor array layer PSL to couple the second passivation layer PTL2 with the photo sensor array layer PSL. In an exemplary embodiment, the second adhesive layer ADL2 may include a transparent adhesive such as an OCA, and may include various adhesive materials besides the transparent adhesive.

The photo sensor array layer PSL may be attached to the rear surface of the display panel 110 such that the photo sensor array layer PSL overlaps with at least a portion of the display panel 110. For example, at least in the sensing area SA, the photo sensor array layer PSL may be disposed to overlap with the display panel 110. The photo sensor array layer PSL may include a plurality of photo sensors PHS which are distributed at a predetermined resolution and/or pitch.

The pinhole array layer PHL may be disposed between the display panel 110 and the photo sensor array layer PSL in the sensing area SA. For example, the pinhole array layer PHL may be disposed on the first surface of the first substrate SUB1 such that the pinhole array layer PHL is positioned between the first substrate SUB1 and the circuit element layer BPL. The pinhole array layer PHL may selectively transmit light rays (referred to as "reflective light rays") reflected by an object, e.g., the fingerprint of the user, placed on the module including the display device 100.

The pinholes PIH may also mean optical holes, and each pinhole PIH may be a kind of light transmitting hole. For example, on paths along which light rays vertically or obliquely pass through the display panel 110 and enter the reflective photo sensors PHS, light transmitting holes having the smallest size (area), among light transmitting holes which are formed in the respective layers of the display device 100 such that the light transmitting holes overlap with each other, may form respective pinholes PIH.

In an exemplary embodiment, the display panel 110 may be transparent on regions thereof in which the pinholes PIH are disposed, so as to allow reflective light rays reflected by a fingerprint region of a finger or the like to pass through the corresponding pinholes PIH. Furthermore, to reduce loss of reflective light rays required for fingerprint sensing, the display panel 110 may be configured to allow light rays satisfying a field of view (FOV, also called "angle of view") of a predetermined angular range to pass through the corresponding pinholes PIH.

For example, the display panel 110 may be transparent on regions thereof, each of which is formed with a corresponding pinhole PIH as the center, has an area greater than that of the pinhole PIH, and overlaps with the pinhole PIH. Hereinafter, the regions that are transparent to allow light rays to pass therethrough will be referred to as "optical opening areas (OPA)".

For example, the equation $2p=2*(q*\tan\theta)$ may be satisfied when $\theta$ denotes the angle of the FOV having a desired range based on the center of each pinhole PIH, q denotes the thickness of the circuit element layer BPL, and 2p denotes the width of an optical opening area OPA to be formed in an interface between the circuit element layer BPL and the light emitting element layer LDL. In an exemplary embodiment, the angle of the FOV may approximately range from 30° to 60°, e.g., may be 45°, but it is not limited thereto.

Furthermore, each pinhole PIH may have a predetermined width w, e.g., a width w ranging from 4 μm to 15 μm. Taking into account the width w of the pinhole PIH, the width of the optical opening area OPA may be 2p+w. In this way, the width of the optical opening area OPA to be formed in each layer of the display device 100 may be gradually increased in directions away from the pinhole array layer PHL (i.e., upward and downward from the pinhole array layer PHL).

The width (or, diameter) w of each pinhole PIH with respective to each direction (e.g., each of a horizontal direction and a vertical direction) may be set to approximately 10 times or more a wavelength of a reflective light ray, e.g., to approximately 4 μm, or 5 μm or more, so as to prevent diffraction of light. Furthermore, the width w of each pinhole PIH may be set to a size appropriate for preventing image blur and more clearly sensing the shape of the fingerprint. For example, the width w of each pinhole PIH may be set to approximately 15 μm or less. However, the present disclosure is not limited thereto, and the width w of each pinhole PIH may be changed depending on the wavelength bandwidth of a reflective light ray and/or the thickness of each layer of the module.

For instance, the pitch between adjacent pinholes PIH may be determined taking into account the distance between the pinhole array layer PHL and the photo sensor array layer PSL, and the wavelength range of reflective light rays. For example, when the angle of the FOV of a reflective light ray intended to be obtained is approximately 45°, the distance between adjacent pinholes PIH may be set to more than two times the distance between the pinhole array layer PHL and the photo sensor array layer PSL, and set to more than a value obtained by adding a predetermined error range to the distance. In this case, images sensed by the respective photo sensors PSL may be prevented from overlapping with each other, whereby image blur may be prevented. For example, the pinholes PIH may be distributed in the sensing area SA at a resolution lower than are the pixels PXL.

Furthermore, the shape of the fingerprint may be detected by synthesizing images obtained from a plurality of photo sensors PHS. To this end, the distance between the photo sensors PHS may be set to a predetermined value such that the photo sensors PHS are dense to enable a reflective light ray reflected from a target (e.g., a specific region of a finger such as a fingerprint region) to be incident on at least two adjacent photo sensors PHS. For example, the photo sensors PHS may have a width and/or a pitch less than that of the pinholes PIH, and may be distributed in the sensing area SA at a resolution higher than are the pinholes PIH. For example, the photo sensors PHS may be distributed in the sensing area SA at a small pitch corresponding to approximately 1/10 to 1/100 of that of the pinholes PIH, and may be densely disposed in the sensing area SA at a resolution higher than are the pixels PXL. For example, the photo sensors PHS may be arranged at a pitch of 50 μm in each of the horizontal and vertical directions, and the pinholes PIH may be arranged at a pitch of 450 μm in each of the horizontal and vertical directions.

The display device 100 in accordance with the above-mentioned embodiment may include a fingerprint sensor which includes the light emitting element layer LDL, the photo sensor array layer PSL, and the pinhole array layer PHL. In detail, the fingerprint sensor in accordance with an exemplary embodiment of the present disclosure may include the light emitting element layer LDL, the photo sensor array layer PSL, and the pinhole array layer PHL. The light emitting element layer LDL may include light emitting elements LD which may also function as a light source of a photo-sensing type sensor. The photo sensor array layer PSL may include photo sensors PHS which receive reflective light rays that are emitted from the light emitting element layer LDL and reflected from an object (e.g., a fingerprint region of a finger) that is placed on the display device 100. The pinhole array layer PHL may be disposed between the light emitting element layer LDL and the photo sensor array layer PSL and include pinholes PIH formed to selectively transmit the reflective light rays.

In an exemplary embodiment, the fingerprint sensor may further include an optical opening area OPA which is formed in the display panel 110 or the like so as to prevent loss of a reflective light ray which is incident into each pinhole PIH within a predetermined angular range of the FOV. In addition, the fingerprint sensor may selectively include a separate light control layer which is disposed in the display panel 110 and/or at least one surface of the display panel 110 so as to more easily control the FOV.

In an exemplary embodiment, each photo sensor PHS may have a size smaller than that of each pixel PXL or each pinhole PIH. The photo sensors PHS may be densely distributed in the sensing area SA at a resolution higher than are the pixels PXL or the pinholes PIH. For example, the photo sensors PHS may be distributed in the sensing area SA at a pitch of approximately 50 μm in each of the horizontal and vertical directions, and the pinholes PIH may be distributed in the sensing area SA at a pitch of approximately 450 μm in each of the horizontal and vertical directions. In this case, the photo sensors PHS may be densely disposed in the sensing area SA without the need to align the photo sensors PHS in one-to-one correspondence with the pixels PXL and/or the pinholes PIH. Hence, moiré effect may be prevented or minimized regardless of whether the photo sensors PHS are aligned with the pixels PXL and/or the pinholes PIH.

In other words, in an exemplary embodiment, moiré effect which may occur in the photo-sensing type fingerprint sensor may be prevented or reduced by adjusting the resolutions of the pinhole array layer PHL and the photo sensor array layer PSL, for example, such that there is a great difference in resolution therebetween enough to make the alignment unnecessary. Consequently, fingerprint information may be prevented from being distorted by the moiré effect, and the reliability of the fingerprint sensor may be enhanced.

In the fingerprint sensor and the display device 100 including the same in accordance with an exemplary embodiment of the present disclosure, the light emitting elements LD of the pixels PXL may also be used as the light source of the fingerprint sensor. However, the present disclosure is not limited thereto. For example, in an exemplary embodiment, the fingerprint sensor and the display device including the same may further include a separate light source for fingerprint sensing.

A fingerprint sensing method of the fingerprint sensor and the display device 100 including the fingerprint sensor in accordance with an exemplary embodiment of the present disclosure will be described in brief. During a fingerprint sensing period during which the photo sensors PHS are activated, the pixels PXL (particularly, the light emitting elements LD provided in the pixels PXL) of the sensing area SA may emit light while the finger (e.g., a fingerprint region) of the user comes into contact with the sensing area SA or is positioned adjacent to the sensing area SA. For example, during the fingerprint sensing period, all of the pixels PXL of the sensing area SA may simultaneously or sequentially emit light. For example, in an exemplary embodiment, among the pixels PXL of the sensing area SA, only some pixels PXL spaced apart at a predetermined interval, or selected some pixels PXL that emit light of a certain color (e.g., short-wavelength light such as blue light) may emit light, thus being used as a light source for fingerprint sensing.

Then, some of the light emitted from the pixels PXL may be reflected by the finger of the user, and be incident on the photo sensors PHS via the pinholes PIH and the optical opening areas OPA formed in each layer of the display device 100. Here, differences in intensity of light and/or waveform between reflective light rays reflected by the ridges and the valleys of the fingerprint may be detected, whereby the fingerprint shape (fingerprint pattern) of the user may be detected.

Figure 7:
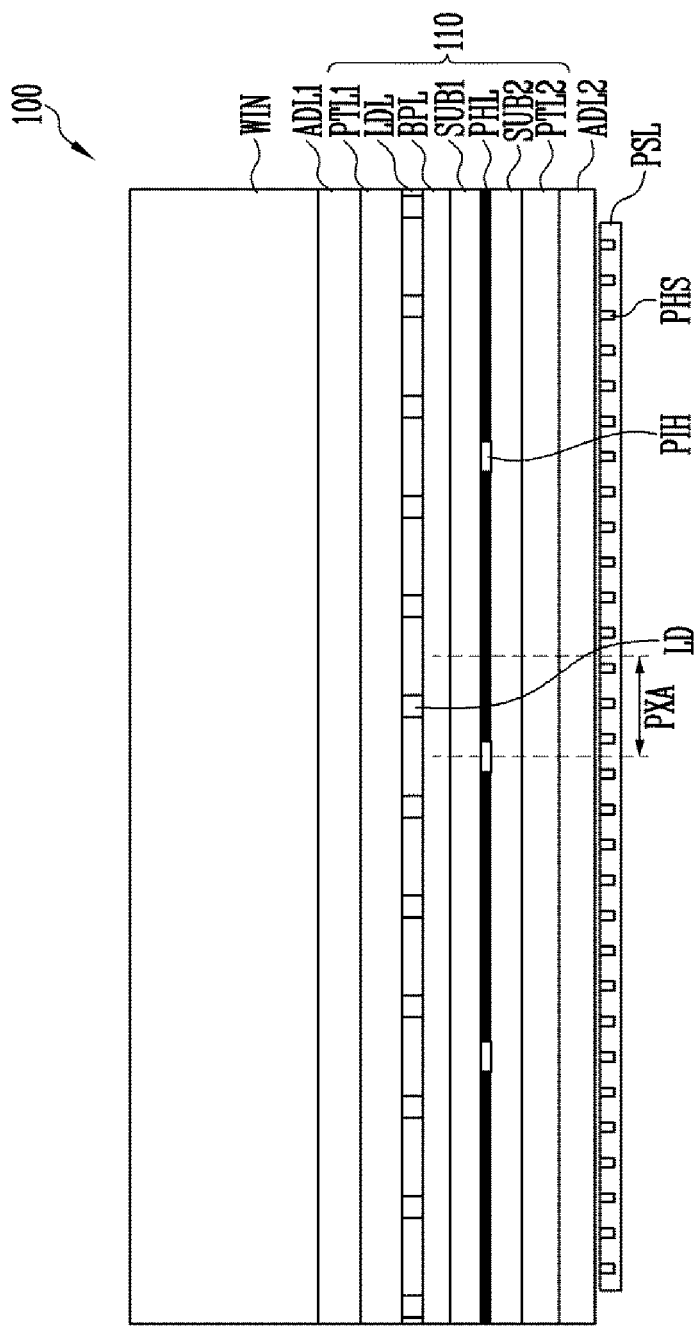

Referring to FIG. 7, the display panel 110 may further include a second substrate SUB2 disposed on the second surface of the first substrate SUB1. For example, the second substrate SUB2 of the display panel 110 may be disposed between the first substrate SUB1 and the photo sensor array layer PSL. The pinhole array layer PHL may be disposed between the first substrate SUB1 and the second substrate SUB2. In the following descriptions of embodiments of FIG. 7 and the remaining drawings, detailed explanation of configurations similar to or equal to that of at least one of the above-described embodiments will be omitted.

In an exemplary embodiment, the second substrate SUB2 may be made of a material equal to or different from that of the first substrate SUB1. For example, each of the first substrate SUB1 and the second substrate SUB2 may be a thin film substrate made of polyimide (PI). In an exemplary embodiment, each of the first substrate SUB1 and the second substrate SUB2 may be a hybrid substrate including different materials. The second substrate SUB2 may include at least one of materials mentioned above as the constituent material of the first substrate SUB1. Besides, the second substrate SUB2 may be made of various other materials.

Figure 8A:
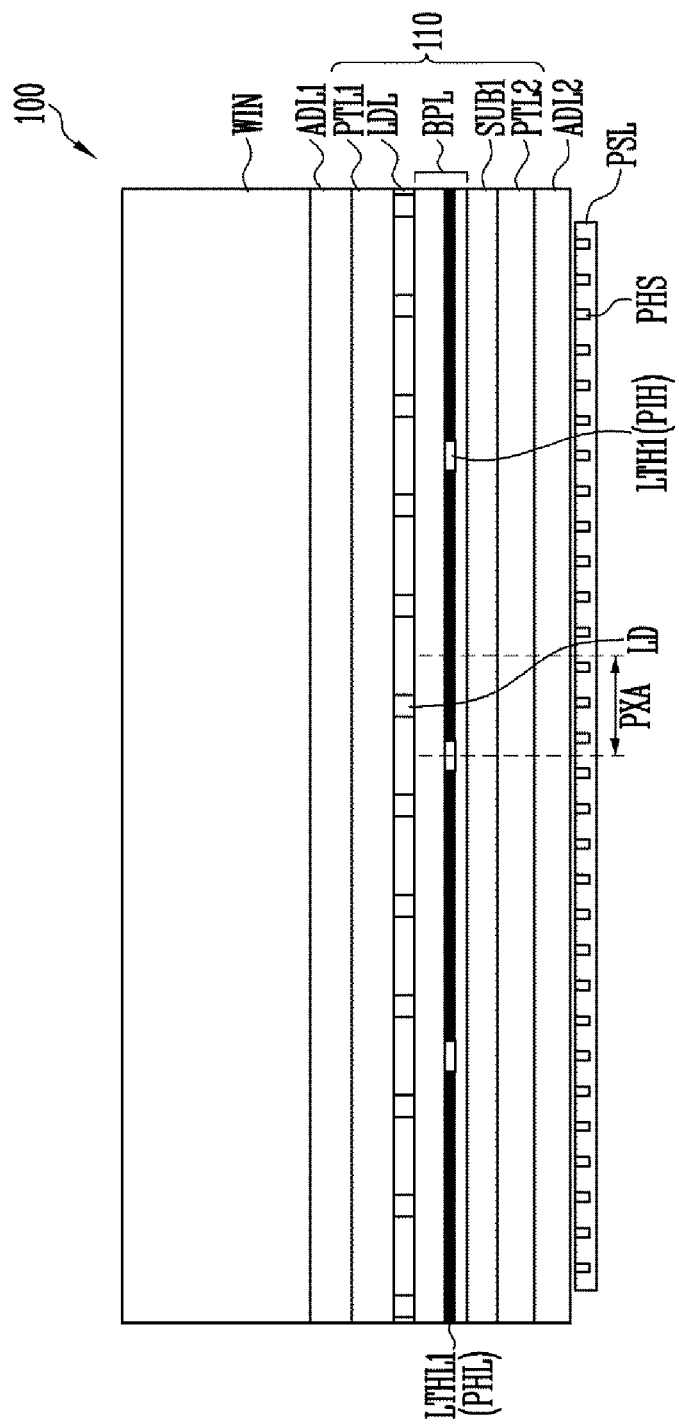

Referring to FIGS. 8A, 8B, 8C, and 8D, the circuit element layer BPL may include a light transmitting hole array layer LTHL which has at least one layer structure and is disposed in the sensing area SA. For example, as illustrated in FIG. 8A, the circuit element layer BPL may include a first light transmitting hole array layer LTHL1 having a plurality of first light transmitting holes LTH1 which are distributed in the circuit element layer BPL. Each of the first light transmitting holes LTH1 may form a pinhole PIH of the fingerprint sensor. In other words, in an exemplary embodiment, the first light transmitting hole array layer LTHL1 of the circuit element layer BPL may form the pinhole array layer PHL of the fingerprint sensor.

Figure 8B:
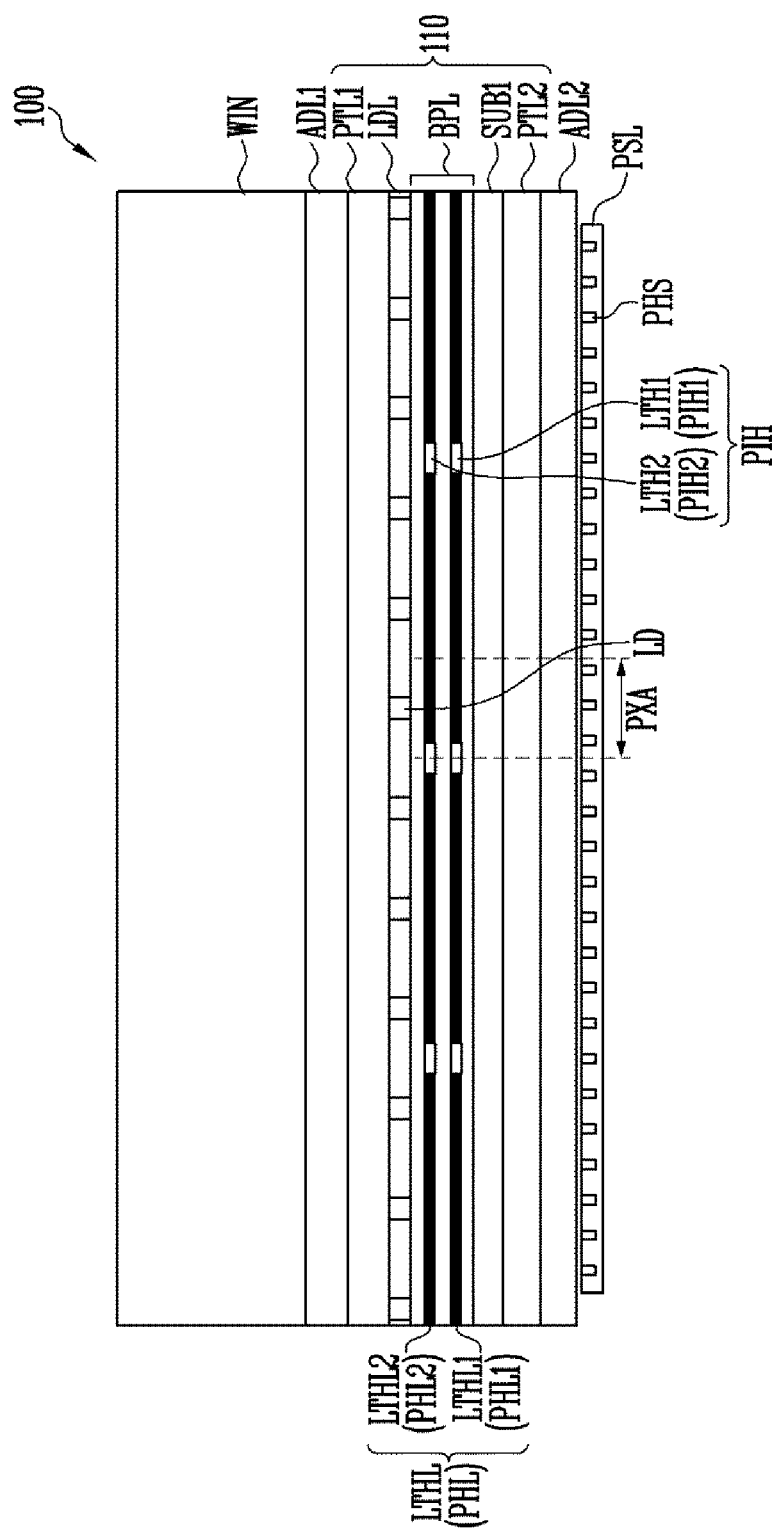
Figure 8C:
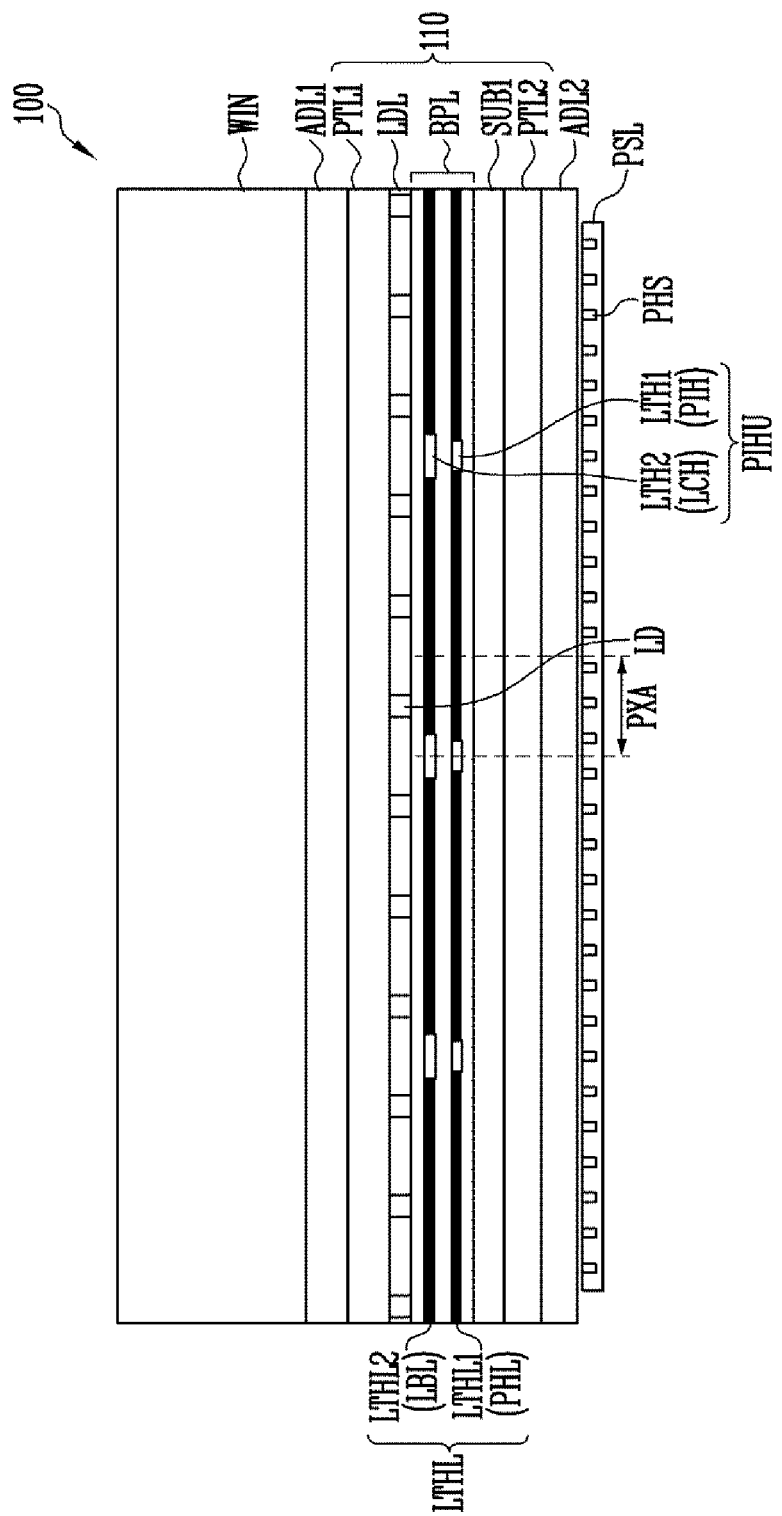
Figure 8D:
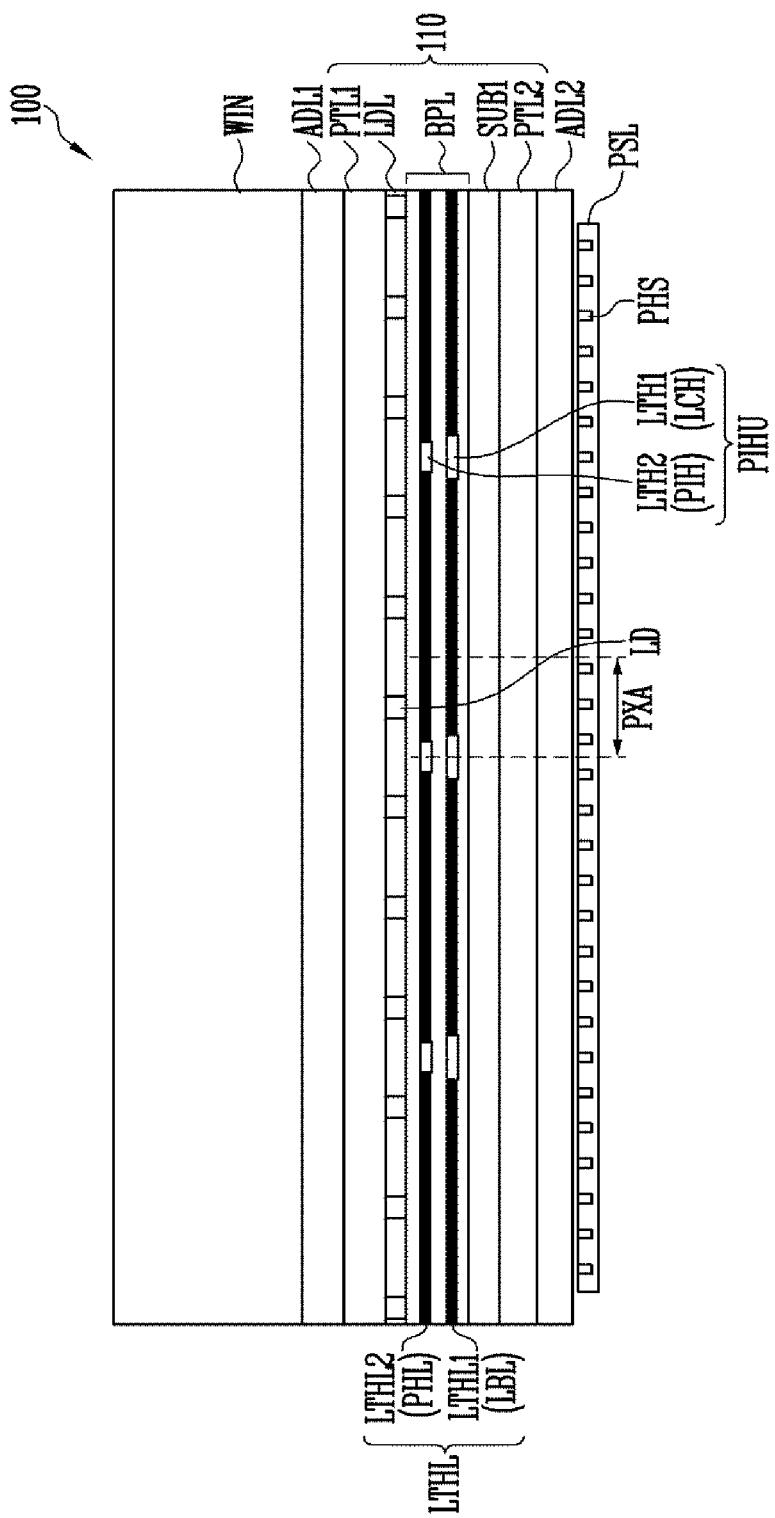

In an exemplary embodiment, the circuit element layer BPL may include a plurality of light transmitting hole array layers LTHL. For example, as shown in FIGS. 8B, 8C, and 8D, the circuit element layer BPL may include a first light transmitting hole array layer LTHL1 and a second light transmitting hole array layer LTHL2 which are disposed in the circuit element layer BPL and overlap with each other. In an exemplary embodiment, the first light transmitting hole array layer LTHL1 may include a plurality of first light transmitting holes LTH1 which are distributed in a first layer (e.g., a first conductive layer) of the circuit element layer BPL. The second light transmitting hole array layer LTHL2 may include a plurality of second light transmitting holes LTH2 which are distributed in a second layer (e.g., a second conductive layer) of the circuit element layer BPL such that the second light transmitting holes LTH2 overlap with the first light transmitting holes LTH1.

In an exemplary embodiment, each pair of first and second light transmitting holes LTH1 and LTH2 corresponding to each other may have the same size or different sizes. For example, as illustrated in FIG. 8B, each pair of first and second light transmitting holes LTH1 and LTH2 may have substantially the same width and/or area and be disposed to overlap with each other. In an exemplary embodiment, the pair of first and second light transmitting holes LTH1 and LTH2 may form a pinhole PIH having a multi-layer structure. For example, each first light transmitting hole LTH1 may form a first pinhole PIH1 formed in the first layer of the circuit element layer BPL. Each second light transmitting hole LTH2 may form a second pinhole PIH1 formed in the second layer of the circuit element layer BPL. Each pair of first and second light transmitting holes LTH1 and LTH2 that have the same size and overlap with each other may form an individual pinhole PIH having a multi-layer structure. In this case, the first light transmitting hole array layer LTHL1 including the first light transmitting holes LTH1 and the second light transmitting hole array layer LTHL2 including the second light transmitting holes LTH2 may form a pinhole array layer PHL having a multi-layer structure.

For example, as illustrated in FIGS. 8C and 8D, each pair of first and second light transmitting holes LTH1 and LTH2 may have different widths and/or areas and be disposed to overlap with each other, thus forming a pinhole unit PIHU. For example, as illustrated in FIG. 8C, each first light transmitting hole LTH1 may have a width and/or an area less than that of the corresponding second light transmitting hole LTH2 and forms a pinhole PIH. Each second light transmitting hole LTH2 may form a light control hole LCH which controls a path of a light ray passing through the corresponding first light transmitting hole LTH1 (e.g., limits the FOV of a reflective light ray to a predetermined angular range). In this case, the first light transmitting array layer LTHL1 may form a pinhole array layer PHL, and the second light transmitting array layer LTHL2 may form a light control layer LBL. For example, as illustrated in FIG. 8D, each first light transmitting hole LTH1 may have a width and/or an area greater than that of the corresponding second light transmitting hole LTH2 and forms a light control hole LCH. Each second light transmitting hole LTH2 may form a pinhole PIH. In this case, the first light transmitting array layer LTHL1 may form a light control layer LBL, and the second light transmitting array layer LTHL2 may form a pinhole array layer PHL.

In an exemplary embodiment, the first light transmitting holes LTH1 and the light control holes LCH may be uniformly distributed in the sensing area SA at a resolution lower than are the pixels PXL and the photo sensors PHS. In this case, the photo sensors PHS may have a width and a pitch that are less than those of the first light transmitting holes LTH1 and the light control holes LCH, and may be distributed in the sensing area SA at a resolution higher than are the first light transmitting holes LTH1 and the light control holes LCH.

The display device 100 in accordance with each of the exemplary embodiments of FIGS. 8A, 8B, 8C, and 8D may include a fingerprint sensor having the first light transmitting hole array layer LTHL1 integrated with the circuit element layer BPL. In detail, the fingerprint sensor in accordance with an exemplary embodiment of the present disclosure may include: a first substrate SUB1; a circuit element layer BPL and a light emitting element layer LDL which are successively disposed on the first surface of the first substrate SUB1; a photo sensor array layer PSL disposed on the second surface of the first substrate SUB1; and a light transmitting hole array layer LTHL (having at least one layer structure, e.g., including the first light transmitting hole array layer LTHL1) which is disposed in the circuit element layer BPL, overlaps with the photo sensor array layer PSL, and has a plurality of first light transmitting holes LTH1 distributed in the circuit element layer BPL.

In an exemplary embodiment, the light transmitting hole array layer LTHL having at least one layer structure may be integrally formed with the circuit element layer BPL using, as a mask, opaque patterns (e.g., opaque patterns such as metal electrodes or metal lines disposed on a first gate layer, a second gate layer, and/or a source-drain layer) disposed on at least one conductive layer (e.g., a semiconductor layer, the first gate layer, the second gate layer, and/or a source-drain layer) provided to form various circuit elements and/or lines of the circuit element layer BPL, rather than using a separate mask layer through an additional process. In this case, the additional process is not needed to form the light transmitting hole array layer LTHL. Consequently, the thickness of the display device 100 including the photo-sensing type fingerprint sensor may be reduced, the production cost of the display device 100 may be reduced, and the process efficiency may be enhanced.

Figure 9:
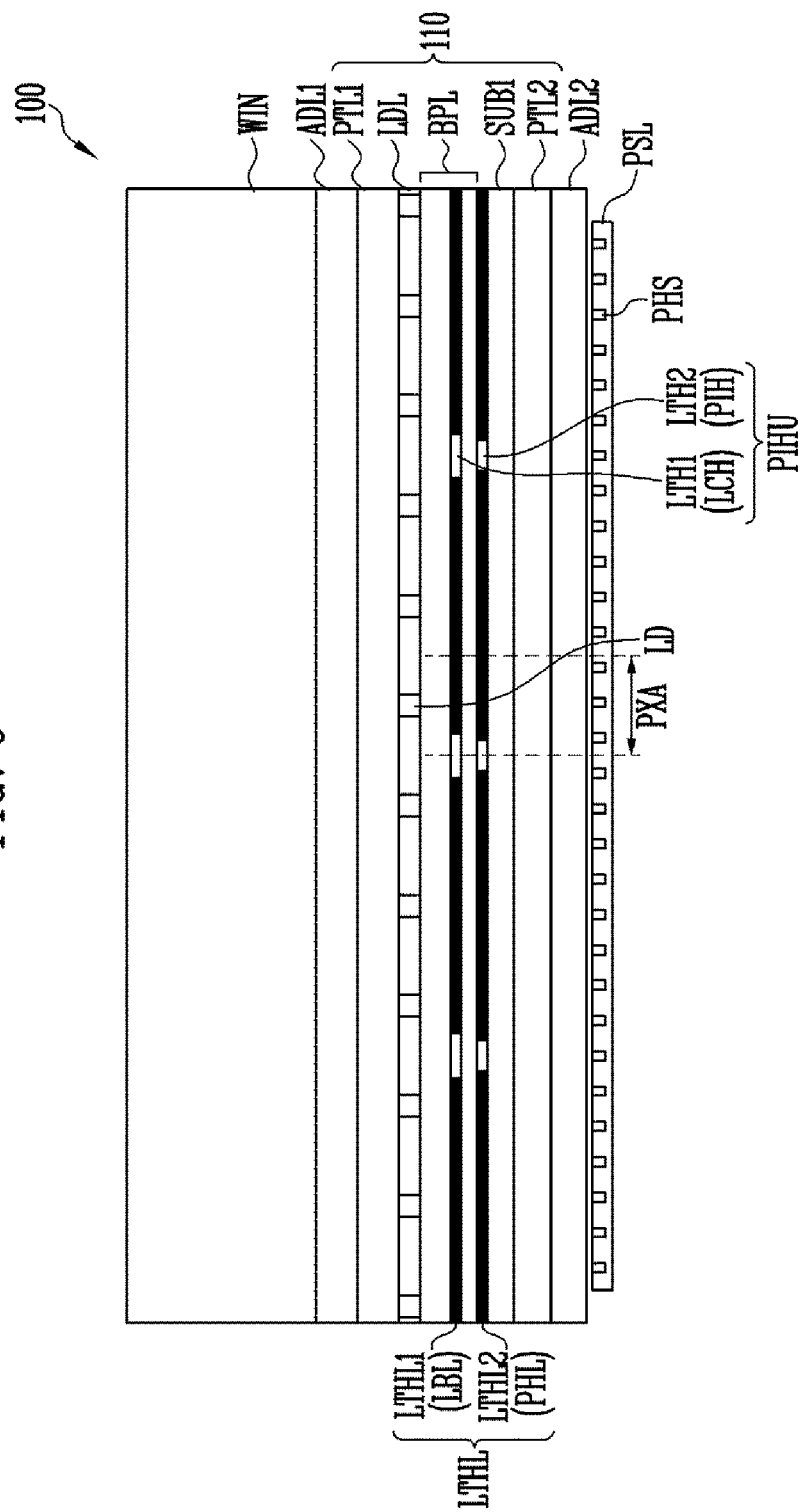

Referring to FIG. 9, the circuit element layer BPL may include a first light transmitting hole array layer LTHL1 having a plurality of first light transmitting holes LTH1. A second light transmitting hole array layer LTHL2 overlapping with the first light transmitting hole array layer LTHL1 may be disposed between the first substrate SUB1 and the circuit element layer BPL. In an exemplary embodiment, the second light transmitting hole array layer LTHL2 may have a plurality of second light transmitting holes LTH2 which overlap with the respective first light transmitting holes LTH1. Each of the second light transmitting holes LTH2 may have a width different from each of the first light transmitting holes LTH1. For example, the width of each second light transmitting hole LTH2 may be less than that of the corresponding first light transmitting hole LTH1 that overlaps with the second light transmitting hole LTH2. In this case, each pair of first and second light transmitting holes LTH1 and LTH2 may form a pinhole unit PIHU. Furthermore, the first light transmitting array layer LTHL1 may form a light control layer LBL, and the second light transmitting array layer LTHL2 may form a pinhole array layer PHL.

Figure 10:
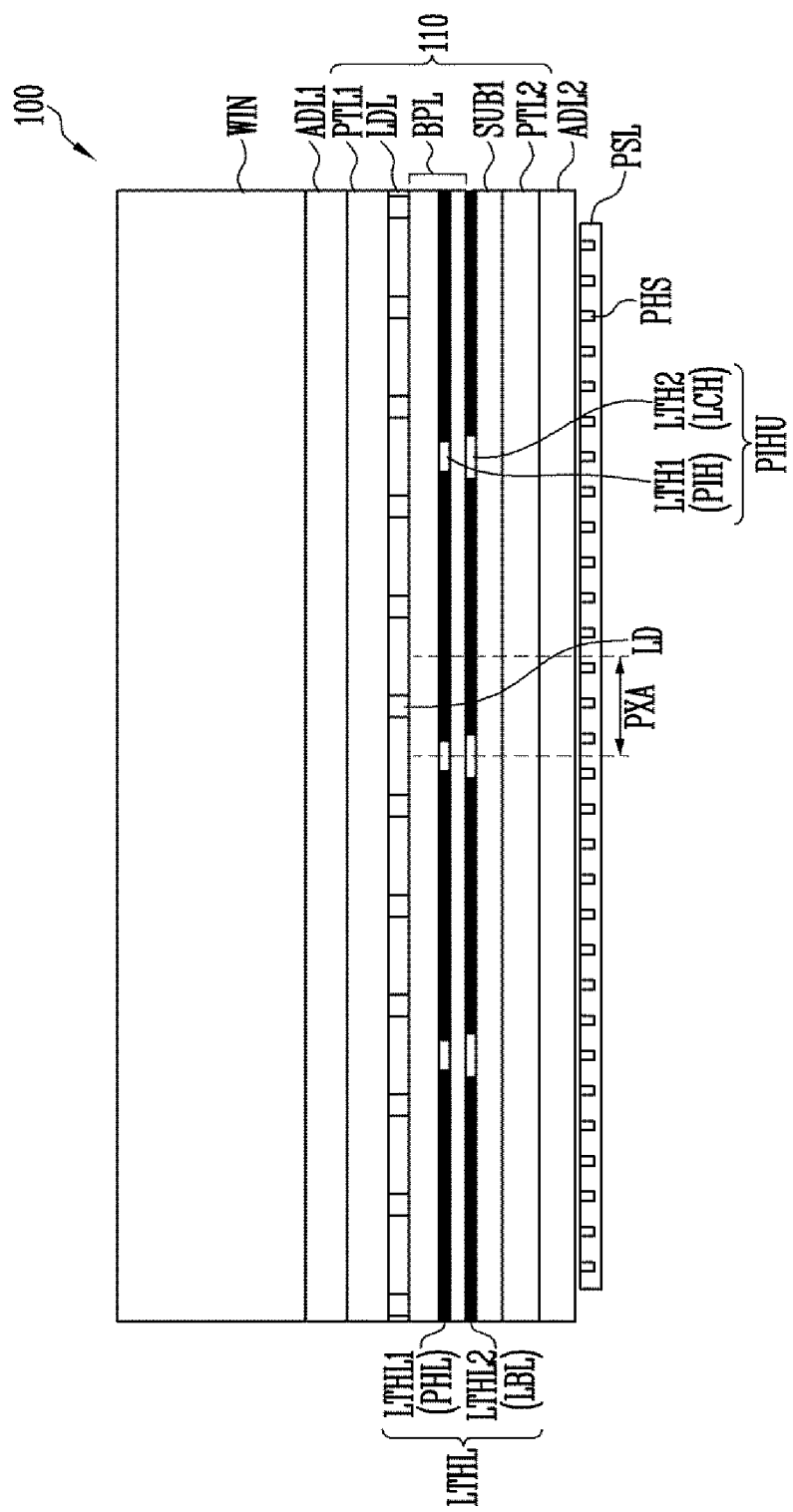

Referring to FIG. 10, in the circuit element layer BPL, each second light transmitting hole LTH2 may have a width greater than that of the corresponding first light transmitting hole LTH1 that overlaps with the second light transmitting hole LTH2. In this case, the first light transmitting array layer LTHL1 may form a pinhole array layer PHL, and the second light transmitting array layer LTHL2 may form a light control layer LBL.

Figure 11:
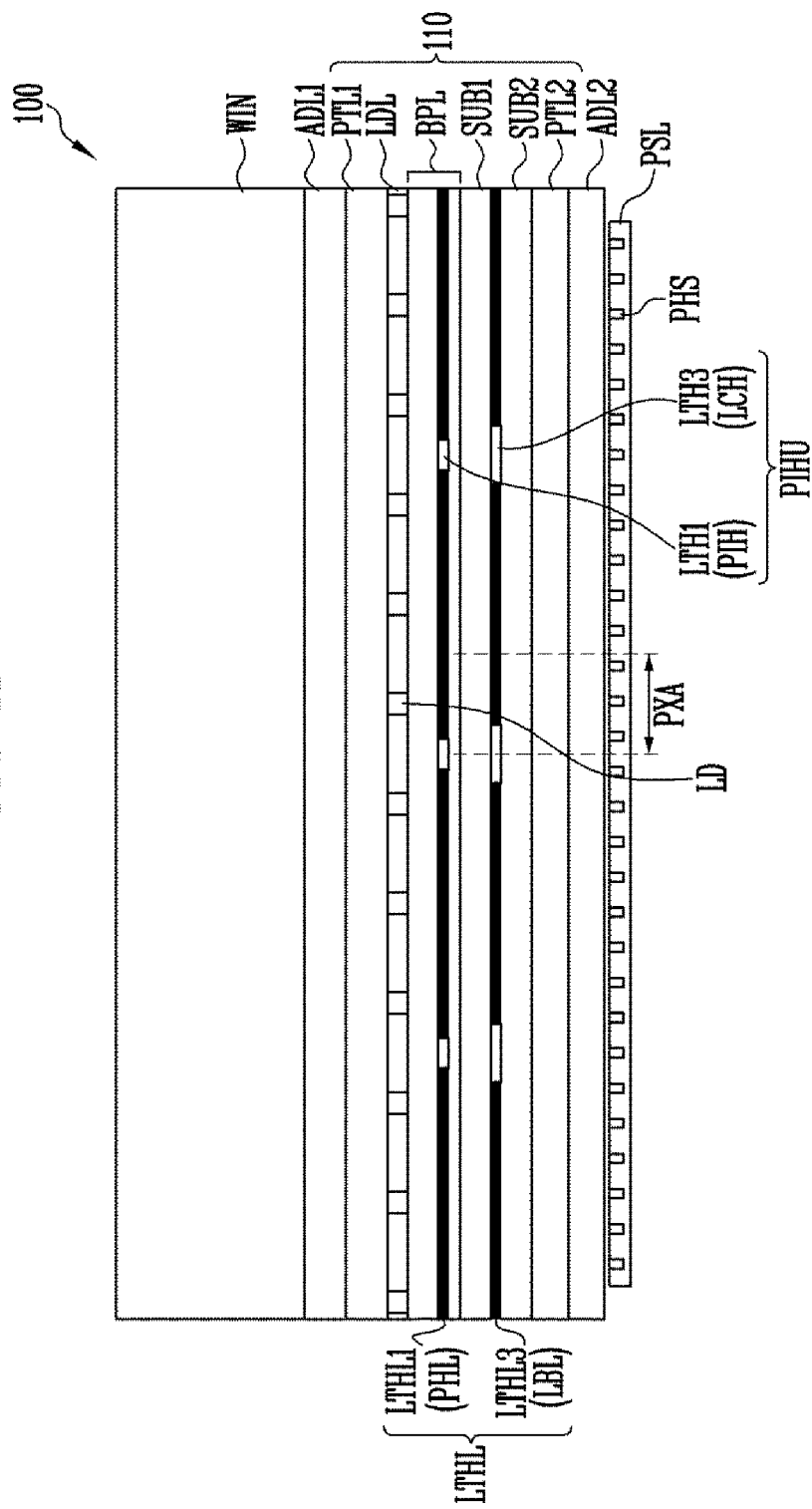

Referring to FIG. 11, the circuit element layer BPL may include a first light transmitting hole array layer LTHL1 which forms a pinhole array layer PHL. The display device 100 may further include a third light transmitting hole array layer LTHL3 which is disposed between the first substrate SUB1 and the second substrate SUB2 and overlaps with the first light transmitting hole array layer LTHL1. The third light transmitting hole array layer LTHL3 may include a plurality of third light transmitting holes LTH3 which overlap with the respective first light transmitting holes LTH1.

For example, each third light transmitting hole LTH3 may have a size greater than that of each first light transmitting hole LTH1, and form a light control hole LCH. In this case, the third light transmitting hole array layer LTHL3 may form a light control layer LBL. However, the present disclosure is not limited to this. For example, in an exemplary embodiment of the present disclosure, each third light transmitting hole LTH3 may have a size less than that of each first light transmitting hole LTH1, and form a pinhole PIH. In this case, the third light transmitting hole array layer LTHL3 may form a pinhole array layer PHL.

Figure 12:
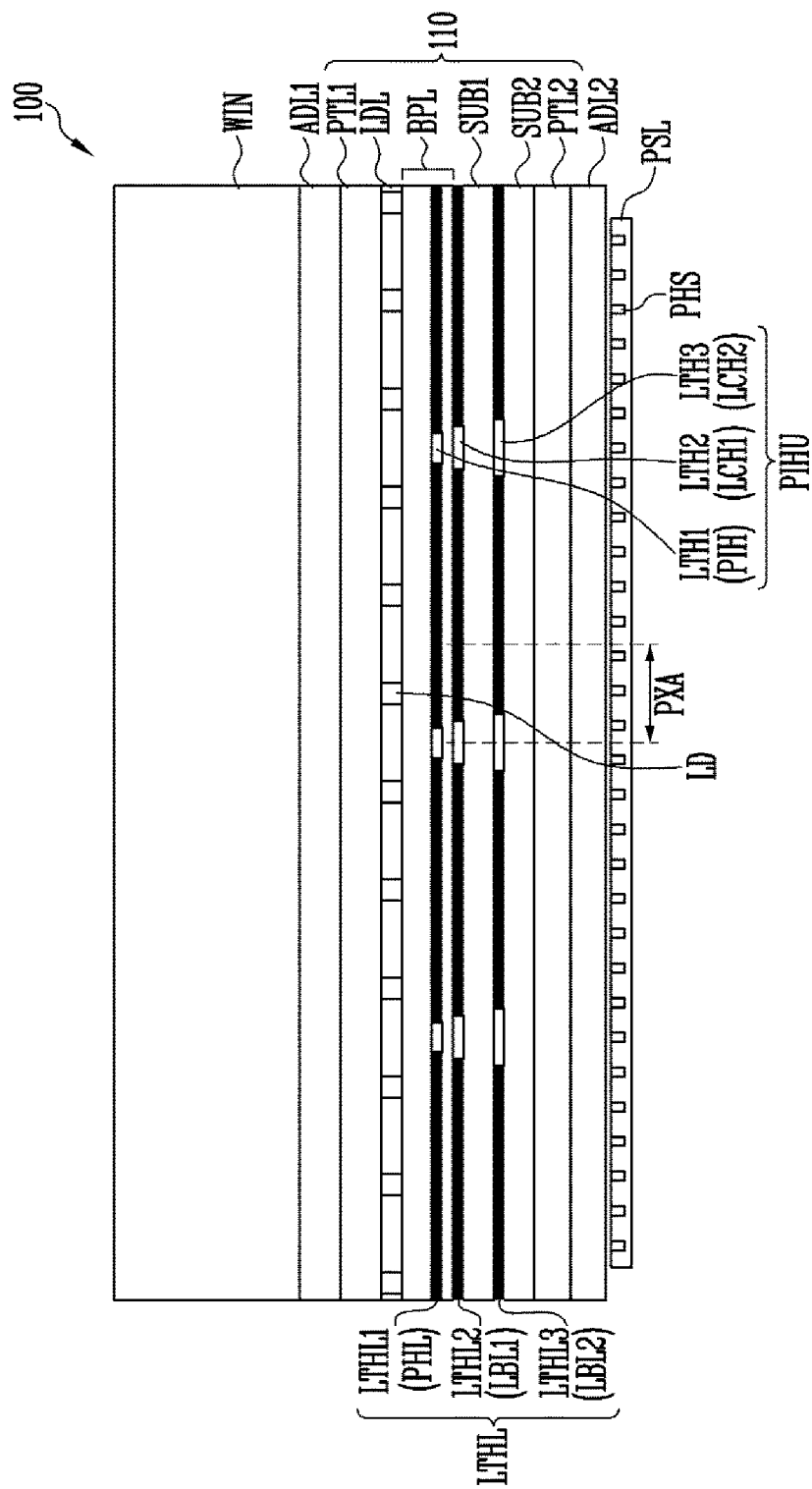

Referring to FIG. 12, the circuit element layer BPL may include a first light transmitting hole array layer LTHL1 which forms a pinhole array layer PHL. A second light transmitting hole array layer LTHL2 and a third light transmitting hole array layer LTHL3 which respectively form a first light control layer LBL1 and a second light control layer LBL2 may be disposed on the respective opposite surfaces of the first substrate SUB1. In this case, each group of first, second, and third light transmitting holes LTH1, LTH2, and LTH3 that overlap with each other may form a pinhole unit PIHU.

As described above, the fingerprint sensor and the display device 100 in accordance with an exemplary embodiment of the present disclosure may include the light transmitting hole array layer LTHL having at least one layer structure including the pinhole array layer PHL. The number, the structure, and/or the location of the light transmitting hole array layer LTHL may be changed in various ways.

In an exemplary embodiment, each photo sensor PHS may have a smaller size compared to the size of each pixel PXL, each pinhole PIH, and/or each light control hole LCH. The photo sensors PHS may be densely distributed in the sensing area SA at a resolution higher than are the pixels PXL and the optically system (e.g., the pinholes PIH and the photo control holes LCH). For example, the photo sensors PHS may be distributed in the sensing area SA at a pitch of approximately 50 μm in each of the horizontal and vertical directions. The pinholes PIH and/or the light control holes LCH may be distributed in the sensing area SA at a pitch of approximately 450 μm in each of the horizontal and vertical directions, and the pitch and/or the width of each of the pinholes PIH and/or the light control holes LCH may be greater than that of each of the photo sensors PHS. In this case, the photo sensors PHS may be densely disposed in the sensing area SA without the need to align the photo sensors PHS in one-to-one correspondence with the pixels PXL, the pinholes PIH, and/or the light control holes LCH. Hence, occurrence of moiré effect of the fingerprint sensor may be prevented or minimized regardless of whether the photo sensors PHS are aligned with the pixels PXL, the pinholes PIH, and/or the light control holes LCH.

In other words, in an exemplary embodiment, moiré effect which may occur in the photo-sensing type fingerprint sensor may be prevented or reduced by adjusting the resolutions of the pinhole array layer PHL, the light control layer LBL, and/or the photo sensor array layer PSL overlapping with the pinhole array layer PHL and the light control layer LBL, for example, such that there is a great difference in resolution therebetween enough to make the alignment unnecessary. Consequently, fingerprint information may be prevented from being distorted by the moiré effect, and the reliability of the fingerprint sensor may be enhanced.

Although FIGS. 6, 7, 8A, 8B, 8C, 8D, 9, 10, 11, and 12 illustrate that each pinhole PIH, etc. are disposed in a boundary area between two pixel areas PXA, the present disclosure is not limited thereto. For example, in an exemplary embodiment of the present disclosure, at least one of the first light transmitting holes LTH1 that form the respective pinholes PIH or the respective light control hole LCH may be disposed in an pixel area PXA of any one pixel PXL disposed in the sensing area SA. A detailed embodiment pertaining thereto will be described later herein.

In an exemplary embodiment, at least one light transmitting hole array layer LTHL may be supplied with a predetermined voltage. For example, each light blocking mask LBM forming at least one pinhole array layer PHL and/or light control layer LBL may be formed with a conductive layer. The light blocking mask LBM may be electrically connected to a signal line to which a predetermined driving signal (e.g., a data signal, a scan signal, or other control signal) is supplied, or the light blocking mask LBM may be electrically connected to a power line to which a driving power voltage of a predetermined power supply (e.g., a high potential or low potential pixel power supply, a gate-on or gate-off power supply, a bias power supply, a reference power supply, or a ground power supply) is supplied. For instance, the predetermined voltage may be selectively supplied to the at least one light transmitting hole array layer LTHL so that characteristics of the circuit elements constituting the pixels PXL may be controlled or variations of the characteristics of the circuit elements may be reduced or compensated. In this case, the at least one light transmitting hole array layer LTHL may form the optical system of the fingerprint sensor and may also be used for stable driving of the display device.

Figure 13:
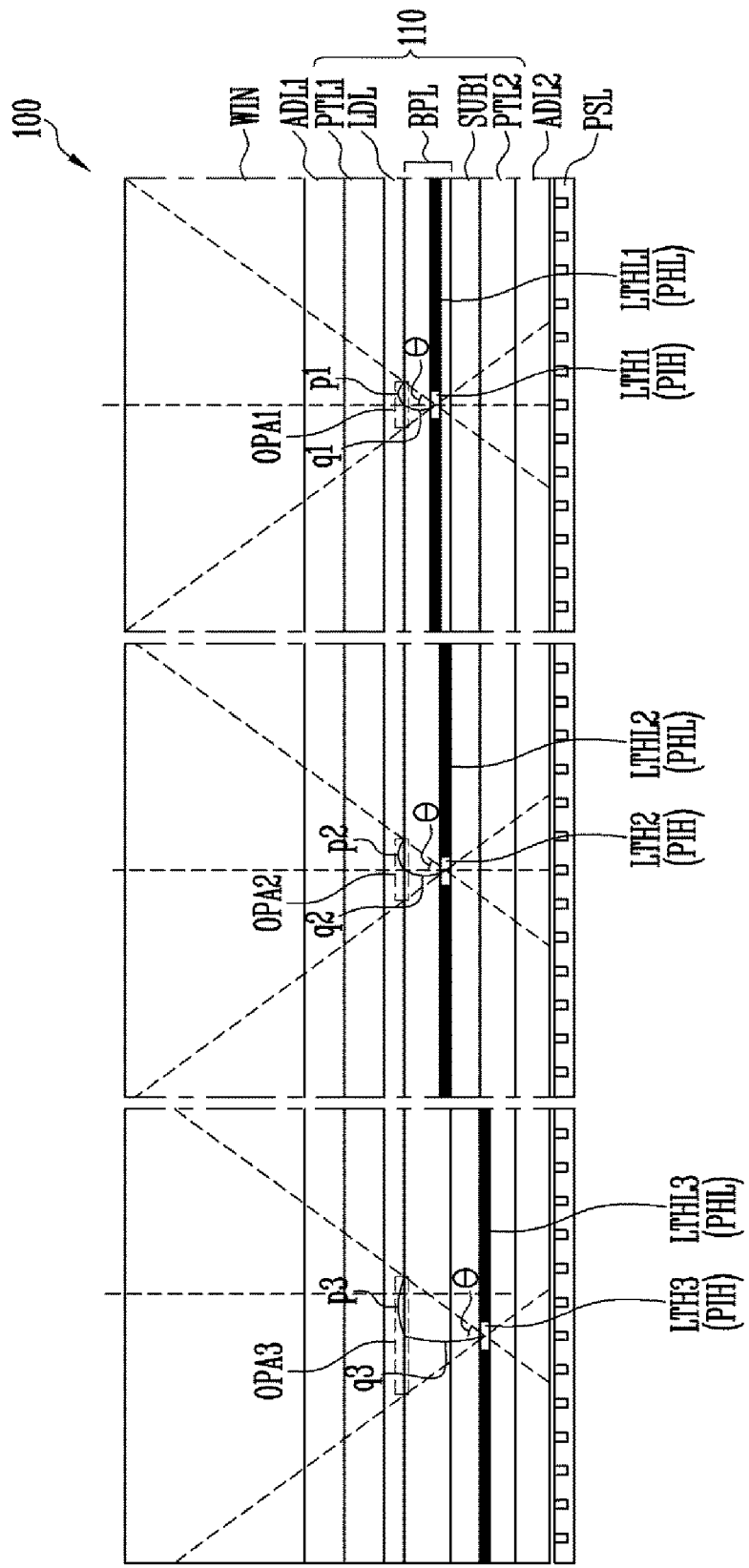
FIG. 13 is a sectional view comparatively illustrating required sizes of an opening area depending on locations of a pinhole array layer for respective exemplary embodiments.

FIG. 13 is a sectional view comparatively illustrating required sizes of the opening area depending on the locations of the pinhole array layer for respective exemplary embodiments. In the description of the exemplary embodiment of FIG. 13, like reference numerals will be used to designate components similar or equal to those of the exemplary embodiments of FIGS. 6 to 12, and detailed explanation thereof will be omitted.

Referring to FIG. 13, the size (area) of the optical opening area OPA required to be formed in each layer of the display panel 110 may be changed depending on the location of the pinhole array layer PHL. For example, when the range of the angle (θ) of the FOV for a reflective light ray is intended to remain the same, the width (2p1, 2p2, 2p3) (or the area) of the optical opening area (OPA1, OPA2, OPA3) required to be secured in an interface (hereinafter, referred to as "first interface") between the circuit element layer BPL and the light emitting element layer LDL based on the center of each pinhole PIH may be gradually increased as the distance (q1, q2, q3) from the pinhole array layer PHL to the first interface is increased. Here, first electrodes (e.g., respective anode electrodes of the pixels PXL) of the light emitting element layer LDL may be disposed in the first interface. Therefore, as the width (2p1, 2p2, 2p3) of the optical opening area (OPA1, OPA2, OPA3) is increased, the area of a region to be prevented from overlapping with the first electrodes may be increased. However, as the resolution of the display panel 110 is increased, the size of the pixel area PXA for forming each pixel PXL is reduced, whereby there may be limitations in design. Therefore, the closer the pinhole array layer PHL is disposed to the pixel circuit layer BPL, the smaller the width (2p1, 2p2, 2p3) of the optical opening area (OPA1, OPA2, OPA3) required to be secured in the first interface. Therefore, even in a high-resolution display device 100, the fingerprint sensor may be more easily formed. For example, in the case where the pinhole array layer PHL is disposed in the pixel circuit layer BPL, the width 2p1 of the optical opening area OPA1 required to be secured in the first interface may be optimized.

Therefore, in the present disclosure, the optical system of the fingerprint sensor may be formed by disposing at least one first light transmitting hole array layer LTHL1 in the pixel circuit layer BPL. In an exemplary embodiment, the first light transmitting hole array layer LTHL1 may be a pinhole array layer PHL. However, the present disclosure is not limited to the exemplary embodiment in which the first light transmitting hole array layer LTHL1 forms the pinhole array layer PHL. The first light transmitting hole array layer LTHL1 may form a light control layer BCL, as described in the previous embodiments.

In addition, in an exemplary embodiment of the present disclosure, the first light transmitting hole array layer LTHL1 may be integrally formed with at least one conductive layer of the circuit element layer BPL. For example, each first light transmitting hole LTH1 may include at least one opening formed in the at least one conductive layer, and may be integrally formed with the at least one opening. For example, the first light transmitting holes LTH1 may include a plurality of openings distributed in at least one conductive layer of the circuit element layer BPL, or may be formed by the openings.

In this case, the first light transmitting hole array layer LTHL1 may be formed in the circuit element layer BPL without forming a separate mask layer. Therefore, the thickness of the module including the photo-sensing type fingerprint sensor and the display device 100 including the fingerprint sensor may be reduced or minimized.

Figure 14:
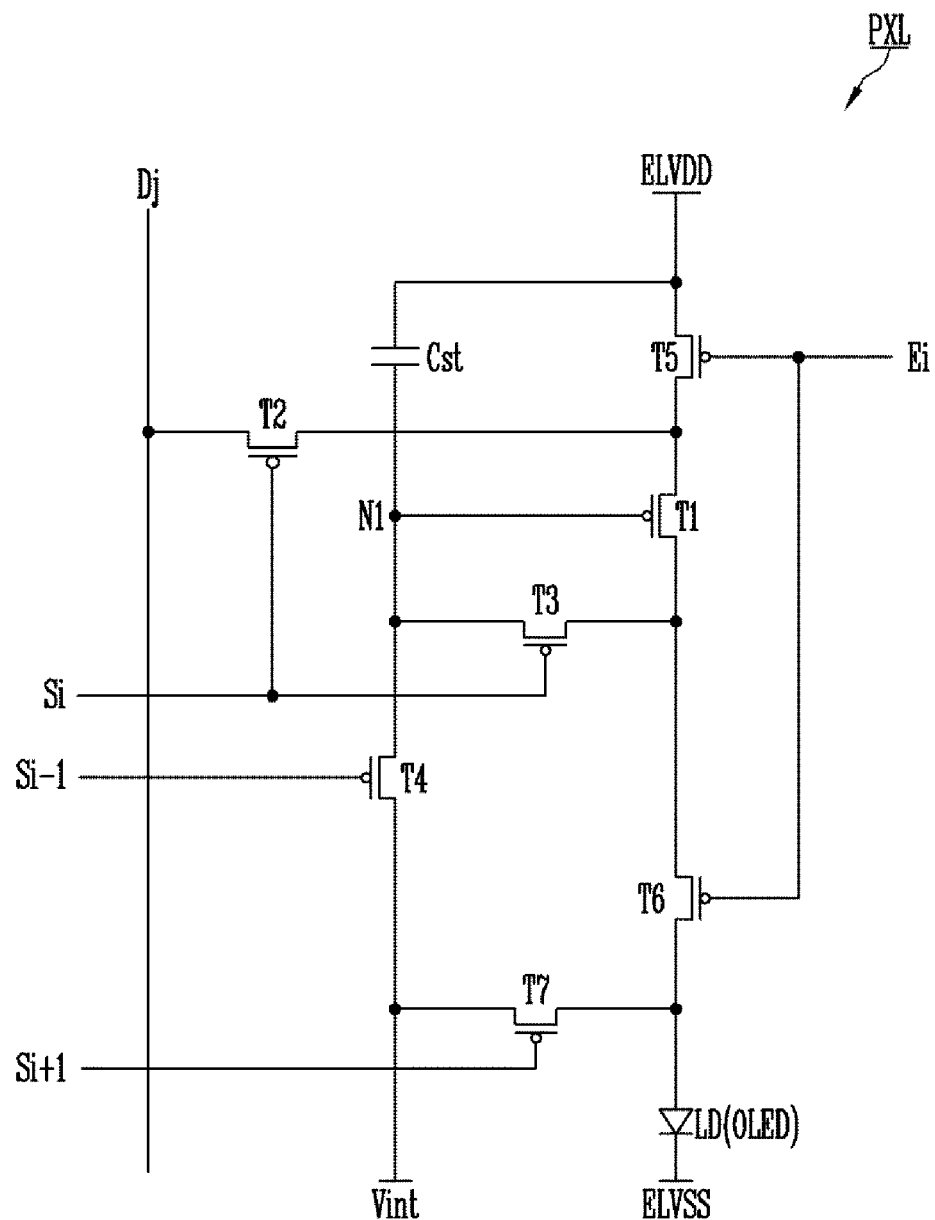
FIG. 14 is a circuit diagram illustrating a pixel in accordance with an exemplary embodiment of the present disclosure.

FIG. 14 is a circuit diagram illustrating a pixel PXL in accordance with an exemplary embodiment of the present disclosure. For the sake of explanation, FIG. 14 illustrates a pixel PXL coupled both to an i-th scan line Si disposed on an i-th horizontal pixel column and to an j-th data line Dj disposed on a j-th vertical pixel column.

Referring to FIG. 14, the pixel PXL in accordance with an exemplary embodiment of the present disclosure may include a light emitting element LD, first to seventh transistors T1 to T7, and a storage capacitor Cst. In an exemplary embodiment, the light emitting element LD may be an organic light-emitting diode (OLED), but the present disclosure is not limited thereto.

An anode electrode of the light emitting element LD may be coupled to the first transistor T1 via the sixth transistor T6, and a cathode electrode thereof may be coupled to a second power supply ELVSS. The light emitting element LD may emit light having a predetermined luminance corresponding to current supplied from the first transistor T1. The voltage of a first power supply ELVDD may be set to a value higher than the voltage of the second power supply ELVSS so as to allow current to flow to the light emitting element LD.

The seventh transistor T7 may be coupled between an initialization power supply Vint and a first electrode, e.g., the anode electrode, of the light emitting element LD. A gate electrode of the seventh transistor T7 may be coupled to an (i+1)th scan line Si+1. When a scan signal of a gate-on voltage (e.g., a low level voltage) is supplied to the (i+1)th scan line Si+1, the seventh transistor T7 is turned on so that the voltage of the initialization power supply Vint may be supplied to the anode electrode of the light emitting element LD. The voltage of the initialization power supply Vint may be set to a voltage lower than a data signal. In other words, the voltage of the initialization power supply Vint may be set to a minimum voltage of the data signal or less. Although in the present embodiment the case where an anode initialization control line coupled with the gate electrode of the seventh transistor T7 is the (i+1)th scan line Si+1 is described by way of example, the present disclosure is not limited thereto. For example, in an exemplary embodiment of the present disclosure, the gate electrode of the seventh transistor T7 may be coupled to the i-th scan line Si. In this case, when a scan signal of a gate-on voltage is supplied to the i-th scan line Si, the voltage of the initialization power supply Vint may be supplied to the anode electrode of the light emitting element LD via the seventh transistor T7.

The sixth transistor T6 is coupled between the first transistor T1 and the light emitting element LD. A gate electrode of the sixth transistor T6 may be coupled to an i-th emission control line Ei. The sixth transistor T6 may be turned off when an emission control signal (e.g., a high level voltage) of a gate-off voltage is supplied to the i-th emission control line Ei, and may be turned on in the other cases.

The fifth transistor T5 may be coupled between the first power supply ELVDD and the first transistor T1. A gate electrode of the fifth transistor T5 may be coupled to the i-th emission control line Ei. The fifth transistor T5 may be turned off when an emission control signal of a gate-off voltage is supplied to the i-th emission control line Ei, and may be turned on in the other cases.

A first electrode of the first transistor (T1; driving transistor) may be coupled to the first power supply ELVDD via the fifth transistor T5, and a second electrode thereof may be coupled to the anode electrode of the light emitting element LD via the sixth transistor T6. A gate electrode of the first transistor T1 may be coupled to a first node N1. The first transistor T1 may control, in response to a voltage of the first node N1, current flowing from the first power supply ELVDD to the second power supply ELVSS via the light emitting element LD.

The third transistor T3 may be coupled between a second electrode of the first transistor T1 and the first node N1. A gate electrode of the third transistor T3 may be coupled to the i-th scan line Si. When a scan signal of a gate-on voltage is supplied to the i-th scan line Si, the third transistor T3 may be turned on to electrically connect the second electrode of the first transistor T1 to the first node N1. Therefore, when the third transistor T3 is turned on, the first transistor T1 may be connected in the form of a diode.

The fourth transistor T4 may be coupled between the first node N1 and the initialization power supply Vint. A gate electrode of the fourth transistor T4 may be coupled to the (i−1)th scan line Si−1. When a scan signal is supplied to the (i−1)th scan line Si−1, the fourth transistor T4 is turned on so that the voltage of the initialization power supply Vint may be supplied to the first node N1. In the present embodiment, the (i−1)th scan line Si−1 may be used as an initialization control line to initialize a gate node, i.e., the first node N1, of the first transistor T1. However, the present disclosure is not limited thereto. For example, in an exemplary embodiment, other control lines, e.g., an (i−2)th scan line Si−2, may be used as the initialization control line to initialize the gate node of the first transistor T1.

The second transistor T2 may be coupled between the j-th data line Dj and the first electrode of the first transistor T1. A gate electrode of the second transistor T2 may be coupled to the i-th scan line Si. When a scan signal is supplied to the i-th scan line Si, the second transistor T2 may be turned on so that the first electrode of the first transistor T1 may be electrically coupled with the j-th data line Dj.

The storage capacitor Cst may be coupled between the first power supply ELVDD and the first node N1. The storage capacitor Cst may store a voltage corresponding both to a data signal and the threshold voltage of the first transistor T1.

The structure of the pixel PXL is not limited to the exemplary embodiment illustrated in FIG. 14. For example, various pixel circuits having known structures may be applied to the pixel PXL.

Figure 15:
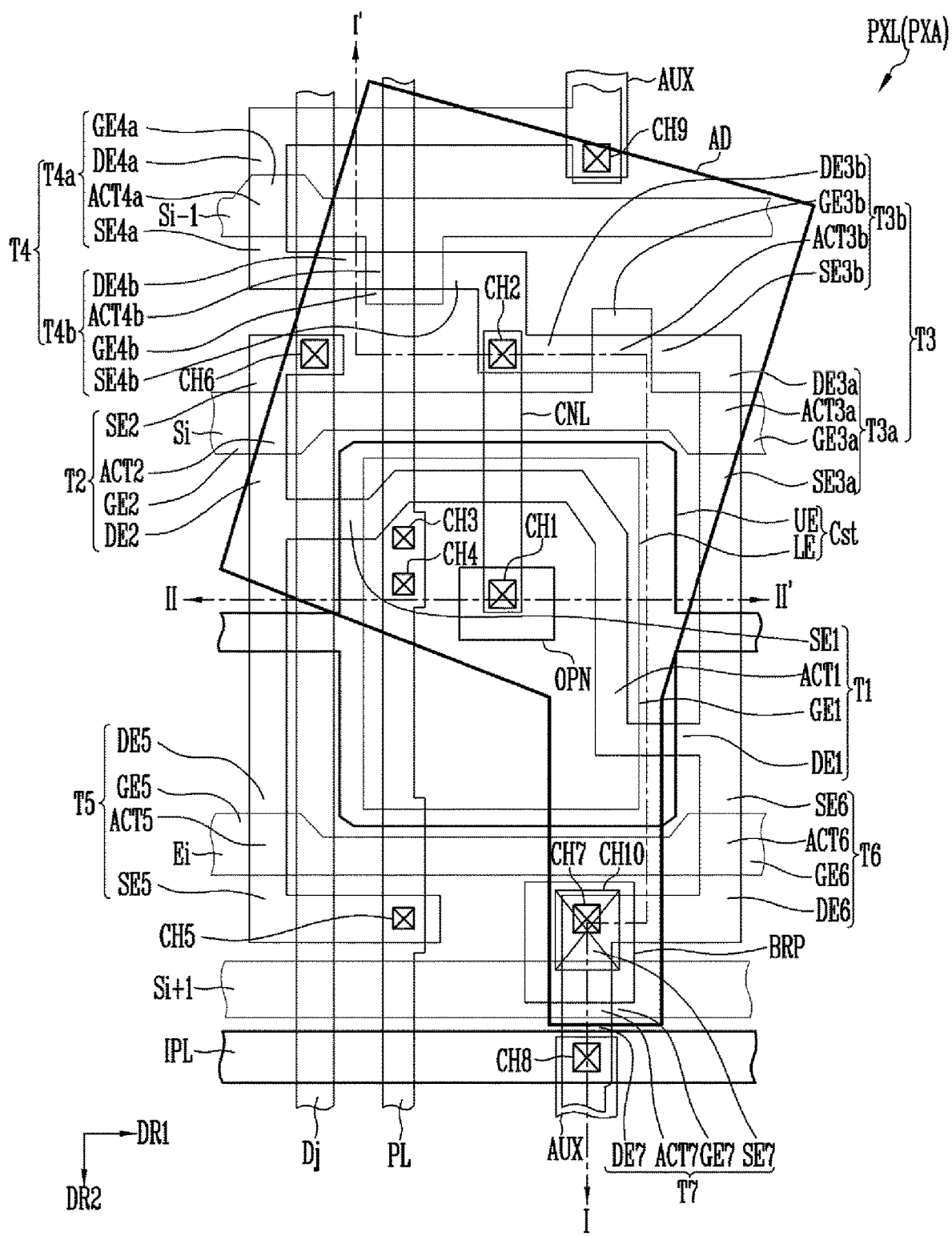
FIG. 15 is a plan view illustrating an exemplary embodiment of a layout of the pixel illustrated in FIG. 14.
Figure 16A:
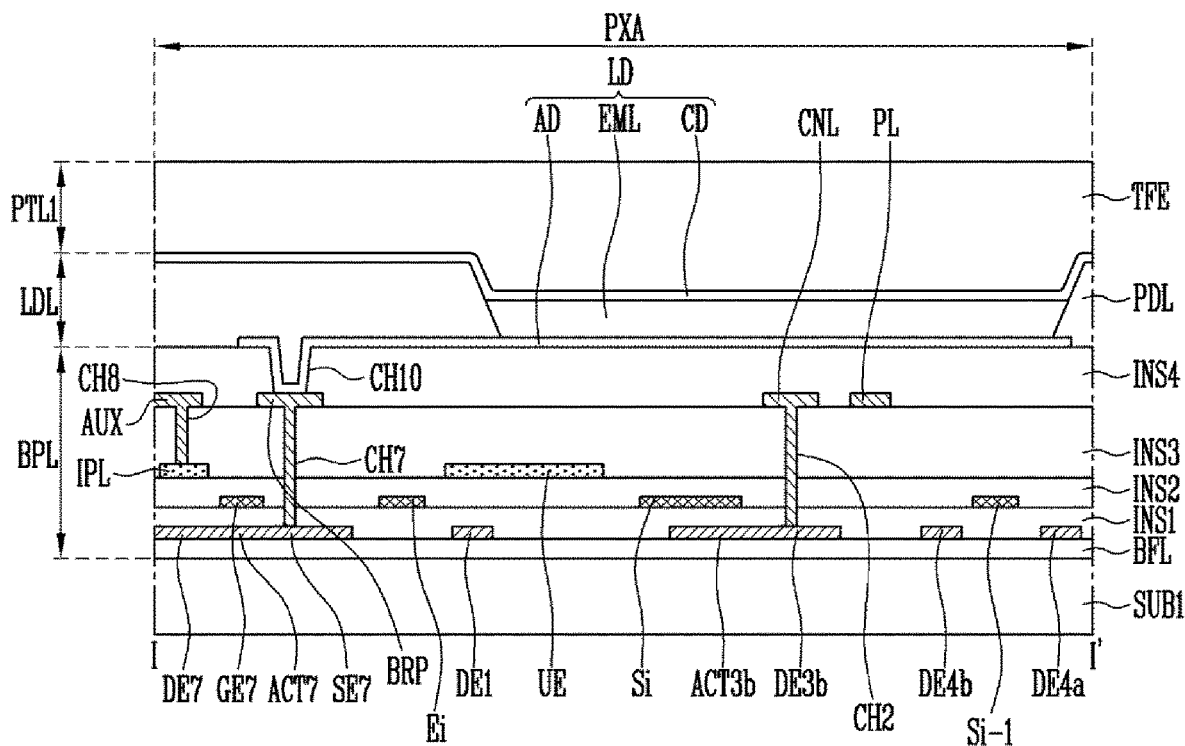
FIGS. 16A and 16B are sectional views respectively taken along sectional lines I-I' and II-II' of FIG. 15.
Figure 16B:
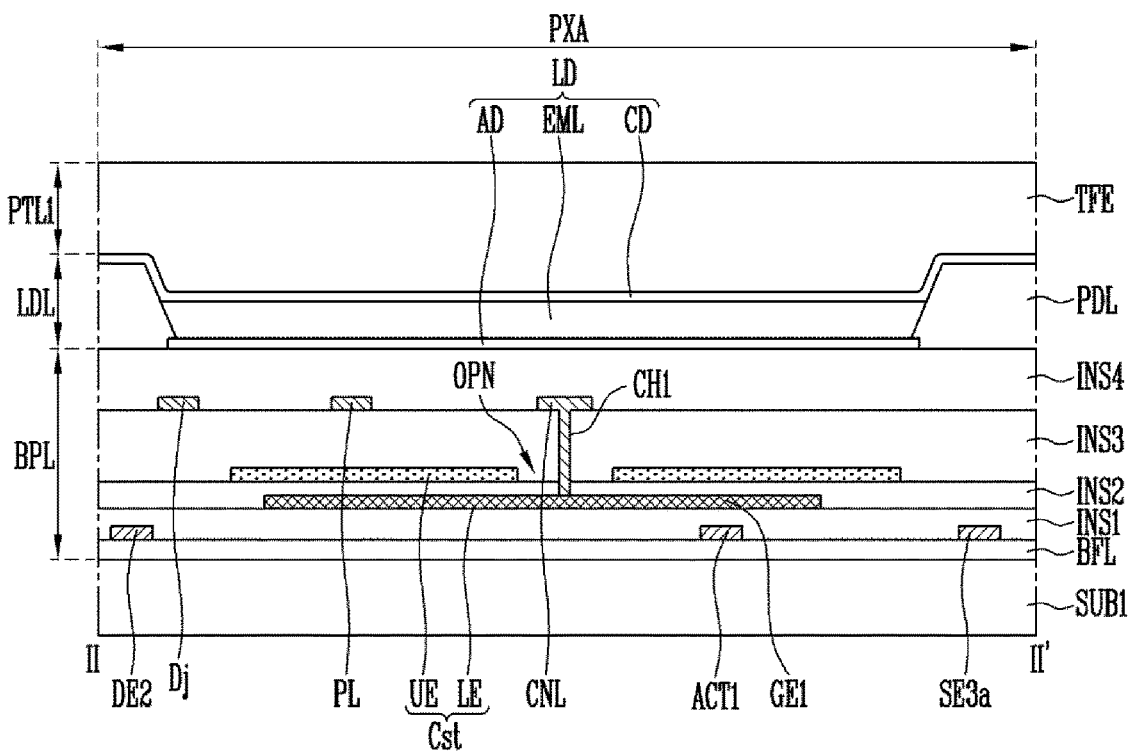

FIG. 15 is a plan view illustrating an exemplary embodiment of a layout of the pixel PXL illustrated in FIG. 14. In detail, FIG. 15 illustrates in detail an exemplary embodiment of a layout of any pixel PXL disposed in the display area DA of FIGS. 1 and 2, for example, illustrates an exemplary embodiment of the layout of the pixel PXL illustrated in FIG. 14. FIGS. 16A and 16B are sectional views respectively taken along sectional lines I-I' and II-II' of FIG. 15.

In the descriptions of the exemplary embodiment of FIGS. 15 to 16B, for the sake of explanation, a scan line on an (i−1)th row will be referred to as "(i−1)th scan line Si−1", a scan line on an i-th row will be referred to as "i-th scan line Si", a scan line on an (i+1)th row will be referred to as "(i+1)th scan line Si+1", an emission control line on the i-th row will be referred to as "emission control line Ei", a data line on a j-th column will be referred to as "data line Dj", and a power line on the j-th column, e.g., to which the first power supply ELVDD is applied, will be referred to as "power line PL".

Referring to FIGS. 15, 16A, and 16B along with FIGS. 1, 2, 3A, 3B, 3C, 3D, 3E, 4, 5A, 5B, 5C, 5D, 6, 7, 8A, 8B, 8C, 8D, 9, 10, 11, 12, 13, and 14, the display device 100 may include pixels PXL disposed in each pixel area PXA of the display area DA, and a line unit configured to supply driving signals and/or power to the pixels PXL. In an exemplary embodiment, the line unit may include scan lines Si−1, Si, and Si+1, a data line Dj, an emission control line Ei, a power line PL, and an initialization power line IPL.

The scan lines Si−1, Si and Si+1 may extend on the display area DA in a first direction DR1. In an exemplary embodiment, the scan lines Si−1, Si, and Si+1 may include the (i−1)th scan line Si−1, the i-th scan line Si, and the (i+1)th scan line Si+1 which are successively arranged in a second direction DR2 intersecting the first direction DR1. The scan lines Si−1, Si, and Si+1 may receive scan lines. For example, the (i−1)th scan line Si−1 may receive an (i−1)th scan signal, the i-th scan line Si may receive an i-th scan signal, and the (i+1)th scan line Si+1 may receive an (i+1)th scan signal.

The emission control line Ei may extend on the display area DA in the first direction DR1 parallel with the scan lines Si−1, Si, and Si+1. The emission control line Ei may receive an emission control signal.

The data line Dj may extend on the display area DA in the second direction DR2. In other words, the data line Dj may extend in a direction intersecting the control lines Si−1, Si, Si+1, and Ei including the scan lines Si−1, Si, Si+1 and the emission control line Ei. The data line Dj may receive a data signal.

The power line PL may extend on the display area DA in the second direction DR2, but the present disclosure is not limited thereto. The power line PL may be disposed at a position spaced apart from the data line Dj and receive the first power supply ELVDD.

The initialization power line IPL may extend on the display area DA in the first direction DR1, but the present disclosure is not limited thereto. The initialization power line IPL may receive the initialization power supply Vint.

In an exemplary embodiment, each pixel PXL may include first to seventh transistors T1 to T7, a storage capacitor Cst, and a light emitting element LD.

The first transistor T1 may include a first gate electrode GE1, a first active pattern ACT1, a first source electrode SE1, a first drain electrode DE1, and a connection line CNL.

In an exemplary embodiment, the first gate electrode GE1 may be disposed to overlap with the first active pattern ACT1 with at least one insulating layer, e.g., a first insulating layer INS1, interposed therebetween. The first gate electrode GE1 may be coupled with a third drain electrode (DE3; including DE3a and DE3b) of the third transistor T3 and a fourth source electrode (SE4; including SE4a and SE4b) of the fourth transistor T4.

In an exemplary embodiment, the connection line CNL may couple the first gate electrode GE1, the third drain electrode DE3, and the fourth source electrode SE4 to each other. A first end of the connection line CNL is coupled with the first gate electrode GE1 through a first contact hole CH1. A second end of the connection line CNL may be coupled with the third drain electrode DE3 and the fourth source electrode SE4 through a second contact hole CH2.

In an exemplary embodiment of the present disclosure, each of the first active pattern ACT1, the first source electrode SE1, and the first drain electrode DE1 may be formed of an undoped semiconductor pattern or a semiconductor pattern doped with an impurity. For example, each of the first source electrode SE1 and the first drain electrode DE1 may be formed of a semiconductor pattern doped with an impurity. The first active pattern ACT1 may be formed of an undoped semiconductor pattern.

In an exemplary embodiment, the first active pattern ACT1 may have a shape extending in a predetermined direction, and be bent several times along the longitudinal direction thereof. The first active pattern ACT1 may overlap with the first gate electrode GE1 in a plan view. Since the first active pattern ACT1 is relatively long, a channel area of the first transistor T1 may also be relatively long. Thus, a driving range of a gate voltage to be applied to the first transistor T1 may be increased. Consequently, the gray scale of light emitted from the light emitting element LD may be precisely controlled.

In an exemplary embodiment, the first source electrode SE1 may be coupled to a first end of the first active pattern ACT1. The first source electrode SE1 may be coupled with a second drain electrode DE2 of the second transistor T2 and a fifth drain electrode DE5 of the fifth transistor T5. In an exemplary embodiment, the first drain electrode DE1 may be coupled to a second end of the first active pattern ACT1. The first drain electrode DE1 may be coupled with a third source electrode SE3 of the third transistor T3 and a sixth source electrode SE6 of the sixth transistor T6.

The second transistor T2 may include a second gate electrode GE2, a second active pattern ACT2, a second source electrode SE2, and a second drain electrode DE2.

In an exemplary embodiment, the second gate electrode GE2 may be disposed to overlap with the second active pattern ACT2 with at least one insulating layer, e.g., the first insulating layer INS1, interposed therebetween. The second gate electrode GE2 may be coupled to the i-th scan line Si. For example, the second gate electrode GE2 may be provided as a part of the i-th scan line Si or formed to have a shape protruding from the i-th scan line Si.

In an exemplary embodiment, each of the second active pattern ACT2, the second source electrode SE2, and the second drain electrode DE2 may be formed of an undoped semiconductor pattern or a semiconductor pattern doped with an impurity. For example, each of the second source electrode SE2 and the second drain electrode DE2 may be formed of a semiconductor pattern doped with an impurity. The second active pattern ACT2 may be formed of an undoped semiconductor pattern. The second active pattern ACT2 may correspond to a portion of the second transistor T2 that overlaps with the second gate electrode GE2.

In an exemplary embodiment, a first end of the second source electrode SE2 may be coupled to the second active pattern ACT2. A second end of the second source electrode SE2 may be coupled to the data line Dj through a sixth contact hole CH6. In an exemplary embodiment, a first end of the second drain electrode DE2 may be coupled with the second active pattern ACT2. A second end of the second drain electrode DE2 may be coupled with the first source electrode SE1 of the first transistor T1 and the fifth drain electrode DE5 of the fifth transistor T5.

The third transistor T3 may have a double gate structure to prevent current leakage. In other words, the third transistor T3 may include a 3a transistor T3a, and a 3b transistor T3b. The 3a transistor T3a may include a 3a gate electrode GE3a, a 3a active pattern ACT3a, a 3a source electrode SE3a, and a 3a drain electrode DE3a. The 3b transistor T3b may include a 3b gate electrode GE3b, a 3b active pattern ACT3b, a 3b source electrode SE3b, and a 3b drain electrode DE3b. As used below, the 3a gate electrode GE3a and the 3b gate electrode GE3b will be referred to as "third gate electrode GE3". The 3a active pattern ACT3a and the 3b active pattern ACT3b will be referred to as "third active pattern ACT3". The 3a source electrode SE3a and the 3b source electrode SE3b will be referred to as "third source electrode SE3". The 3a drain electrode DE3a and the 3b drain electrode DE3b will be referred to as "third drain electrode DE3".

In an exemplary embodiment, the third gate electrode GE3 may be disposed to overlap with the third active pattern ACT3 with at least one insulating layer, e.g., the first insulating layer INS1, interposed therebetween. The third gate electrode GE3 may be coupled to the i-th scan line Si. For example, the third gate electrode GE3 may be provided as a part of the i-th scan line Si or formed to have a shape protruding from the i-th scan line Si. For instance, the 3a gate electrode GE3a may have a shape protruding form the i-th scan line Si, and the 3b gate electrode GE3b may be formed as a part of the i-th scan line Si.

In an exemplary embodiment, each of the third active pattern ACT3, the third source electrode SE3, and the third drain electrode DE3 may be formed of an undoped semiconductor pattern or a semiconductor pattern doped with an impurity. For example, each of the third source electrode SE3 and the third drain electrode DE3 may be formed of a semiconductor pattern doped with an impurity. The third active pattern ACT3 may be formed of an undoped semiconductor pattern. The third active pattern ACT3 may correspond to a portion of the third transistor T3 that overlaps with the third gate electrode GE3.

In an exemplary embodiment, a first end of the third source electrode SE3 may be coupled with the third active pattern ACT3. A second end of the third source electrode SE3 may be coupled with the first drain electrode DE1 of the first transistor T1 and the sixth source electrode SE6 of the sixth transistor T6. In an exemplary embodiment, a first end of the third drain electrode DE3 may be coupled to the third active pattern ACT3. A second end of the third drain electrode DE3 may be coupled to the fourth source electrode SE4 of the fourth transistor T4. The third drain electrode DE3 may be coupled to the first gate electrode GE1 of the first transistor T1 through the connection line CNL, the second contact hole CH2 and the first contact hole CH1.

The fourth transistor T4 may have a double gate structure to prevent current leakage. In other words, the fourth transistor T4 may include a 4a transistor T4a and a 4b transistor T4b. The 4a transistor T4a may include a 4a gate electrode GE4a, a 4a active pattern ACT4a, a 4a source electrode SE4a, and a 4a drain electrode DE4a. The 4b transistor T4b may include a 4b gate electrode GE4b, a 4b active pattern ACT4b, a 4b source electrode SE4b, and a 4b drain electrode DE4b. As used below, the 4a gate electrode GE4a and the 4b gate electrode GE4b will be referred to as "fourth gate electrode GE4". The 4a active pattern ACT4a and the 4b active pattern ACT4b will be referred to as "fourth active pattern ACT4". The 4a source electrode SE4a and the 4b source electrode SE4b will be referred to as "fourth source electrode SE4". The 4a drain electrode DE4a and the 4b drain electrode DE4b will be referred to as "fourth drain electrode DE4".

In an exemplary embodiment, the fourth gate electrode GE4 may be disposed to overlap with the fourth active pattern ACT4 with at least one insulating layer, e.g., the first insulating layer INS1, interposed therebetween. The fourth gate electrode GE4 may be coupled the i-th scan line Si-1. For example, the fourth gate electrode GE4 may be provided as a part of the (i-1)th scan line Si-1 or formed to have a shape protruding from the (i-1)th scan line Si-1. For example, the 4a gate electrode GE4a may be provided as a part of the (i-1)th scan line Si-1. The 4b gate electrode GE4b may have a shape protruding from the (i-1)th scan line Si-1.

In an exemplary embodiment, each of the fourth active pattern ACT4, the fourth source electrode SE4, and the fourth drain electrode DE4 may be formed of an undoped semiconductor pattern or a semiconductor pattern doped with an impurity. For example, each of the fourth source electrode SE4 and the fourth drain electrode DE4 may be formed of a semiconductor pattern doped with an impurity. The fourth active pattern ACT4 may be formed of an undoped semiconductor pattern. The fourth active pattern ACT4 may correspond to a portion of the fourth transistor T4 that overlaps with the fourth gate electrode GE4.

In an exemplary embodiment, a first end of the fourth source electrode SE4 may be coupled to the fourth active pattern ACT4. A second end of the fourth source electrode SE4 may be coupled to the third drain electrode DE3 of the third transistor T3. In an exemplary embodiment, a first end of the fourth drain electrode DE4 may be coupled to the fourth active pattern ACT4. A second end of the fourth drain electrode DE4 may be coupled both to the initialization power line IPL of the pixel PXL on the (i-1)th row and to a seventh drain electrode DE7 of the seventh transistor T7 of the pixel PXL on the (i-1)th row.

The fourth source electrode SE4 may be coupled to the first gate electrode GE1 of the first transistor T1 through the connection line CNL, the second contact hole CH2, and the first contact hole CH1. An auxiliary connection line AUX may be provided between the fourth drain electrode DE4 and the initialization power line IPL. A first end of the auxiliary connection line AUX may be coupled with the fourth drain electrode DE4 through a ninth contact hole CH9. A second end of the auxiliary connection line AUX may be coupled to the initialization power line IPL on the (i-1)th row through an eighth contact hole CH8 of the pixel PXL on the (i-1)th row.

The fifth transistor T5 may include a fifth gate electrode GE5, a fifth active pattern ACT5, a fifth source electrode SE5, and a fifth drain electrode DE5.

In an exemplary embodiment, the fifth gate electrode GE5 may be disposed to overlap with the fifth active pattern ACT5 with at least one insulating layer, e.g., the first insulating layer INS1, interposed therebetween. The fifth gate electrode GE5 may be coupled to the emission control line Ei. The fifth gate electrode GE5 may be provided as a part of the emission control line Ei, or formed to have a shape protruding from the emission control line Ei.

In an exemplary embodiment, each of the fifth active pattern ACT5, the fifth source electrode SE5, and the fifth drain electrode DE5 may be formed of an undoped semiconductor pattern or a semiconductor pattern doped with an impurity. For example, each of the fifth source electrode SE5 and the fifth drain electrode DE5 may be formed of a semiconductor pattern doped with an impurity. The fifth active pattern ACT5 may be formed of an undoped semiconductor pattern. The fifth active pattern ACT5 may correspond to a portion of the fifth transistor T5 that overlaps with the fifth gate electrode GE5.

In an exemplary embodiment, a first end of the fifth source electrode SE5 may be coupled to the fifth active pattern ACT5. A second end of the fifth source electrode SE5 may be coupled to the power line PL through a fifth contact hole CH5. In an exemplary embodiment, a first end of the fifth drain electrode DE5 may be coupled with the fifth active pattern ACT5. A second end of the fifth drain electrode DE5 may be coupled with the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

In an exemplary embodiment, the sixth gate electrode GE6 may be disposed to overlap with the sixth active pattern ACT6 with at least one insulating layer, e.g., the first insulating layer INS1, interposed therebetween. The sixth gate electrode GE6 may be coupled to the emission control line Ei. For example, the sixth gate electrode GE6 may be provided as a part of the emission control line Ei, or formed to have a shape protruding from the emission control line Ei.

In an exemplary embodiment, each of the sixth active pattern ACT6, the sixth source electrode SE6, and the sixth drain electrode DE6 may be formed of an undoped semiconductor pattern or a semiconductor pattern doped with an impurity. For example, each of the sixth source electrode SE6 and the sixth drain electrode DE6 may be formed of a semiconductor pattern doped with an impurity. The sixth active pattern ACT6 may be formed of an undoped semiconductor pattern. The sixth active pattern ACT6 may correspond to a portion of the sixth transistor T6 that overlaps with the sixth gate electrode GE6.

In an exemplary embodiment, a first end of the sixth source electrode SE6 may be coupled with the sixth active pattern ACT6. A second end of the sixth source electrode SE6 may be coupled with the first drain electrode DE1 of the first transistor T1 and the third source electrode SE3 of the third transistor T3. In an exemplary embodiment, a first end of the sixth drain electrode DE6 may be coupled to the sixth active pattern ACT6. A second end of the sixth drain electrode DE6 may be coupled to a seventh source electrode SE7 of the seventh transistor T7.

The seventh transistor T7 may include a seventh gate electrode GE7, a seventh active pattern ACT7, the seventh source electrode SE7, and the seventh drain electrode DE7.

In an exemplary embodiment, the seventh gate electrode GE7 may be disposed to overlap with the seventh active pattern ACT7 with at least one insulating layer, e.g., the first insulating layer INS1, interposed therebetween. The seventh gate electrode GE7 may be coupled to the (i+1)th scan line Si+1. For example, the seventh gate electrode GE7 may be provided as a part of the (i+1)th scan line Si+1 or formed to have a shape protruding from the (i+1)th scan line Si+1.

In an exemplary embodiment, each of the seventh active pattern ACT7, the seventh source electrode SE7, and the seventh drain electrode DE7 may be formed of an undoped semiconductor pattern or a semiconductor pattern doped with an impurity. For example, each of the seventh source electrode SE7 and the seventh drain electrode DE7 may be formed of a semiconductor pattern doped with an impurity. The seventh active pattern ACT7 may be formed of an undoped semiconductor pattern. The seventh active pattern ACT7 may correspond to a portion of the seventh transistor T7 that overlaps with the seventh gate electrode GE7.

In an exemplary embodiment, a first end of the seventh source electrode SE7 may be coupled to the seventh active pattern ACT7. A second end of the seventh source electrode SE7 may be coupled to the sixth drain electrode DE6 of the sixth transistor T6. In an exemplary embodiment, a first end of the seventh drain electrode DE7 may be coupled to the seventh active pattern ACT7. A second end of the seventh drain electrode DE7 may be coupled to the initialization power line IPL.

The storage capacitor Cst may include a first capacitor electrode LE and a second capacitor electrode UE. In an exemplary embodiment, the first capacitor electrode LE may be a lower electrode of the storage capacitor Cst, and be integrally formed with the first gate electrode GE1 of the first transistor T1. In an exemplary embodiment, the second capacitor electrode UE may be an upper electrode of the storage capacitor Cst, and overlap with the first gate electrode GE1. In a plan view, the second capacitor electrode UE may cover at least a portion of the first capacitor electrode LE. The capacitance of the storage capacitor Cst may be increased by increasing the area of the overlapping portion between the first capacitor electrode LE and the second capacitor electrode UE.

In an exemplary embodiment, the second capacitor electrode UE may extend in the first direction DR1. In an exemplary embodiment of the present disclosure, a voltage having the same level as that of the first power supply ELVDD may be applied to the second capacitor electrode UE. The second capacitor electrode UE may have an opening OPN in a region having the first contact hole CH1 through which the first gate electrode GE1 makes contact with the connection line CNL.

The light emitting element LD may include a first electrode (e.g., an anode electrode) AD, a second electrode (e.g., a cathode electrode) CD, and an emission layer EML provided between the first electrode AD and the second electrode CD. In an exemplary embodiment, the first electrode AD and the second electrode CD may be disposed to overlap with each other in an emission area defined in each pixel area PXA of the light emitting element layer LDL. The emission layer EML may be disposed in the emission area. In other words, the emission area of each pixel PXL may be an area in which the first electrode AD, the emission layer EML, and the second electrode CD of the light emitting element LD overlap with each other.

The first electrode AD may be provided in a predetermined emission area of the pixel area PXA corresponding to each pixel PXL. The first electrode AD may be coupled to the seventh source electrode SE7 of the seventh transistor T7 and the sixth drain electrode DE6 of the sixth transistor T6 through a seventh contact hole CH7 and a tenth contact hole CH10. A bridge pattern BRP may be provided between the seventh contact hole CH7 and the tenth contact hole CH10. The bridge pattern BRP may couple the sixth drain electrode DE6, the seventh source electrode SE7, and the first electrode AD to each other.

Hereinafter, a stacked structure (cross-sectional structure) of the pixel PXL and the display area DA including the pixel PXL in accordance with an exemplary embodiment of the present disclosure will be described.

A semiconductor layer may be disposed on the first surface of the first substrate SUB1. In an exemplary embodiment, a buffer layer BFL may be provided between the first substrate SUB1 and the semiconductor layer.

In an exemplary embodiment, the active patterns ACT1 to ACT7 (hereinafter, referred to as "ACT") may be provided in the semiconductor layer. In an exemplary embodiment, the active patterns ACT may include the first to seventh active patterns ACT1 to ACT7. The first to seventh active patterns ACT1 to ACT7 may be formed of a semiconductor material.

The first insulating layer INS1 may be provided on the first substrate SUB1 provided with the first to seventh active patterns ACT1 to ACT7. In an exemplary embodiment, the first insulating layer INS1 may be a gate insulating layer interposed between the active patterns ACT1 to ACT7 and the gate electrodes GE1 to GE7 of the transistors T1 to T7 provided in the pixels PXL. In an exemplary embodiment, the first insulating layer INS1 may include at least one inorganic layer and/or organic layer. For example, the first insulating layer INS1 may be formed of an inorganic layer including SiOx or SiNx, but the present disclosure is not limited thereto. For example, the first insulating layer INS1 may include an inorganic insulating material or organic insulating material such as SiOx, SiNx, SiON, SiOF, or AlOx, and may have a single- or multi-layer structure including at least one of the foregoing materials.

In an exemplary embodiment of the present disclosure, the first insulating layer INS1 may have a thickness limited within a predetermined range to allow the transistors T1 to T7 to be easily driven. For example, the first insulating layer INS1 may have a thickness ranging from 1000 Å to 1500 Å, for example, a thickness of approximately 1200 Å, but the thickness of the first insulating layer INS1 is not limited thereto.

A first conductive layer may be disposed over the first insulating layer INS1. In an exemplary embodiment, the first conductive layer may be a first gate layer. The control lines Si−1, Si, Si+1, and Ei and the gate electrodes GE1 to GE7 may be provided in the first conductive layer. In an exemplary embodiment, an electrode, e.g., the first capacitor electrode LE, of the storage capacitor Cst may be provided in the first conductive layer. In detail, the (i−1)th scan line Si−1, the i-th scan line Si, the (i+1)th scan line Si+1, the emission control line Ei, and the first to seventh gate electrodes GE1 to GE7 may be provided in the first conductive layer over the first insulating layer INS1. In an exemplary embodiment, the first gate electrode GE1 may also be used as the first capacitor electrode LE of the storage capacitor Cst. In other words, in an exemplary embodiment, the first gate electrode GE1 and the first capacitor electrode LE may be integrally formed with each other. In an exemplary embodiment, the second gate electrode GE2 and the third gate electrode GE3 may be integrally formed with the i-th scan line Si. In an exemplary embodiment, the fourth gate electrode GE4 may be integrally formed with the (i−1)th scan line Si−1. In an exemplary embodiment, the fifth gate electrode GE5 and the sixth gate electrode GE6 may be integrally formed with the emission control line Ei. In an exemplary embodiment, the seventh gate electrode GE7 may be integrally formed with the (i+1)th scan line Si+1.

In an exemplary embodiment, the control lines Si−1, Si, Si+1, and Ei, the gate electrodes GE1 to GE7, and/or the lower electrode LE of the storage capacitor Cst that are disposed in the first conductive layer may be formed of the same material. For example, the control lines Si−1, Si, Si+1, and Ei, the gate electrodes GE1 to GE7, and/or the lower electrode LE of the storage capacitor Cst may be formed of a predetermined first gate metal.

In an exemplary embodiment, Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, Pb, etc. are representative examples of a material capable of forming the first gate metal. Besides, various other metals may be used. MoTi, ALNiLa, etc. are representative examples of an alloy capable of forming the first gate metal. Besides, various other alloys may be used. Ti/Cu, Ti/Au, Mo/Al/Mo, ITO/Ag/ITO, TiN/Ti/Al/Ti, TiN/Ti/Cu/Ti, etc. are representative examples of a conductive material having a multi-layer structure capable of forming the first gate metal. Besides, various other conductive materials having a multi-layer structure may be used.

The constituent material of the control lines Si−1, Si, Si+1, and Ei, the gate electrodes GE1 to GE7, and/or the first capacitor electrode LE that are disposed in the first conductive layer is not limited to metal. In other words, any material may be used as the constituent material of the control lines Si−1, Si, Si+1, and Ei, the gate electrodes GE1 to GE7, and/or the first capacitor electrode LE, so long as the material can provide conductivity enough to smoothly drive the pixels PXL.

For example, the control lines Si−1, Si, Si+1, and Ei, the gate electrodes GE1 to GE7, and/or the first capacitor electrode LE may be formed of a conductive polymer or conductive metal oxide. Examples of the conductive polymer capable of forming the control lines Si−1, Si, Si+1, and Ei, the gate electrodes GE1 to GE7, and/or the first capacitor electrode LE may include a polythiophene-based compound, a polypyrrole-based compound, a polyaniline-based compound, a polyacetylene-based compound, a polyphenylene-based compound, and mixtures thereof. Particularly, among polythiophene-based compounds, a PEDOT/PSS compound may be used. Examples of the conductive metal oxide capable of forming the control lines Si−1, Si, Si+1, and Ei, the gate electrodes GE1 to GE7, and/or the first capacitor electrode LE may include ITO, IZO, AZO, ITZO, ZnO, $SnO_2$, etc.

A second insulating layer INS2 may be provided on the first conductive layer. In an exemplary embodiment, the second insulating layer INS2 may be a first interlayer insulating layer which is interposed between the first capacitor electrode LE and the second capacitor electrode UE. In an exemplary embodiment, the second insulating layer INS2 may have a thickness limited within a predetermined range to secure a sufficient capacity of the storage capacitor Cst in a limited area. In an exemplary embodiment, the second insulating layer INS2 may have a thickness similar to that of the first insulating layer INS1. For example, the second insulating layer INS2 may have a thickness ranging from 1000 Å to 1500 Å, for example, a thickness of approximately 1400 Å, but the thickness of the second insulating layer INS2 is not limited thereto.

In an exemplary embodiment, the second insulating layer INS2 may include at least one inorganic layer and/or organic layer. For example, the second insulating layer INS2 may be formed of an inorganic layer including SiOx or SiNx, but the present disclosure is not limited thereto. For example, the second insulating layer INS2 may include an inorganic insulating material or organic insulating material such as SiOx, SiNx, SiON, SiOF, or AlOx, and may have a single- or multi-layer structure including at least one of the foregoing materials.

A second conductive layer may be disposed on the second insulating layer INS2. In an exemplary embodiment, the second conductive layer may be a second gate layer.

In an exemplary embodiment, the second capacitor electrode UE and the initialization power line IPL may be provided in the second conductive layer. In an exemplary embodiment, the second capacitor electrode UE may cover the first capacitor electrode LE. The second capacitor electrode UE may overlap with the first capacitor electrode LE with the second insulating layer INS2 interposed therebetween, thus forming the storage capacitor Cst along with the first capacitor electrode LE.

In an exemplary embodiment, the second capacitor electrode UE and the initialization power line IPL that are disposed in the second conductive layer may be formed of the same material. For example, the second capacitor electrode UE and the initialization power line IPL may be formed of a predetermined second gate metal. In an exemplary embodiment, the second gate metal may be any one of the metal materials proposed as examples of the first gate metal, but the present disclosure is not limited thereto. Furthermore, the constituent material of the second capacitor electrode UE and the initialization power line IPL that are disposed in the second conductive layer is not limited to metal. In other words, any material may be used as the constituent material of the second capacitor electrode UE and the initialization power line IPL so long as the material can provide conductivity enough to smoothly drive the pixels PXL. For instance, the second capacitor electrode UE and the initialization power line IPL that are disposed in the second conductive layer may be formed of a conductive polymer or conductive metal oxide.

A third insulating layer INS3 may be provided on the second conductive layer. In an exemplary embodiment, the third insulating layer INS3 may be a second interlayer insulating layer. In an exemplary embodiment, the third insulating layer INS3 may have a thickness greater than that of the first insulating layer INS1 or the second insulating layer INS2. For example, the thickness of the third insulating layer INS3 may be equal to or greater than the sum of the thickness of the first insulating layer INS1 and the thickness of the second insulating layer INS2. For example, the third insulating layer INS3 may have a thickness of approximately 5000 Å, but the thickness of the third insulating layer INS3 is not limited thereto. As such, if the third insulating layer INS3 has a sufficient thickness greater than the sum of the thicknesses of the first and second insulating layers INS1 and INS2, electrical stability between components disposed over and below the third insulating layer INS3 may be secured. Consequently, a short circuit may be effectively prevented from occurring.

In an exemplary embodiment, the third insulating layer INS3 may include at least one inorganic layer and/or organic layer. For example, the third insulating layer INS3 may be formed of an inorganic layer including SiOx or SiNx, but the present disclosure is not limited thereto. For example, the third insulating layer INS3 may include an inorganic insulating material or organic insulating material such as SiOx, SiNx, SiON, SiOF, or AlOx, and may have a single- or multi-layer structure including at least one of the foregoing materials.

A third conductive layer may be disposed on the third insulating layer INS3. In an exemplary embodiment, the third conductive layer may be a source-drain layer.

In an exemplary embodiment, the data line Dj, the power line PL, the connection line CNL, the auxiliary connection line AUX, and the bridge pattern BRP may be provided in the third conductive layer.

In an exemplary embodiment, the data line Dj may be coupled to the second source electrode SE2 through the sixth contact hole CH6 passing through the first insulating layer INS1, the second insulating layer INS2, and the third insulating layer INS3.

In an exemplary embodiment, the power line PL may be coupled to the upper electrode UE of the storage capacitor Cst through third and fourth contact holes CH3 and CH4 passing through a third insulating layer INS3. Furthermore, the power line PL may be coupled to the fifth source electrode SE5 through the fifth contact hole CH5 passing through the first insulating layer INS1, the second insulating layer INS2, and the third insulating layer INS3.

In an exemplary embodiment, the connection line CNL may be coupled to the first gate electrode GE1 through the first contact hole CH1 passing through the second insulating layer INS2 and the third insulating layer INS3. Furthermore, the connection line CNL may be coupled to the third drain electrode DE3 and the fourth source electrode SE4 through the second contact hole CH2 passing through the first insulating layer INS1, the second insulating layer INS2, and the third insulating layer INS3.

In an exemplary embodiment, the auxiliary connection line AUX may be coupled to the initialization power line IPL through the eighth contact hole CH8 passing through the third insulating layer INS3. Furthermore, the auxiliary connection line AUX may be coupled to the seventh drain electrode DE7 through the ninth contact hole CH9 passing through the first insulating layer INS1, the second insulating layer INS2, and the third insulating layer INS3.

In an exemplary embodiment, the bridge pattern BRP may be disposed between the sixth drain electrode DE6 and the first electrode AD and provided as a medium coupling the sixth drain electrode DE6 and the first electrode AD with each other. The bridge pattern BRP may be coupled to the sixth drain electrode DE6 and the seventh source electrode SE7 through the seventh contact hole CH7 passing through the first insulating layer INS1, the second insulating layer INS2, and the third insulating layer INS3.

In an exemplary embodiment, the data line Dj, the power line PL, the connection line CNL, the auxiliary connection line AUX, and the bridge pattern BRP that are provided in the third conductive layer may be formed of the same material. For example, the data line Dj, the power line PL, the connection line CNL, the auxiliary connection line AUX, and/or the bridge pattern BRP may be formed of predetermined source drain metal.

In an exemplary embodiment, the source drain metal may be any one of the metal materials proposed as examples of the first and/or second gate metal, but the present disclosure is not limited thereto. Furthermore, the constituent material of the data line Dj, the power line PL, the connection line CNL, the auxiliary connection line AUX, and/or the bridge pattern BRP that is provided in the third conductive layer is not limited to metal. In other words, any material may be used as the constituent material of the data line Dj, the power line PL, the connection line CNL, the auxiliary connection line AUX, and/or the bridge pattern BRP so long as the material can provide conductivity enough to smoothly drive the pixels PXL. For example, the data line Dj, the power line PL, the connection line CNL, the auxiliary connection line AUX, and/or the bridge pattern BRP may be formed of a conductive polymer or conductive metal oxide.

In an exemplary embodiment, at least two of the first gate metal, the second gate metal, and the source drain metal may be formed of the same material. For example, although the first gate metal and the second gate metal are disposed on respective different layers, the first and second gate metals may be formed of the same material. However, the present disclosure is not limited thereto. For example, in an exemplary embodiment, the first gate metal, the second gate metal, and the source drain metal may be formed of different materials.

A fourth insulating layer INS4 may be provided on the third conductive layer. In an exemplary embodiment, the fourth insulating layer INS4 may include a passivation layer and/or a planarization layer.

The light emitting element LD may be provided on the fourth insulating layer INS4. The light emitting element LD may include the first electrode AD, the second electrode CD, and the emission layer EML provided between the first electrode AD and the second electrode CD.

In an exemplary embodiment, the first electrode AD may be provided on the fourth insulating layer INS4. The first electrode AD may be coupled to the bridge pattern BRP through the tenth contact hole CH10 passing through the fourth insulating layer INS4. Since the bridge pattern BRP is coupled to the sixth drain electrode DE6 and the seventh source electrode SE7 through the seventh contact hole CH7, the first electrode AD may be ultimately coupled to the sixth drain electrode DE6 and the seventh source electrode SE7.

In an exemplary embodiment, a pixel define layer (or a bank layer) PDL for defining an emission area of each pixel PXL may be provided on the first substrate SUB1 on which the first electrode AD, etc. have been formed. The pixel define layer PDL may expose an upper surface of the first electrode AD and protrude from the first substrate SUB1 along the perimeter of each pixel PXL.

The emission layer EML may be provided in the emission area of each pixel PXL enclosed by the pixel define layer PDL. The second electrode CD may be provided on the emission layer EML. In an exemplary embodiment, a thin film encapsulation layer TFE may be provided on the second electrode CD to cover the second electrode CD. In an exemplary embodiment, the thin film encapsulation layer TFE may be replaced with another type of encapsulation layer, an encapsulation substrate, at least one passivation layer, or the like.

In an exemplary embodiment, one of the first electrode AD and the second electrode CD may be an anode electrode, and the other one may be a cathode electrode. For example, the first electrode AD may be an anode electrode, and the second electrode CD may be a cathode electrode.

At least one of the first electrode AD and the second electrode CD may be a transmissive electrode. For example, in the case where the light emitting element LD is a bottom emission type organic light-emitting display element, the first electrode AD may be a transmissive electrode, and the second electrode CD may be a reflective electrode. In the case where the light emitting element LD is a top emission type organic light-emitting display element, the first electrode may be a reflective electrode, and the second electrode may be a transmissive electrode. In the case where the light emitting element LD is a double-side emission type organic light-emitting display element, both the first electrode AD and the second electrode CD may be transmissive electrodes. In the present embodiment, there is illustrated an example in which the light emitting element LD is a top emission type organic light emitting display element, and the first electrode AD is an anode electrode. Furthermore, in the present embodiment, although the light emitting element LD is used as a light source, the present disclosure is not limited thereto. For example, the light emitting element LD may be replaced with another type of light emitting element.

In an exemplary embodiment, the first electrode AD may include a reflective layer (not illustrated) which may reflect light, and a transparent conductive layer (not illustrated) which is disposed on or under the reflective layer. At least one of the transparent conductive layer and the reflective layer may be coupled to the sixth drain electrode DE6 and the seventh source electrode SE7.

In an exemplary embodiment, the reflective layer may include material that is able to reflect light. For example, the reflective layer may include at least one of aluminum (Al), silver (Ag), chrome (Cr), molybdenum (Mo), platinum (Pt), nickel (Ni) and an alloy thereof.

In an exemplary embodiment, the transparent conductive layer may include a transparent conductive oxide. For example, the transparent conductive layer may include at least one transparent conductive oxide of indium tin oxide (ITO), indium zinc oxide (IZO), aluminum zinc oxide (AZO), gallium doped zinc oxide (GZO), zinc tin oxide (ZTO), gallium tin oxide (GTO) and fluorine doped tin oxide (FTO).

In an exemplary embodiment, the pixel define layer PDL may include an organic insulating material. For example, the pixel define layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emission layer EML may be disposed on the exposed surface of the first electrode AD. In an exemplary embodiment, the emission layer EML may have a multi-layer thin film structure including at least a light generation layer (LGL). For instance, the emission layer EML may include: a hole injection layer (HIL) into which holes are injected; a hole transport layer (HTL) which has excellent hole transportation performance or promotes hole transportation and restrains movement of electrons that have not been coupled with holes in the light generation layer and thus increases chances of recombination between holes and electrons; the light generation layer which emits light by recombination between injected electrons and holes; a hole blocking layer (HBL) which restrains movement of holes that have not been coupled with electrons in the light generation layer; an electron transport layer (ETL) which is provided to smoothly transport electrons to the light generation layer; and/or an electron injection layer (EIL) into which electrons are injected.

In an exemplary embodiment, the color of light generated from the light generation layer may be one of red, green, blue, and white, but in the present embodiment, this is not limited. For example, the color of light generated from the light generation layer of the emission layer EML may be one of magenta, cyan, and yellow.

In an exemplary embodiment, the hole injection layer, the hole transport layer, the hole blocking layer, the electron transport layer, and the electron injection layer may be common layers coupled between adjacent emission areas.

In an exemplary embodiment, the second electrode CD may be a semi-transmissive reflective layer. For example, the second electrode CD may be a thin metal layer having a thickness allowing light emitted from the emission layer EML to transmit therethrough. For example, the second electrode CD may allow some of the light generated from the emission layer EML to pass therethrough and may reflect the rest of the light generated from the emission layer EML.

In an exemplary embodiment, the second electrode CD may include material having a work function lower than that of the transparent conductive layer. For instance, the second electrode CD may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), and an alloy thereof.

Some of the light emitted from the emission layer EML may not transmit through the second electrode CD, and light reflected by the second electrode CD is reflected by the reflective layer again. That is, light emitted form the emission layer EML may resonate between the reflective layer and the second electrode CD. The light extraction efficiency of the organic light-emitting diodes OLED may be enhanced by the resonance of light.

In an exemplary embodiment, the thin film encapsulating layer TFE may prevent oxygen or water from permeating the light emitting element LD. To this end, the thin film encapsulation layer TFE may include an inorganic layer. The inorganic layer may include at least one of silicon oxide, silicon nitride, silicon oxynitride, aluminum oxide, titanium oxide, zirconium oxide, and tin oxide. The thin film encapsulation layer TFE may cover at least the display areas PXA and extend to the outside of the display areas PXA.

In an exemplary embodiment, the circuit elements and the lines that are disposed over the first surface of the first substrate SUB1 from the buffer layer BFL to the fourth insulating layer INS4 may form the circuit element layer BPL of the display device 100 and/or the fingerprint sensor. Furthermore, disposed in the respective pixel areas PXA from the first electrode AD to the second electrode CD, the light emitting elements LD and the pixel define layer PDL provided between the light emitting elements LD may form the light emitting element layer LDL of the display device 100 and/or the fingerprint sensor. The thin film encapsulation layer TFE or the like may be formed to cover at least the light emitting element layer LDL, and form the first passivation layer PTL1.

Figure 17:
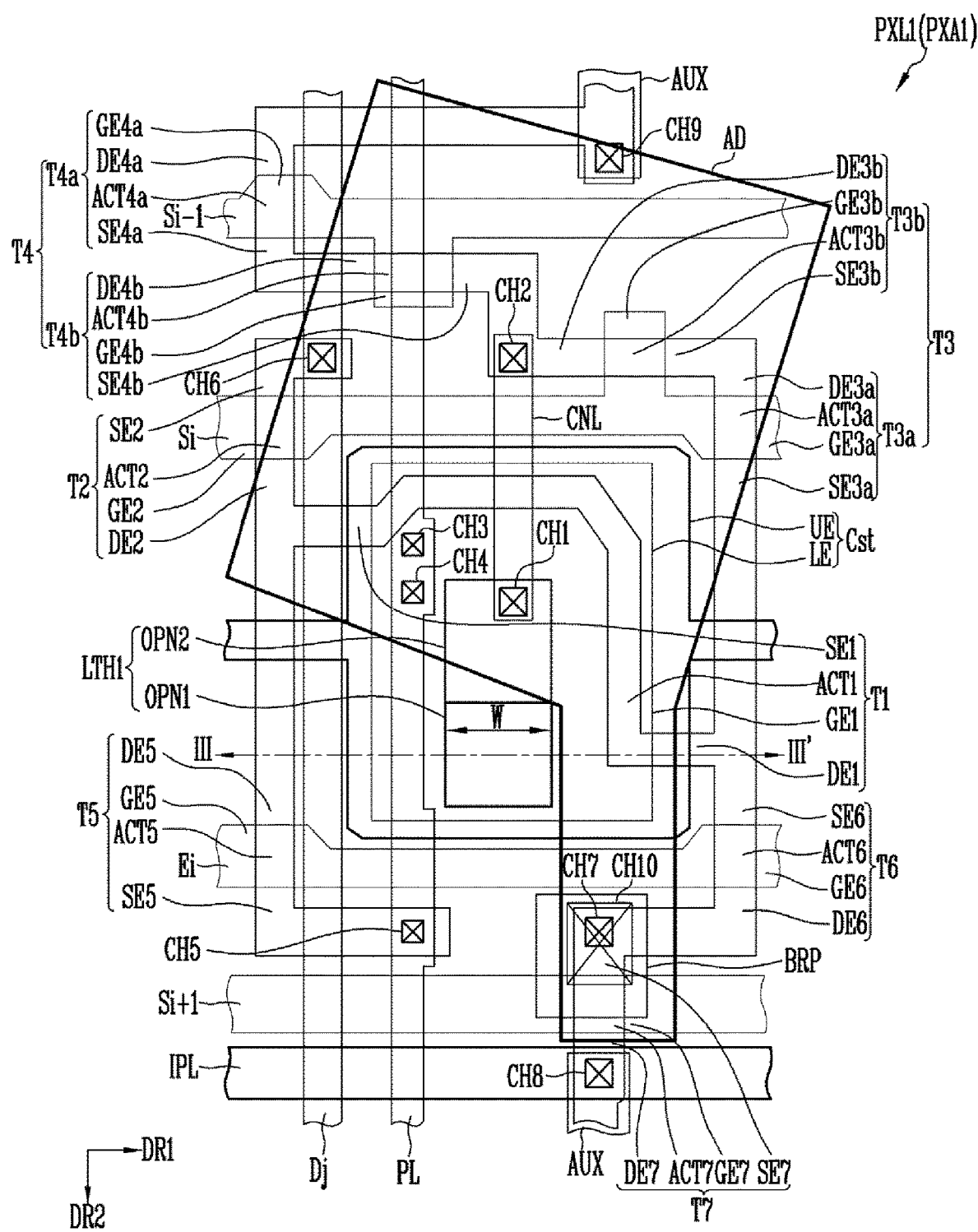
FIG. 17 is a plan view illustrating an example of a layout of a first pixel in accordance with an exemplary embodiment of the present disclosure.
Figure 18:
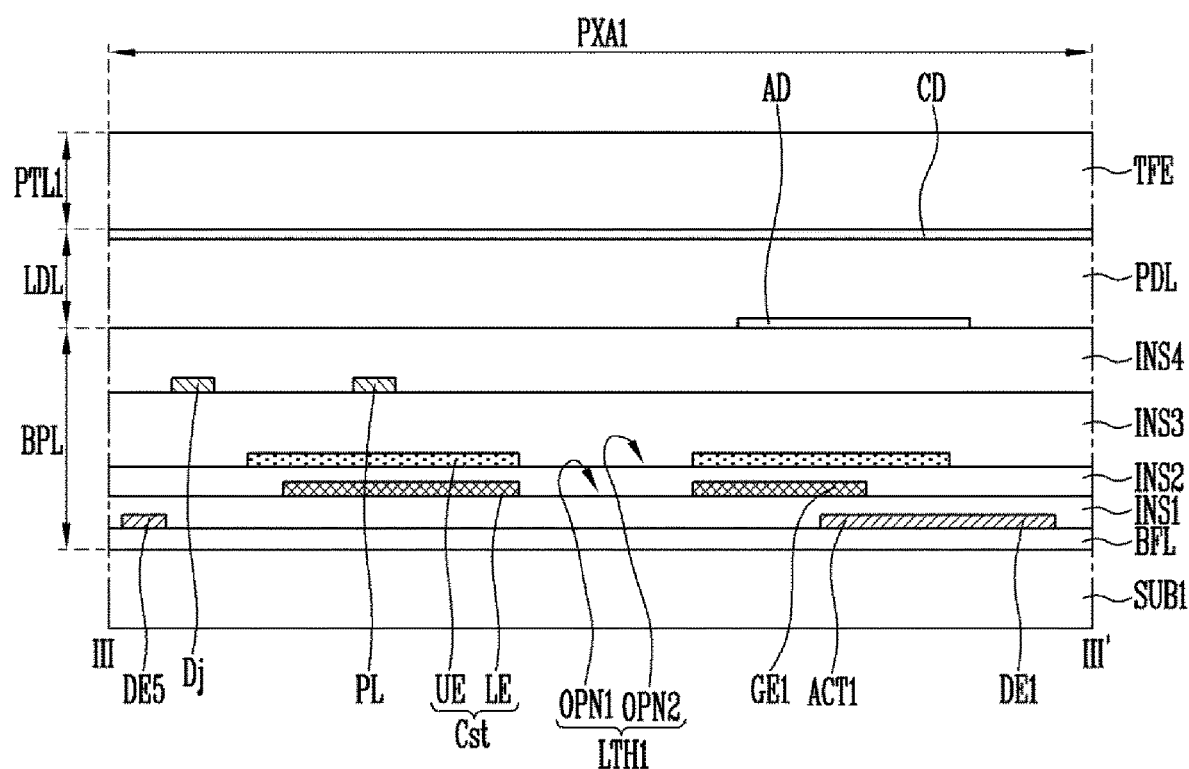
FIG. 18 is a sectional view taken along a sectional line III-III' of FIG. 17.

FIG. 17 is a plan view illustrating an example of a layout of a first pixel PXL1 in accordance with an exemplary embodiment of the present disclosure. FIG. 18 is a sectional view taken along a sectional line III-III' of FIG. 17. In an exemplary embodiment, the first pixel PXL1 illustrated in FIGS. 17 and 18 may refer to any pixel including at least one first light transmitting hole LTH1 among the pixels PXL of the sensing area SA illustrated in FIGS. 1 to 3E and 5A, 5B, 5C, and 5D. In other words, in an exemplary embodiment of the present disclosure, at least some of the pixels PXL of the sensing area SA may include the first light transmitting hole LTH1 formed in the corresponding pixel area (hereinafter, referred to as "first pixel area PXA1") to form an optical system of the fingerprint sensor, in the same manner as that of the first pixel PXL1 illustrated in FIGS. 17 and 18.

Referring to FIGS. 17 and 18, the first pixel PXL1 in accordance with an exemplary embodiment of the present disclosure may include the first light transmitting hole LTH1 formed in at least one conductive layer of the circuit element layer BPL. In an exemplary embodiment, the sensing area SA may include a plurality of first pixels PXL1 each including at least one first light transmitting hole LTH1. In this case, the sensing area SA may include a plurality of first light transmitting holes LTH1 which are distributed in at least one conductive layer of the circuit element layer BPL and each of which forms a pinhole PIH or a light control hole LCH. Furthermore, the first light transmitting holes LTH1 may include a plurality of openings distributed in at least one conductive layer of the circuit element layer BPL.

For example, each first light transmitting hole LTH1 may include at least one opening formed in a conductive layer, e.g., a semiconductor layer, a first conductive layer (e.g., a first gate layer), a second conductive layer (e.g., a second gate layer), and/or a third conductive layer (e.g., a source-drain layer), of the circuit element layer BPL. For instance, each first light transmitting hole LTH1 may include at least one opening which is formed in at least one of conductive patterns (electrodes and/or lines of circuit elements) forming at least one of the semiconductor layer, the first conductive layer, the second conductive layer, and the third conducive layer of the circuit element layer BPL.

In an exemplary embodiment of the present disclosure, each first light transmitting hole LTH1 may include a first opening OPN1 formed in the first conductive layer disposed in the first substrate SUB1, and a second opening OPN2 which overlaps with the first opening OPN1 and is formed in the second conductive layer disposed over the first conductive layer with at least one insulating layer (e.g., the second insulating layer INS2) between the first and second conductive layers. For example, each first light transmitting hole LTH1 may be formed in a region of any one first pixel PXL1 in which the storage capacitor Cst is formed.

For example, each first light transmitting hole LTH1 may include a first opening OPN1 which is formed in the first conductive layer and enclosed by the first capacitor electrode LE of the storage capacitor Cst of the first pixel PXL1, and a second opening OPN2 which is formed in the second conductive layer and enclosed by the second capacitor electrode UE of the storage capacitor Cst. In other words, in an exemplary embodiment, the first opening OPN1 may be formed as an opening formed in the first capacitor electrode LE. The second opening OPN2 may be formed as an opening which is formed in the second capacitor electrode UE and overlaps with the first opening OPN1.

In an exemplary embodiment, the first and/or second capacitor electrodes LE and UE may be formed of light blocking metal. In an exemplary embodiment, at least one of the first and second conductive layers may include a light blocking metal pattern, and have a first and/or second opening OPN1 and/or OPN2 formed as an opening formed in the light blocking metal pattern.

In an exemplary embodiment, when each first light transmitting hole LTH1 is formed by a pair of first and second openings OPN1 and OPN2 overlapping with each other, the pair of first and second openings OPN1 and OPN2 may have the same width (W) along at least one direction. For example, the pair of first and second openings OPN1 and OPN2 may have the same width (W) along a first direction DR1. In this case, the pair of first and second openings OPN1 and OPN2 may form a pinhole PIH having a multi-layer structure, as illustrated in the exemplary embodiment of FIG. 8B. For example, in an exemplary embodiment, the pair of first and second openings OPN1 and OPN2 may form a light control hole LCH having a multi-layer structure.

In an exemplary embodiment of the present disclosure, at least one first light transmitting hole LTH1 may be positioned in any one first pixel PXL1 and formed not to overlap with at least one opaque electrode among electrodes forming the light emitting element LD of the first pixel PXL1, e.g., the first electrode AD of the light emitting element LD. For example, although each first light transmitting hole LTH1 is positioned in the first pixel area PXA1 in which any one first pixel PXL1 is formed, the first light transmitting hole LTH1 may be formed in a non-emission area of the first pixel PXL1 to prevent the first light transmitting hole LTH1 from overlapping with the first electrode AD of the light emitting element LD of the first pixel PXL1.

In accordance with the foregoing embodiment, the first light transmitting hole array layer LTHL1 may be integrally formed with the circuit element layer BPL without forming an additional layer in the circuit element layer BPL. Hence, the thickness of the module including the display device 100 may be reduced. The width of the opening area OPA required to be secured between the circuit element layer BPL and the light emitting element layer LDL (e.g., on an interface of the circuit element layer BPL and the light emitting element layer LDL in which the first electrode AD of the light emitting element LD is disposed) may be reduced.

Figure 19:
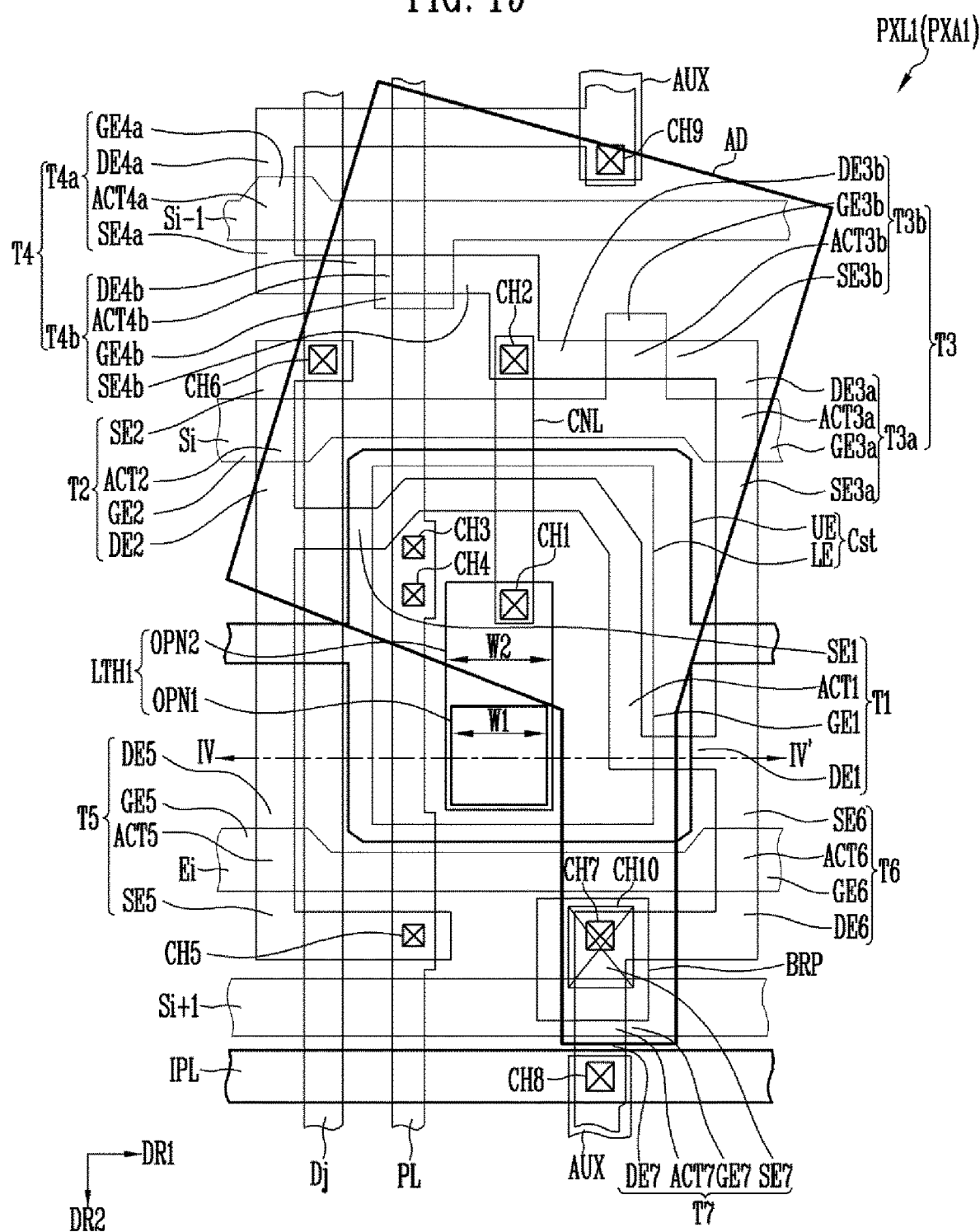
FIG. 19 is a plan view illustrating an example of a layout of a first pixel in accordance with an exemplary embodiment of the present disclosure.
Figure 20:
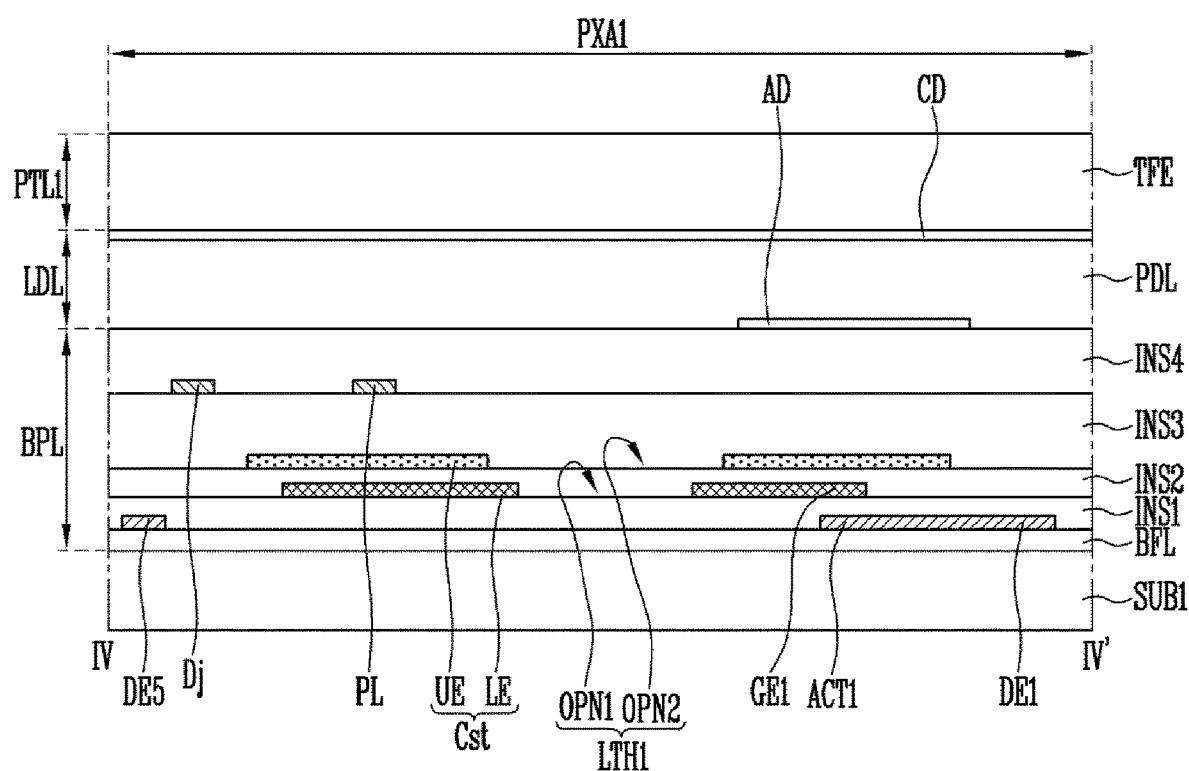
FIG. 20 is a sectional view taken along a sectional line IV-IV' of FIG. 19.

FIG. 19 is a plan view illustrating an example of a layout of a first pixel PXL1 in accordance with an exemplary embodiment of the present disclosure. FIG. 20 is a sectional view taken along a sectional line IV-IV' of FIG. 19. In the description of the exemplary embodiment of FIGS. 19 and 20, like reference numerals will be used to designate components similar or equal to those of the exemplary embodiment of FIGS. 17 and 18, and detailed explanation thereof will be omitted.

Referring to FIGS. 19 and 20, a pair of first and second openings OPN1 and OPN2 forming each first light transmitting hole LTH1 may have different widths along at least one direction. For example, each first opening OPN1 may have a first width W1 along a first direction DR1, and each second opening OPN2 may have a second width W2 greater than the first width W1 along the first direction DR1. In this case, each first light transmitting hole LTH1 may include the first opening OPN1 forming a pinhole PIH, and the second opening OPN2 forming a light control hole LCH. Each pair of first and second openings OPN1 and OPN2 may form a pinhole unit PIHU in the same manner as that of the exemplary embodiment illustrated in FIG. 8C.

Although in the present embodiment each first opening OPN1 forms a pinhole PIH and each second opening OPN2 forms a light control hole LCH, the present disclosure is not limited thereto. For example, in an exemplary embodiment of the present disclosure, each first opening OPN1 may have a width greater than that of the corresponding second opening OPN2 overlapping with the first opening OPN1 and form a light control hole LCH, and each second opening OPN2 may form a pinhole PIH.

Figure 21:
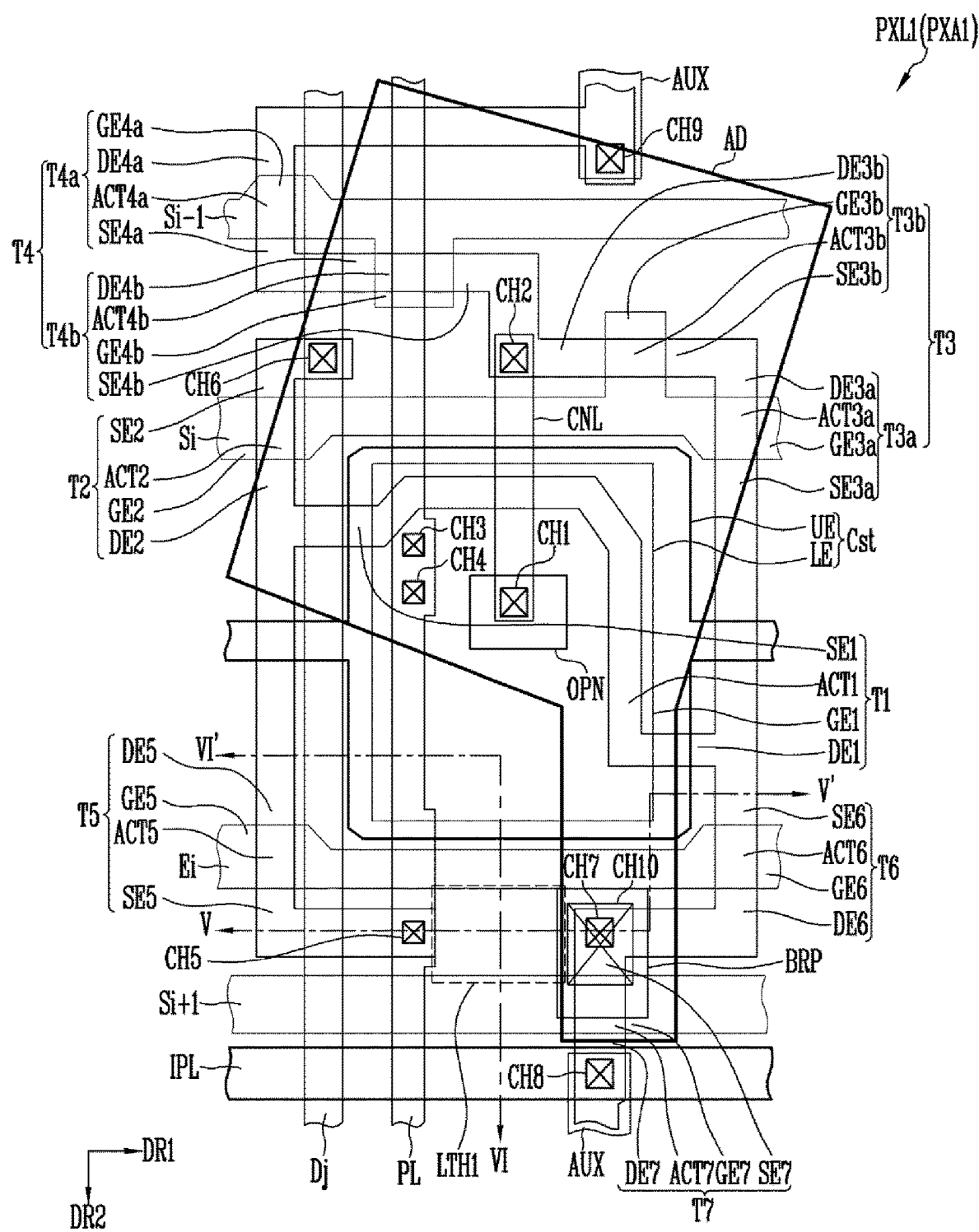
FIG. 21 is a plan view illustrating an example of a layout of a first pixel in accordance with an exemplary embodiment of the present disclosure.
Figure 22A:
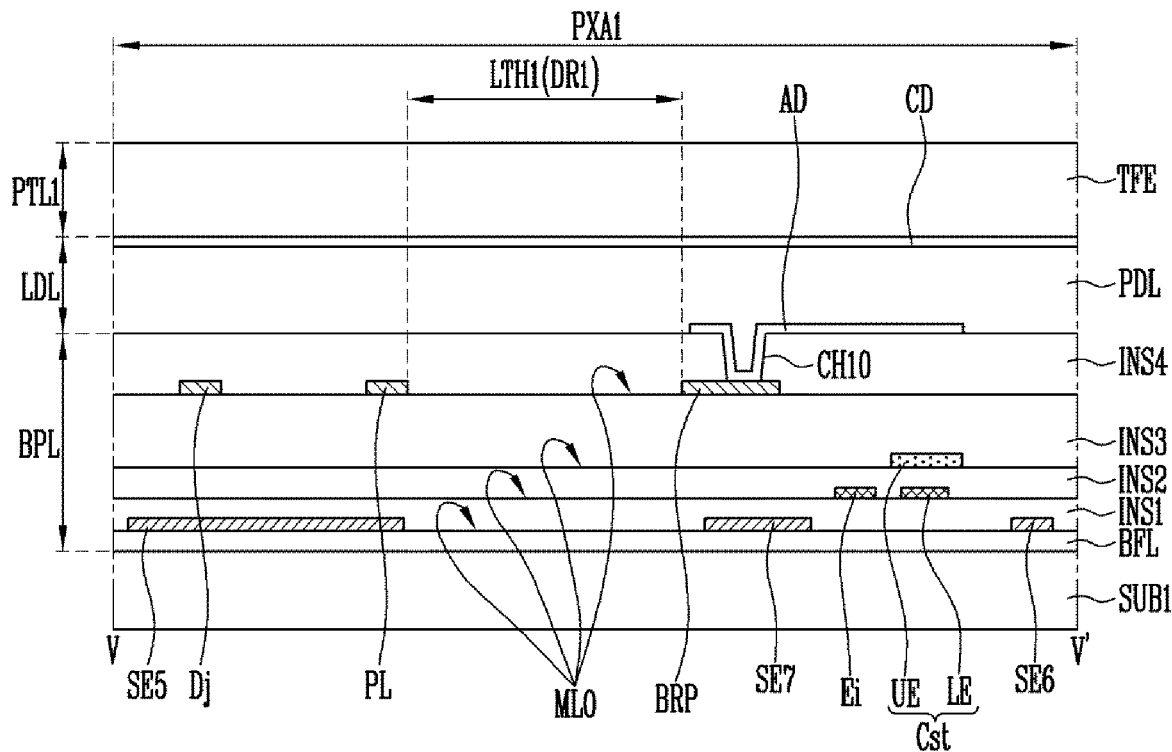
FIGS. 22A and 22B are sectional views respectively taken along sectional lines V-V' and VI-VI' of FIG. 21.
Figure 22B:
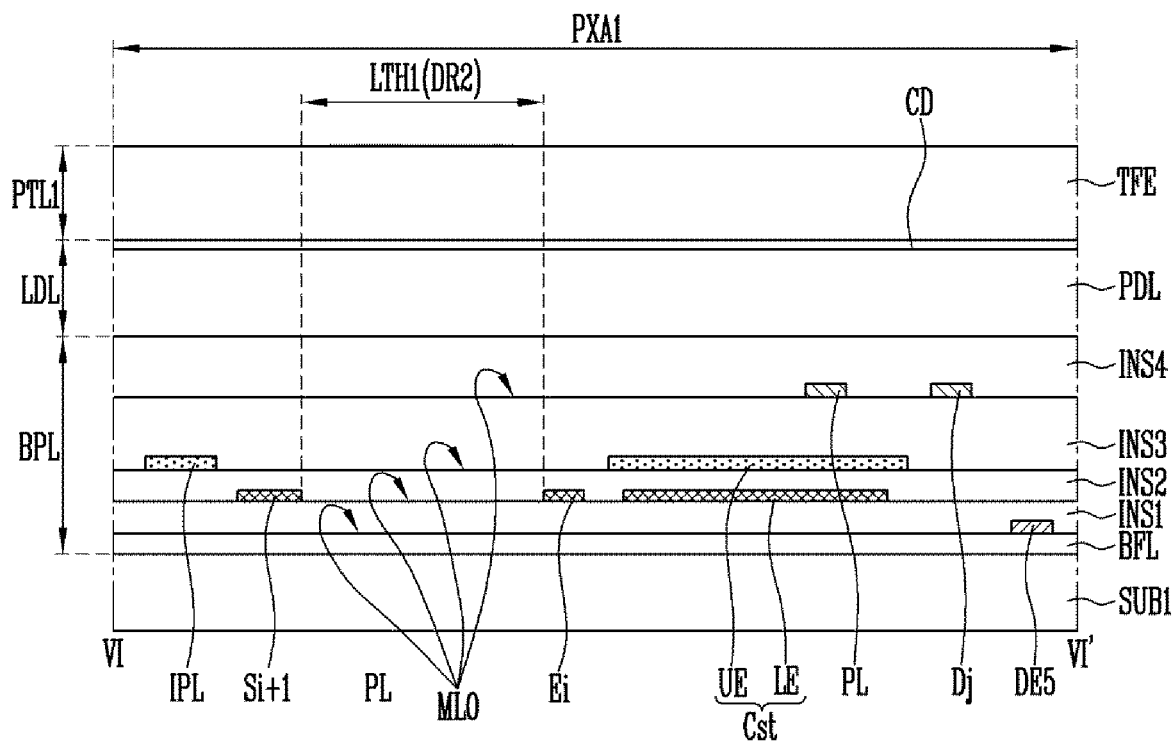

FIG. 21 is a plan view illustrating an example of a layout of a first pixel PXL1 in accordance with an exemplary embodiment of the present disclosure. FIGS. 22A and 22B are sectional views respectively taken along sectional lines I-I' and II-II' of FIG. 21 in accordance with an exemplary embodiment of the present disclosure. In the description of the exemplary embodiment of FIGS. 21, 22A, and 22B, like reference numerals will be used to designate components similar or equal to those of the previous embodiments, and detailed explanation thereof will be omitted.

Referring to FIGS. 21, 22A, and 22B, each first light transmitting hole LTH1 may include multilayer openings MLO which overlap with each other and are formed to in a plurality of conductive layers forming the circuit element layer BPL. For example, each first light transmitting hole LTH1 may include multilayer openings MLO which overlap with each other and are formed in at least two layers among a semiconductor layer of the circuit element layer BPL in which the first to seventh active patterns ACT1 to ACT7 are disposed, a first conductive layer of the circuit element layer BPL in which the first to seventh gate electrodes GE1 to GE7 are disposed, a second conductive layer of the circuit element layer BPL in which a second capacitor electrode UE, etc. are disposed, and a third conductive layer of the circuit element layer BPL in which a power line PL, etc. are disposed. In the present disclosure, locations and/or structures of the first light transmitting holes LTH1 distributed in the circuit element layer BPL are not limited and may be changed in various ways.

Figure 23:
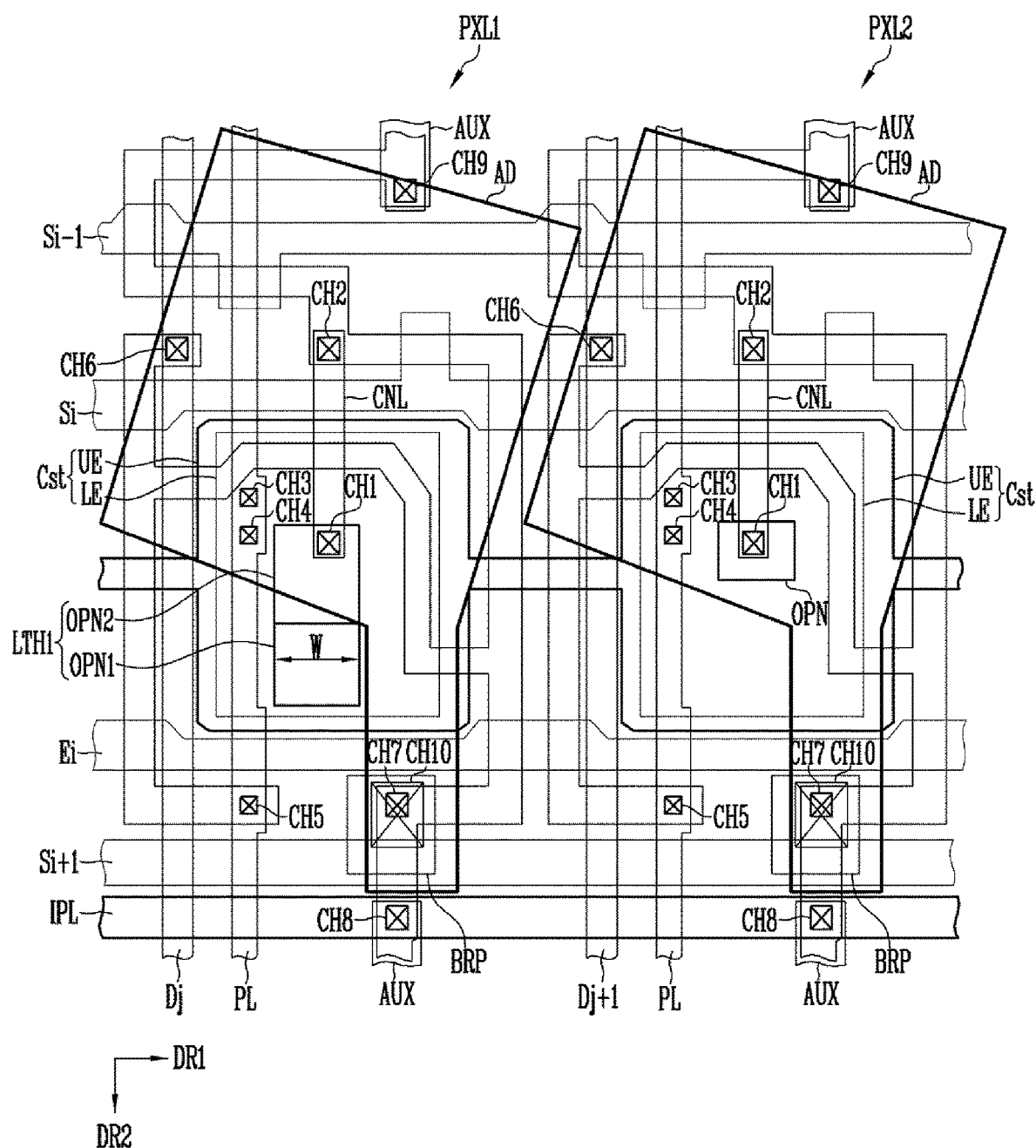
FIG. 23 is a plan view illustrating an example of a layout of a first pixel and a second pixel in accordance with an exemplary embodiment of the present disclosure.

FIG. 23 is a plan view illustrating an example of a layout of a first pixel PXL1 and a second pixel PXL2 in accordance with an exemplary embodiment of the present disclosure. In an exemplary embodiment, the first pixel PXL1 and the second pixel PXL2 illustrated in FIG. 23 may be pixels disposed adjacent to each other among the pixels PXL of the sensing area SA illustrated in FIGS. 1 to 3E and 5A, 5B, 5C, and 5D.

Referring to FIG. 23, the first light transmitting holes LTH1 described in the exemplary embodiments of FIGS. 17, 18, 19, 20, 21, 22A, and 22B may be formed in only some of the pixels PXL of the sensing area SA. For example, the pixels PXL of the sensing area SA may include first pixels PXL1 each including at least one first light transmitting hole LTH1, and second pixels PXL2 which are disposed in the vicinities of the first pixels PXL1 and each of which is configured such that a region thereof corresponding to a region of each of the first pixels PXL1 in which the first light transmitting hole LTH1 is formed has a structure different from that of the first pixel PXL1.

However, the present disclosure is not limited thereto. For example, in an exemplary embodiment of the present disclosure, all of the pixels PXL disposed in the sensing area SA may be configured as first pixels PXL1 each including at least one first light transmitting hole LTH1. At least one pixel PXL disposed in the remaining display area DA other than the sensing area SA may be formed of a second pixel PXL2 which is configured such that a region thereof corresponding to a region of each of the first pixels PXL1 in which the first light transmitting hole LTH1 is formed has a structure different from that of the first pixel PXL1.

In a photo-sensing type fingerprint sensor according to an exemplary embodiment of the present disclosure, a first transmitting hole array layer of an optical system may be integrally formed with a circuit element layer of a fingerprint sensor and a display device. Hence, the thickness of a module including the photo-sensing type fingerprint sensor and the display device including the same may be reduced or minimized. Furthermore, in an exemplary embodiment, in the case where the first light transmitting hole array layer forms a pinhole array layer, a width of an opening area which is required to be secured between the circuit element layer and the light emitting element layer may be reduced. Therefore, even if pixels are disposed in a display panel at a high resolution, the display panel may be easily configured as an optical-system-integrated display panel.

Furthermore, in an exemplary embodiment of the present disclosure, moiré effect which may occur in the photo-sensing type fingerprint sensor may be prevented or reduced by adjusting the resolutions of a light transmitting hole array layer and a photo sensor array layer that overlaps with the light transmitting hole array layer. Consequently, fingerprint information may be prevented from being distorted by the moiré effect, and the reliability of the fingerprint sensor may be enhanced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a first substrate comprising a plurality of pixel areas;
   a circuit element layer disposed on a first surface of the first substrate, the circuit element layer comprising at least one conductive layer;
   a light emitting element layer disposed on the circuit element layer;
   a plurality of pixels each comprising:
      a circuit element including at least one capacitor having at least one opening; and
      a light emitting element disposed on the circuit element layer and the light emitting element layer in a corresponding one of the pixel areas;
   a first light transmitting hole array layer comprising a plurality of first light transmitting holes distributed in the circuit element layer; and
   a photo sensor array layer disposed on a second surface of the first substrate overlapping with the first light transmitting hole array layer, the photo sensor array layer comprising a plurality of photo sensors,
   wherein each of the plurality of first light transmitting holes comprises a first opening and a second opening distributed in the at least one conductive layer,
   wherein the at least one capacitor comprises:
   a first capacitor electrode having the first opening; and
   a second capacitor electrode overlapping with the first capacitor electrode and having the second opening,
   wherein the first opening and the second opening have an identical width along one direction, and a length of the second opening extending in a direction intersecting the one direction is longer than a length of the first opening.

2. The display device according to claim 1, wherein the plurality of first light transmitting holes are disposed in at least one of the plurality of pixels.

3. The display device according to claim 2, wherein the pixels comprises:
   first pixels each comprising at least one first light transmitting hole; and
   second pixels disposed in vicinities of the first pixels, each of the second pixels comprising a region having a structure different from a corresponding region of each of the first pixels in which the first light transmitting hole is formed.

4. The display device according to claim 1, wherein
the first opening is formed in a first conductive layer disposed on the first substrate;
the second opening is formed in a second conductive layer disposed on the first conductive layer, the second opening overlapping with the first opening; and
wherein each of the plurality of first light transmitting holes further comprises at least one insulating layer interposed between the first conductive layer and the second conductive layer.

5. The display device according to claim 4, wherein at least one of the first conductive layer and the second conductive layer comprises a light blocking metal pattern.

6. The display device according to claim 4,
wherein
the first capacitor electrode is disposed in the first conductive layer; and
the second capacitor electrode is disposed in the second conductive layer.

7. The display device according to claim 4, wherein the second opening has a width greater than a width of the first opening along one direction.

8. The display device according to claim 1,
wherein each of the pixels comprises at least one transistor, and
wherein the at least one transistor comprises:
an active pattern disposed in a semiconductor layer on the first substrate;
a gate electrode disposed in a first conductive layer disposed on the semiconductor layer with at least one insulating layer interposed between the first conductive layer and the semiconductor layer, the gate electrode overlapping with the active pattern; and
a source electrode and a drain electrode coupled to respective opposite ends of the active pattern.

9. The display device according to claim 8, further comprising at least one of:
a second conductive layer disposed on the first conductive layer with at least one insulating layer interposed therebetween, and the second conductive layer comprising at least one capacitor electrode; and
a third conductive layer disposed on the second conductive layer with at least one insulating layer interposed therebetween, the third conductive layer comprising at least one line.

10. The display device according to claim 9, wherein each of the first light transmitting holes comprises multilayer openings formed in at least two layers of the semiconductor layer, the first conductive layer, the second conductive layer, and the third conductive layer, the multilayer openings overlapping with each other.

11. The display device according to claim 1, wherein the light emitting element comprises:
a first electrode and a second electrode disposed in each of the pixel areas of the light emitting element layer, the first electrode and the second electrode overlapping with each other; and
an emission layer disposed between the first electrode and the second electrode.

12. The display device according to claim 11, wherein at least one of the first light transmitting holes is formed in one of the pixels and disposed in a non-emission area of the one pixel, the at least one first light transmitting hole not overlapping with the first electrode of the light emitting element of the any one pixel.

13. The display device according to claim 1, further comprising a second light transmitting hole array layer disposed between the first substrate and the circuit element layer, overlapping with the first light transmitting hole array layer, the second light transmitting hole array layer comprising a plurality of second light transmitting holes overlapping with the first light transmitting holes.

14. The display device according to claim 13, wherein the first light transmitting holes and the second light transmitting holes have different widths.

15. The display device according to claim 1, further comprising:
a second substrate disposed between the first substrate and the photo sensor array layer; and
a third light transmitting hole array layer disposed between the first substrate and the second substrate and configured to overlap with the first light transmitting hole array layer, the third light transmitting hole array layer comprising a plurality of third light transmitting holes overlapping with the first light transmitting holes.

16. The display device according to claim 1, comprising a sensing area comprising at least a portion of a display area in which the pixels are disposed, wherein the first light transmitting hole array layer and the photo sensor array layer are disposed in the sensing area.

17. The display device according to claim 16, wherein the first light transmitting holes are distributed in the sensing area with a lower resolution than the pixels.

18. The display device according to claim 16, wherein the photo sensors are distributed in the sensing area with a higher resolution than the first light transmitting holes.

19. A fingerprint sensor comprising:
a first substrate;
a circuit element layer disposed on a first surface of the first substrate, and comprising at least one conductive layer and at least one capacitor having at least one opening;
a light emitting element layer disposed on the circuit element layer and comprising a plurality of light emitting elements;
a first light transmitting hole array layer comprising a plurality of first light transmitting holes distributed in the circuit element layer; and
a photo sensor array layer disposed on a second surface of the first substrate overlapping with the first light transmitting hole array layer, the photo sensor array layer comprising a plurality of photo sensors,
wherein each of the first light transmitting holes comprises a first opening and a second opening distributed in the at least one conductive layer,
wherein the at least one capacitor comprises:
a first capacitor electrode having the first opening; and
a second capacitor electrode overlapping with the first capacitor electrode and having the second opening,
wherein the first opening and the second opening have an identical width along one direction, and a length of the second opening extending in a direction intersecting the one direction is longer than a length of the first opening.

20. The fingerprint sensor according to claim 19, wherein the circuit element layer comprises:
a first conductive layer disposed on the first substrate;
a second conductive layer disposed on the first conductive layer; and
at least one insulating layer interposed between the first conductive layer and the second conductive layer.

21. The fingerprint sensor according to claim 20, wherein
the first opening is formed in the first conductive layer enclosing the first opening of any one of the first light transmitting holes; and
the second opening is formed in the second conductive layer overlapping with the first opening.

22. The fingerprint sensor according to claim 21, wherein at least one of the first conductive layer and the second conductive layer comprise a light blocking metal pattern.

23. The fingerprint sensor according to claim 21, wherein
the first capacitor electrode is disposed in the first conductive layer; and
the second capacitor electrode is disposed in the second conductive layer.

24. The fingerprint sensor according to claim 19, wherein the circuit element layer comprises at least one transistor comprising an active pattern, a gate electrode, a source electrode, and a drain electrode, and
wherein each of the first light transmitting holes comprises at least one opening formed in at least one of a semiconductor layer in which the active pattern is disposed, a first conductive layer in which the gate electrode is disposed, and a second conductive layer disposed on the first conductive layer with at least one insulating layer interposed therebetween.

25. The fingerprint sensor according to claim 19, wherein each of the light emitting elements comprises:
a first electrode and a second electrode disposed in each of emission areas of the light emitting element layer, the first electrode and the second electrode overlapping with each other; and
an emission layer disposed between the first electrode and the second electrode.

26. The fingerprint sensor according to claim 25, wherein the first light transmitting holes are distributed in non-emission areas of the light emitting element layer, the first light transmitting holes not overlapping with the first electrodes of the light emitting elements.

27. The fingerprint sensor according to claim 19, further comprising a second light transmitting hole array layer disposed between the first substrate and the circuit element layer, overlapping with the first light transmitting hole array layer, the second light transmitting hole array layer comprising a plurality of second light transmitting holes overlapping with the first light transmitting holes.

28. The fingerprint sensor according to claim 19, further comprising
a second substrate disposed between the first substrate and the photo sensor array layer; and
a third light transmitting hole array layer disposed between the first substrate and the second substrate and configured to overlap with the first light transmitting hole array layer, the third light transmitting hole array layer comprising a plurality of third light transmitting holes overlapping with the first light transmitting holes.

29. The fingerprint sensor according to claim 19, wherein the photo sensors are disposed on the second surface of the first substrate with a higher resolution than the first light transmitting holes.

* * * * *